(12) United States Patent
Vaisman

(10) Patent No.: US 11,744,057 B1
(45) Date of Patent: Aug. 29, 2023

(54) METHOD AND APPARATUS FOR A SHIELDING STRUCTURE OF SURFACE-MOUNT DEVICES

(71) Applicant: Scientific Components Corporation, Brooklyn, NY (US)

(72) Inventor: Aaron Vaisman, New York, NY (US)

(73) Assignee: Scientific Components Corporation, Brooklyn, NY (US)

( * ) Notice: Subject to any disclaimer, the term of this patent is extended or adjusted under 35 U.S.C. 154(b) by 114 days.

(21) Appl. No.: 17/398,901

(22) Filed: Aug. 10, 2021

Related U.S. Application Data

(63) Continuation-in-part of application No. 17/072,871, filed on Oct. 16, 2020, now Pat. No. 11,324,111.

(60) Provisional application No. 62/916,941, filed on Oct. 18, 2019.

(51) Int. Cl.
*H05K 1/18* (2006.01)
*H05K 9/00* (2006.01)

(52) U.S. Cl.
CPC ......... *H05K 9/0026* (2013.01); *H05K 9/0018* (2013.01)

(58) Field of Classification Search
CPC .... H05K 1/0233; H05K 1/0306; H05K 1/181; H05K 1/0215; H05K 1/0218; H05K 1/0231; H05K 3/101; H05K 9/0024; H05K 9/0052; H05K 9/0079; H05K 9/0081; H05K 2201/0707; H05K 2201/0715; H05K 2201/0723; H05K 2201/10371
USPC ......................................... 361/748
See application file for complete search history.

(56) References Cited

U.S. PATENT DOCUMENTS

| | | | | |
|---|---|---|---|---|
| 4,599,680 A * | 7/1986 | Gibson | ............. | H05K 7/20445 361/752 |
| 5,847,938 A * | 12/1998 | Gammon | ............... | H05K 9/003 361/752 |
| 9,513,675 B2 * | 12/2016 | Nicol | ................ | H05K 7/20127 |
| 2019/0239340 A1 * | 8/2019 | Trulli | .................. | H01R 9/0515 |

* cited by examiner

*Primary Examiner* — Binh B Tran
(74) *Attorney, Agent, or Firm* — Lawrence G. Fridman, Esq; FEIGIN $ FRIDMAN, LLC

(57) ABSTRACT

An apparatus and method for shielding for surface-mount LTCC components and filters to increase the signal isolation from input signal port to output signal port, and to increase isolation from other electrical signals external to the component or filter. Some embodiments include an interposer two-sided and plated through printed circuit board to provide a constant impedance transition from a surface-mount device input and output ports to corresponding input and output connection points of a circuit on a printed circuit board onto which the device is mounted, including a ground plane transition.

18 Claims, 34 Drawing Sheets

METHOD AND APPARATUS FOR A SHIELDING STRUCTURE OF SURFACE-MOUNT DEVICES

CROSS-REFERENCE TO RELATED APPLICATIONS

This application is a continuation-in-part application of currently pending U.S. patent application Ser. No. 17/072,871 filed Oct. 16, 2020 which claims the benefit of U.S. Ser. No. 62/916,941, filed on Oct. 18, 2019, wherein all these applications are incorporated in their entirety by reference.

FIELD OF THE INVENTION

The present invention relates generally to surface mount electronic devices, and in particular, to low temperature co-fired ceramic (LTCC) surface-mounted devices.

BACKGROUND OF THE INVENTION

Isolation of radiofrequency, microwave, millimeter-wave signals and the like from the input port to the output port of a surface-mount LTCC device is important to useful operation of the device and should be maximized. There remains a need for a device and technique to improve this signal isolation.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
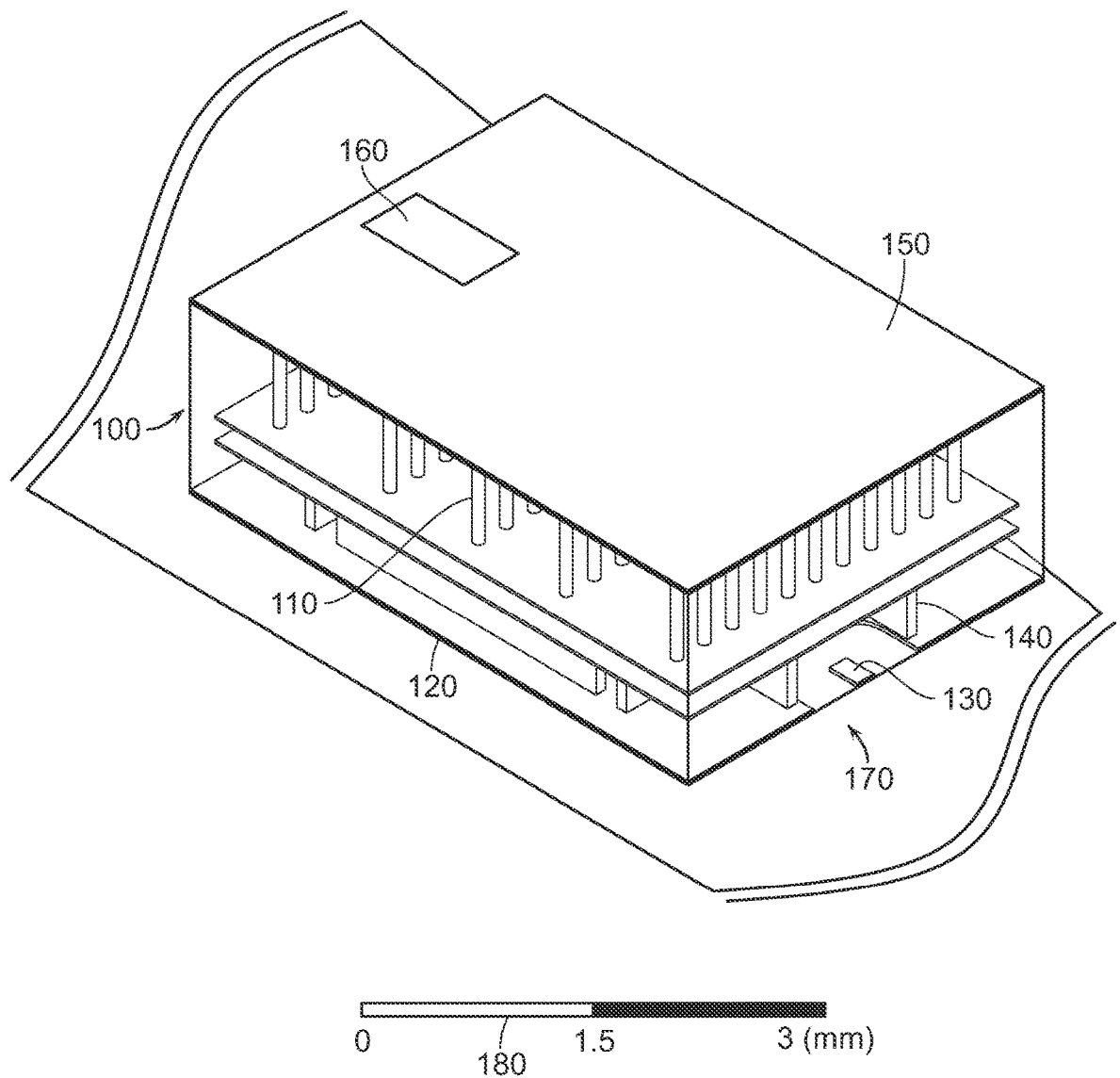
FIG. 1 depicts an exemplary diagram according to embodiments of the invention.

Embodiments of the invention are illustrated by way of example and not limitation in the figures of the accompanying drawings, in which like reference numerals indicate corresponding, analogous or similar elements. It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF EMBODIMENTS OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Embodiments of the invention may be used in a variety of applications. Some embodiments of the invention may be used in conjunction with various devices and systems, for example, low temperature co-fired ceramic (LTCC) devices, printed circuit board (PCB) manufacturing processes such as those for electronic circuits, electronic circuits, and electronic systems. Other embodiments may be used with substrates and substrate materials, lumped element electronic parts, distributed electronic parts and structures and other electronics manufacturing materials, for example epoxies, solders and other attachment materials.

Low-Temperature Co-Fired Ceramic (LTCC) may refer to materials and/or manufacturing processes by which electronic devices, including but not limited to, filters, couplers, transformers, and/or carrier boards, for example, for multi-component assemblies, may be constructed from sheets, e.g. tapes, tape layers, etc., of ceramic material that may feature, for example, embedded metallic vias and/or printed metallic conductors, which may be collated, singulated, and/or sintered, e.g. co-fired, into, for example, monolithic devices. Such devices may be devices constructed using such processes.

An embodiment of the invention may be comprised of a shielding structure surrounding a circuit, or one or more circuit elements or parts, constructed on, or part of, an LTCC substrate. The shielding structure may be external and/or may surround the circuit within and may be constructed of metal, or metal plated supporting material and may have a continuous metallic circumference. A shielding structure may have a solid envelope shape, rectangular in nature, or any other suitable geometric shape. The metal may be continuous around an entire device, in three dimensions, with the exception of metallic relief where electronic signals, e.g. baseband, radio frequency (RF), microwave or millimeter-wave signals, may transition into and/or out of an enclosed circuit. In some embodiments the metallic shield may not be continuous and may have discontinuities, apertures, etc. as may be necessary for certain electrical structures, manufacturing processes or other mechanical or process reasons. In some embodiments where there may be such physical discontinuities there may be electrical continuity at frequencies above zero hertz (Hz), for example by electrical signal coupling, capacitive coupling, electromagnetic field coupling, and the like.

A shielding structure may be manufactured or assembled coherently with an enclosed LTCC circuit and/or component. Alternately, a shielding structure may be added following manufacture of an LTCC circuit and/or component. A shielding structure may be added prior to or during a PCB assembly process.

An LTCC circuit and/or component enclosed by a shielding structure may have a grounding structure that may be compatible with a shielding enclosure. Grounding may be direct current (DC) electrical grounding or may be by electromagnetic grounding, e.g. as with a Faraday enclosure effect. A shielding structure attached to an enclosed LTCC circuit, LTCC structure and/or device may form an electromagnetic shielding enclosure or other electrical grounding. A grounded shielding structure may be self-contained or may be attached to a circuit ground on a PCB. A shielding structure that may be electrically and/or mechanically connected to a circuit ground on a PCB may electrically share the same electrical ground properties of the circuit on the PCB. An LTCC component may have features of a grounding structure that may be compatible with an external shielding.

A shielding structure may have elements and/or design features that when assembled in conjunction with or onto, a PCB, may facilitate a self-alignment onto the PCB. An LTCC circuit and/or device may have elements and/or design features that when assembled in conjunction with, or onto, a PCB, may facilitate a self-alignment onto the PCB. Such self-alignment may occur during reflow solder assembly or another assembly process.

A shielding structure may, when electrically and/or mechanically attached to an enclosed LTCC circuit and/or device, improve the suppression of unwanted, undesired, or otherwise out of band electrical signals that may be transitioning the device. In an exemplary embodiment of a filter device, e.g. an LTCC based filter, rejection of signals that may be considered to be in a stopband frequency bandwidth may be increased and/or improved. For example, the addition and/or use of a shielding enclosure improves a stopband rejection of a surface-mount filter, and such a filter may be constructed using one or more LTCC circuits and/or devices. A passband frequency bandwidth of such a device may be preserved, or experience no or minimal degradation, as compared to a device without such a shielded enclosure. Use of such a shielded enclosure may produce no other ill or degrading effects, or perceptible ill effects, on the signal desired to transition the device, e.g. an electrical signal in the passband.

An exemplary embodiment may be a three-dimensional rectangularly shaped electrically conductive shielding structure encircling an LTCC filter, such electrically conductive shielding structure operably connected to the signal ground of the filter to form part of the filter grounding circuit. Such an electrically conductive shielding structure may be formed as part of an LTCC filter, or alternately may be formed separately and be operably attached to an LTCC filter. Another exemplary embodiment may be an electrically conductive shielding structure formed separately and operably attached to an LTCC filter, where such electrically conductive shielding structure encircles on three sides, and may be attached to a PCB with a ground plane, and the PCB ground plane may form a fourth side together with the electrically conductive shielding structure to provide encapsulation. In some exemplary embodiments a fourth side in a plane parallel to the third side may be operably, electrically and/or mechanically attached to the first and second sides, and may be designed to and/or constructed to operably, electrically and/or mechanically attach to a ground plane on a PCB.

In an exemplary embodiment an electrically conductive shielding structure may be three-dimensional rectangular in form and/or structure, and have at least three electrically conductive sides, each external and around an LTCC circuit, e.g., an LTCC filter. Two such sides may be in planes parallel to each other and a third side may be between the other two sides and be in a plane perpendicular to such parallel sides. Such a third side may be in a plane parallel to a PCB onto which an electrically conductive shielding structure and an associated LTCC circuit, e.g., an LTCC filter, may be operably, electrically and/or mechanically attached. Other exemplary embodiments may include an electrically conductive shielding structure that may be on a fifth and/or a sixth side, operably, electrically and/or mechanically connected to an electrically conductive shielding structure on the first, second, third and fourth sides, such fifth and sixth sides each located in a plane parallel to each other, and such parallel planes perpendicular to the planes of both the first and second sides and parallel to the planes of the third and fourth sides.

Exemplary embodiments may have one or more apertures within each of two or more sides to allow for passage of electrical signal energy between an interior and an exterior of an electrically conductive shielding structure without making electrical contact to the electrically conductive shielding structure. An aperture may include an electrically conductive wire, transmission line, lead etc., at one end operably connected to a circuit, e.g., an LTCC circuit, within an electrically conductive shielding structure, and an opposing end to be connected to an external electrical circuit, e.g., a circuit on a PCB, such an opposing end may be, for example a pad, port, or other designation. Such an electrically conductive wire, transmission line, lead, etc., may be mechanically attached to an insulator material, such insulator material electrically isolating it from a surrounding electrically conductive shielding structure, and mechanically attaching it to such electrically conductive shielding structure. An insulator material may be a polymer, a plastic, a dielectric material, e.g., polytetrafluoroethylene (PTFE), glass, or any other suitable insulator material. An insulator material may be mechanically attached to form a hermetic seal, and an enclosed circuit, e.g. an LTCC circuit, may be, for example, hermetically sealed within an electrically conductive shielding structure.

An exemplary embodiment may have one or more sides, e.g., external face of sides, of an electrically conductive shielding structure that may be smooth and/or fully or substantially within a single plane corresponding to each single side. Another exemplary embodiment may have one or more sides, e.g., external face of sides, of an electrically conductive shielding structure that may be smooth and may have a convex shape, e.g., a bulge, outward from the electrically conductive shielding structure, for example as may be associated with an epoxy fillet or conductive epoxy fillet.

A shielding structure may be designed for manufacturability. It may have features of one or more units that may be milled into a single workpiece and may prevent a necessity of re-orienting such a workpiece within a construction device, e.g. a mill or milling machine. One or more devices may be removed or separated from a workpiece, for example by a cutting or dicing process. Individual devices that may be separated from a workpiece may undergo one or more finishing processes.

According to embodiments of the invention, a shielding structure may have one or more features. Such features may be milled into a material during the manufacture of a shielding structure and may have a common orientation. A common orientation of such milled features may permit machining, or modification by manual, automated, computer numerical controlled (CNC) machine, or by another machine type, to be performed without a need or a necessity to re-orient the position of a workpiece, for example with respect to a machine. An orientation may remain steady or constant during such machining or manufacturing process. Other manufacturing processes, e.g. dicing or deburring, may occur with the part oriented differently, according to each different process.

There may be cavities, or regions of relief or removal of material, above a component, e.g. an LTCC component and/or its signal terminals. Such cavities may have an effect of reducing parasitic capacitance or other undesired effects. Parasitic capacitance may refer to an undesired and/or unavoidable electrical capacitive effect between conductive portions of a circuit which may cause a circuit to exhibit an electrical impedance different from its desired and/or design value. Inclusion of one or more such cavities may allow a shielding structure to be used, connected or implemented, and will not cause any noticeable or relevant degradation or reduction in a desired electrical performance of a device or circuit. Cavities referred to as being positioned, for example, above a component, e.g. an LTCC component and/or its signal terminals, may, for example, refer to a position on an opposite side of a component circuit may be mounted to a PCB, where such a PCB may be referred to as, for example, being below a component.

A cavity may be milled into a workpiece during a manufacturing process of a shielding structure and may be milled in any direction, according to the manufacturing process. For example, a cavity may be milled down from a higher to a lower vertical position. In an exemplary embodiment, a workpiece that may be manufactured into a shielding structure may then be installed in an inverted configuration, for example relative to the direction of milling and/or manufacture, and such a cavity may then be positioned vertically above a component or circuit, e.g. an LTCC device. Following installation or attachment of a shielding structure to a device or circuit, e.g. an LTCC device, LTCC circuit, etc., an assembled piece, that may include both a device or a circuit and a shielding structure, may be oriented in any direction or orientation. Such orientation or direction may be according to a desired electrical performance, compatibility with another manufacturing process, e.g. attachment to a PCB by solder, solder reflow, epoxy, etc., or any other purpose that may allow a use of the assembled device.

Embodiments of the invention may include one or more design elements to increase an ease of manufacturing, assembly, etc. There may be a grounding structure that may wrap around, for example, an LTCC component. A structure with such a wrap-around ground element may facilitate attachment of a shield, or shielding structure, to a PCB or other supportive structure with a mechanical attachment process, for example a solder reflow process. A wrap around grounding structure may be continuously electrically conductive and/or operably continuously electrically conductive, for example creating a Faraday encapsulation effect, capacitively coupling electrical encapsulation, or any other electrical encapsulation operative at least across one or more operational frequency bands.

A shielding structure may include a solder cup, or other relief in the material, for example, to capture solder or other attachment materials. A solder cup may facilitate assembly and may be used for precision control of alignment and/or precise dimensional control of an assembly process. Precise control may be necessary, for example to prevent a solder fillet from becoming too thick, which may cause a shield to sit too high on top of a surface-mount component, and may cause difficulty or prevent electrical and/or mechanical attachments, e.g. legs, from contacting metallization on a PCB. Electrical contact to a PCB metal is desired to transfer electrical signals between a PCB circuit and a component, e.g. an LTCC device. Mechanical contact and/or a mechanical connection, e.g. a solder attachment, may be used for mounting such a component, e.g. an LTCC device, with continuous electrical contact to a PCB and PCB circuit. A solder cup may be used to maintain a minimum thickness of a solder fillet. In some exemplary embodiments, a flat surface, for example, in place of a solder cup may present a difficulty in maintaining a minimally thick solder fillet. Excess solder may remain within a solder cup, or may be wicked into a solder cup, e.g. by capillary action, or other movement processes, and may occur when such solder may be in a molten state. Solder that may be placed into a solder cup may be in a paste or any other suitable form. Such solder may be used for attachment of a shield to a device, e.g. an LTCC device. A solder cup may be used to control and/or predetermine an amount of solder to be used during an assembly or attachment process. A solder cup may be a predetermined size, or with a predetermined interior volume, that may correspond to a predetermined amount of solder to be used in an associated assembly or attachment process.

A solder cup may be used with solder in any form, for example solder wire, solder paste, solder bar, etc., and may be with or without flux that may be for improved solder adhesion. Solder or solder paste may, for example, compensate for a variation that may be in one or more gaps at points of contact. Solder or solder paste may provide a self-centering and/or an alignment aide function. Solder or solder paste may have low resistivity properties that may produce low resistivity connections. Solder or solder paste may be used to attach a shield to a PCB. In some embodiments different solder, solder types and/or other attachment methods may be used to attach different elements of embodiments of the invention alone or in combination.

In some exemplary embodiments, a shielding structure may be mechanically attached by an intermediary element, for example, a conductive elastomer, a mesh film, e.g., an Indium mesh film, or any other suitable electrically conductive mechanical intermediary attachment element. Such an element may provide compensation for mechanical voids or gaps, for example that may arise from surfaces that may not be fully flat or fully smooth. Such an element may aide in visual alignment, either manually or mechanically. Such an element may provide a low resistivity contact among element being attached. Such an element may provide for attachment and/or securing to a PCB. One or more such elements may be used alone or together. Other mechanical attachment devices and/or techniques may be used, for example an attachment where a partially flexible attachment tab on a shield may be inserted into a corresponding aligned hole on a PCB, e.g., a "snap-in" attachment, alignment pin, etc.

A shielding structure may be internal, for example, internal to an LTCC device, e.g. an LTCC filter device. Such an internal shielding structure may be within a surface mount technology (SMT) device, for example a surface mount LTCC filter. An internal shielding structure may increase rejection of undesired signals, e.g. RF power signals, impinging at a predetermined frequency band for rejection by a filter, e.g. a filter constructed in a surface mount device. Such an internal shielding structure may improve the stopband rejection of a filter, e.g. a surface mount filter. An internal shielding structure may be designed and constructed to not interfere with a passband performance of a filter while providing an increase in stopband rejection. An internal shielding structure may be designed and constructed to either act independently or in conjunction with an external shielding structure, for example by interfacing with an external shielding structure. A rejection of signals may be a prevention of signals from transiting, for example, from an input to an output of a device or circuit. A filter may be an electrical circuit designed to allow transiting of a predetermined frequency band of electrical signals while simultaneously preventing transiting of one or more other predetermined bands of electrical signals, for example, from an input to an output of a device or circuit. A filter may be referred to as a frequency selective electrical circuit.

An LTCC device may possess or include metallization on its top and/or sides, constituting a package with built-in electromagnetic shielding. Such a shielded package may have metallization printed, sputtered, or otherwise applied to one or more surfaces, e.g. faces, and may provide shielding to prevent RF signal leakage, for example leakage and/or transmission of electrical signal energy between an interior and an exterior of such shielded package. A shield metallization of such a package may make electrical contact with a ground plane of a carrier PCB, onto which it may be mounted, or other structure. A thickness of a shield metallization may be, for example, a minimum thickness to prevent electrical and/or RF signal leakage, and may include a minimum thickness sufficient for a skin depth of an electrical and/or RF signal. A thickness may be a minimum design thickness, a predetermined thickness or may be greater than, for example, a predetermined minimum thickness. A shield metallization of such a package may have openings surrounding signal pads, or ports. Signal pads may be surrounded by shield metallization openings that may permit transmission of electrical signals, for example, into and/or out of a device, package, etc., through, for example, a coaxial transmission line, TEM transmission line, or other structure.

An interface between an internal shielding structure and an external shielding structure may be by a direct electrical connection, an RF energy coupled connection, or any other connection method to provide an interface for continuity of shielding of RF signal energy. An LTCC device may contain an internal grounding structure, for example, a grounding cage which may act in a manner according to a Faraday cage, or according to other similar electromagnetic principles, and may provide an internal RF signal power circuit ground. Such a device may be operably and/or electrically connected to external terminal, for example for an external connection to RF signal power grounding elements of an external electronic circuit, e.g. an external circuit on a PCB.

An interface may have design elements and/or features to facilitate operation together between an external shielding structure and an internal shielding structure. Design elements may be geometric features, individual electronic circuit elements, e.g. lumped elements, for example, resistors, capacitors, inductors, etc., distributed circuit elements, e.g. transmission lines, coupling structures, etc., or any combination thereof. Design elements may be part of an internal shielding structure, and external shielding structure, or both structures. Design elements may be separate to a device, a circuit device or circuit element, e.g. an LTCC device, an LTCC filter device, etc., or may be integrated within a device or element. An internal shielding structure and an external shielding structure may be constructed to use a common circuit ground element, a common external grounding structure, and/or any other circuit grounding structure or mechanism.

An internal shielding structure may be constructed using one or more fabrication processes. A fabrication process may be an LTCC fabrication process, another fabrication process, or a combination of an LTCC fabrication process and one or more other fabrication processes. An internal shielding structure may be constructed to be used with a device that may be mounted into a quasi-transverse electromagnetic (TEM) circuit, e.g. a microstrip electronic circuit, a full TEM circuit, e.g. a stripline electronic circuit, or other electronic circuits or electronic structures. An internal shielding structure may be constructed to be used with a coplanar waveguide electronic circuit and may be in a microstrip configuration, a stripline configuration, or another coplanar waveguide or other waveguide configuration. Such a shielding structure may include features and/or elements, for example tabs, pins, protrusions, coupling elements, etc., to interface with a circuit, e.g. a microstrip circuit, a stripline circuit, etc. An LTCC device may be constructed with one or more internal shielding structures, and each may be operably and/or electrically connected to an external shielding structure, either by an independent connection or by a shared connection. An internal shielding structure may be integrated into an LTCC device or circuit, located around, either partially or fully, e.g. fully encapsulating except for active circuit transmission conductors, an LTCC device or circuit, or may be around one or more parts of an LTCC circuit device. An internal shielding structure may be constructed to be within an exterior package of an LTCC device.

A device, for example, an LTCC device, or a circuit within an LTCC device or package, may be constructed with an internal shielding structure. An internal shielding structure may be connected to an external shielding structure. An external shielding structure may be continuous around a plurality of sides, e.g. four sides, six sides, etc., of a rectangular solid structure for containing or housing an RF circuit, including RF circuit parts and/or elements. A shielding structure may be constructed, for example of a metal electrical conductor, and may be a shielding conductor. A shielding structure may be on and/or continuous with a surface to be attached to a printed circuit board (PCB). A surface for attachment to a PCB may have a shielding conductor covering all or part of such a surface. A part of such an attachment surface may have one or more conductors that may be electrically connected to circuit elements that may form an electrical circuit and/or structure, e.g. a filter circuit, that may have a conduction path electrically isolated from a shielding structure, and such conductors may be electrically isolated from a shielding structure. Electrical isolation may be by physical separation of conductors on a surface, and such a separation may be large enough to prevent electrical signal coupling from occurring across the separation. A range of separation distances may construct, for example a separation distance may be equivalent to a dimension of a conductor electrically connected to an input or an output of a filter circuit. Or a separation distance may be larger than a dimension of a conductor electrically connected to an input or an output of a filter circuit, for example two times larger or three times larger, or any other suitable separation distance. A conductor electrically connected to an input or an output of a circuit, e.g. filter circuit, may be encircled by a shielding structure or may extend to the edge of a surface. A conductor electrically isolated from a shielding structure may be formed together with a shielding structure and an electrically isolating insulator, or a predetermined separation distance, or both, to form a transmission line or transmission line structure, e.g., a TEM transmission line or a quasi-TEM transmission line.

A shielding structure may be constructed such that it employs one or more full tape thickness features. Such full tape thickness features may provide improved and/or optimal electrical grounding for ground connections of a circuit, e.g. an LTCC filter circuit, or of a shielding structure, e.g. an internal or an external shielding structure of an LTCC circuit. A full tape thickness feature may refer to a conductive trace embedded within a dielectric layer of an LTCC, and may be an alternate to such printed upon it. Such full tape thickness features may provide improved and/or higher isolation of RF signals from external interference and/or coupling. Other than full tape thickness may be used, and may have corresponding RF signal isolation performance.

A printed circuit board (PCB) may be used to accept mechanical mounting and/or electrical connection of devices, e.g. LTCC devices, according to embodiments of the invention. Such LTCC devices may be mechanically and/or electrically attached to such a PCB. Such a PCB may have sections of its ground plane in the area of attachment where metallization may have been removed, for example, a ground plane cut-out. Such a cut-out may be used to constrain a position of electrical connection leads of a device, for example an LTCC filter, during a manufacturing process. An exemplary manufacturing process may be reflow soldering. Other suitable manufacturing processes for attachment of the device to the PCB may also be used. Such electrical connection leads, e.g. legs, may be metalized connections that transition from, the interior to the exterior of a shielded device, and may electrically or operably connect to input and/or output ports of an enclosed device, e.g. an LTCC filter. Such leads may extend through an aperture in the shielded enclosure and may be electrically isolated from such a metallic shielded enclosure. An end of such leads that may facilitate attachment external to a shield may be used to attach the shielded component assembly to a PCB, for example by a surface-mount attachment process.

Such a PCB may be manufactured to have thin traces or electrical conductor connections. Such traces may be considered thin with respect to electrical conductors on the same PCB that may have larger widths in order to maintain a specific characteristic electrical impedance or a predetermined electrical impedance. Thin traces may provide additional surface tension, which may prevent solder outflow without the use of a solder mask, among other benefits. Solder outflow may occur, for example when solder may be in a molten state. Solder may be a paste, a wire, a sheet, or any other suitable structure compatible with solder attachment manufacturing. In some exemplary embodiments attachment mechanisms other than solder, or in combination with solder, may be used.

In some embodiments, an electrical impedance may be an electrical signal resistance of alternating current (AC) signals and their associated electrical signal energies transitioning an electrical conductor. An impedance may be a complex ratio of voltage to current, e.g. AC voltage and AC current. Electrical impedance across a transition among electrical conductors, electrical devices, electrical circuits and/or combinations of the like, may be constant when an electrical impedance of each conductor, device, circuit and/or combination may be substantially the same. When an electrical impedance differs, a mismatch may be created. Such a mismatch may have a characteristic of an increase in reflected electrical energy. Such a mismatch may be characterized by a reduction in electrical energy being delivered into or out of a conductor, device, circuit and/or combination.

Electrical impedance may vary with varying frequencies of AC signals and may be considered to be frequency-dependent devices. Devices for selecting specific frequencies of electrical energy, e.g. baseband signals, passband signals, radio frequency (RF) signals, microwave signals, millimeter-wave signals, etc., for transition through one or more conductors, devices, circuits and/or combinations while rejecting other specific frequencies of electrical energy may be considered to be and/or referred to as filters. Filters may be constructed using low temperature co-fired ceramic (LTCC) materials and/or processes and may be LTCC filters. LTCC filters may be individual devices or part of an electrical circuit.

A PCB may have other features, for example, a stepped leg cross-section. A stepped cross-section, as depicted by figures herein, may refer to a stepped decrease in cross-sectional area of a mounting leg of, for example, a filter that may be adjacent to its contact area upon a PCB. A stepped leg cross-section may be used to reduce an amount of solder needed to mount a shield, according to embodiments of the invention. Use of such a stepped leg cross-section may reduce a tendency of a shield to reposition, or "float," during a manufacturing process, e.g. reflow soldering. A number of steps of a stepped leg cross-section may be predetermined.

FIG. 1 depicts an exemplary embodiment of the invention. A shielded LTCC filter device 100 may be a metallic shield enclosure 150 or may be an enclosure made of another material, e.g. plastic, and may surround and/or encapsulate a device, e.g. an LTCC electrical AC filter circuit. A shield may have vertical metallic lined holes or solid metallic filled holes, e.g., via holes, components 110, and/or other vertical metallic shielding walls 140. Via holes may be electrically connected to one or more circuit elements at either or both ends of such a via hole, e.g., a transmission line. A shield may be attached to a PCB 170 with ground 120. An LTCC filter may have input and output connection leads 130 that may be connected to a transmission line and/or other electrical circuits and/or devices on PCB 170 and/or on other PCBs. A shielded LTCC filter device 100 may have a marking 160 on its outer surface, opposite a PCB 170 mounting surface, that may indicate a function of one or more lead connections, e.g. a marking 160 may be located near a particular LTCC circuit lead connection to indicate a location of pin 1, or an input pin. A marking may be used for orientation of a device when attaching it, for example, to a PCB. A size of a shielded LTCC filter device 100 may be depicted with a linear unit scale 180, e.g. millimeters, to indicate a small size of such a device. A feature and/or benefit of embodiments of the invention may be achieving such shielding effectiveness within a total package envelope of such a small size, as depicted by exemplary FIG. 1. Construction according to embodiments of the invention may achieve this performance result within such a small envelope.

Figure 2:
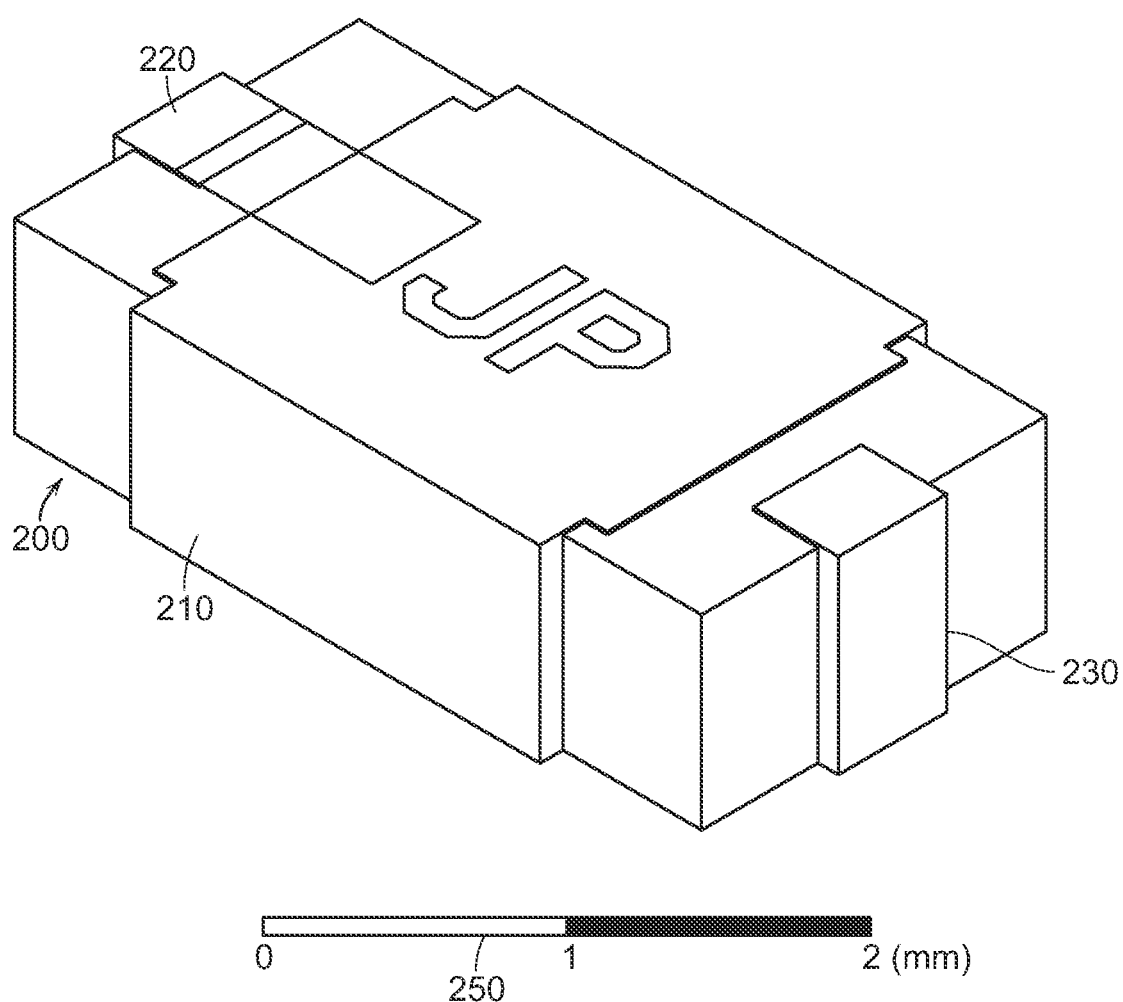
FIG. 2 depicts an exemplary diagram according to embodiments of the invention.

FIG. 2 depicts an exemplary embodiment of the invention. A shielded LTCC filter device 200 may be fully encapsulated by, for example, a ceramic package, excepting only input connection 220, output connection 230 and ground metallic connections. A metallic shield 210 may wrap around an entire circumference of such a solid rectangular package, and may be constructed for connection to an external ground, e.g. a PCB ground. Input connection 220 and/or output connection 230 may be constructed with a planar protrusion in the plane of the mounting surface, an "L" shaped protrusion with one surface co-planar with the mounting surface and a second extending surface extending vertically perpendicularly away from the mounting surface, or a "U" shaped protrusion with one surface co-planar with the mounting surface, a second extending surface extending vertically perpendicularly away from the mounting surface and a third surface extending from the vertical surface partially around the circumference of the device parallel to the mounting surface.

Figure 3:
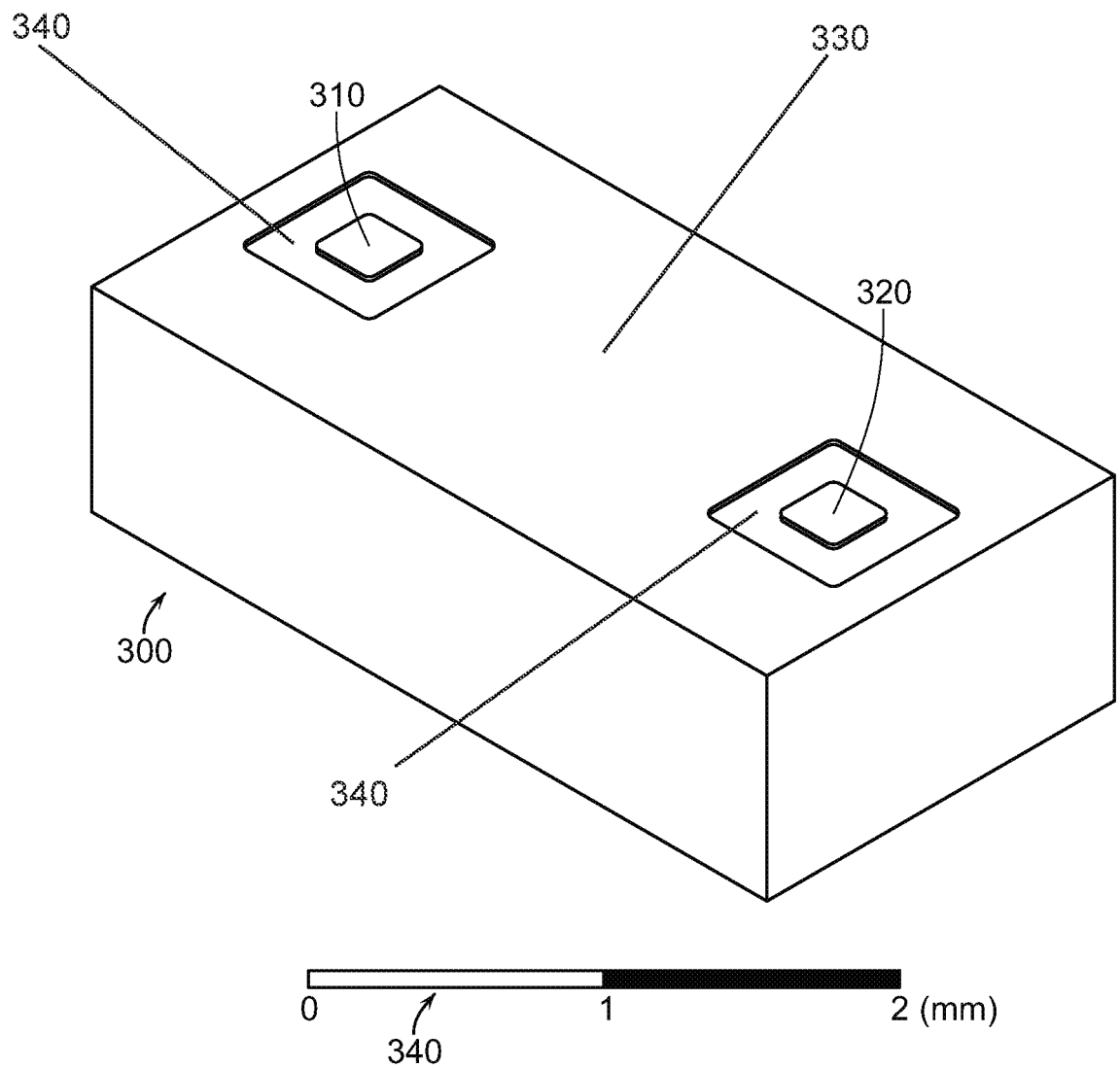
FIG. 3 depicts an exemplary diagram according to embodiments of the invention.

FIG. 3 depicts an exemplary embodiment of the invention. A shield 300 formed with a flat coplanar surface 330 may encapsulate a device, e.g., an LTCC device or filter circuit, and may fully surround such device continuously across all six sides. Two or more second apertures 340 are provided having relief of the continuous metal on the coplanar surface side extending from the interior to the exterior of a metallic outer surface. Only an electrical connection terminal for an input 310 and an electrical connection terminal for an output 320 may protrude from an interior of such a shield to an exterior of such a shield. Each of input lead 310 and output lead 320 may be separated from ground shield 300 by a planar relief area around each terminal lead 310, 320, larger than a terminal, with no metal or electrically conductive material, such that there may be no electrical connection between either of these leads and a ground shield 300. Such a relief area may reside in the same plane as terminals 310, 320. In such an exemplary embodiment, a shield 300 may encircle such a relief area, itself encircling a terminal 310, 320, all in the same plane. Terminals 310, 320 also represent additional examples of one or more geometric features of the metallic outer surface for attachment to metallic elements on a printed circuit board. When configured accordingly, such a device enclosed by shield 300 may be constructed to be compatible with a particular type of electrical circuit PCB, e.g., a stripline circuit.

Figure 4:
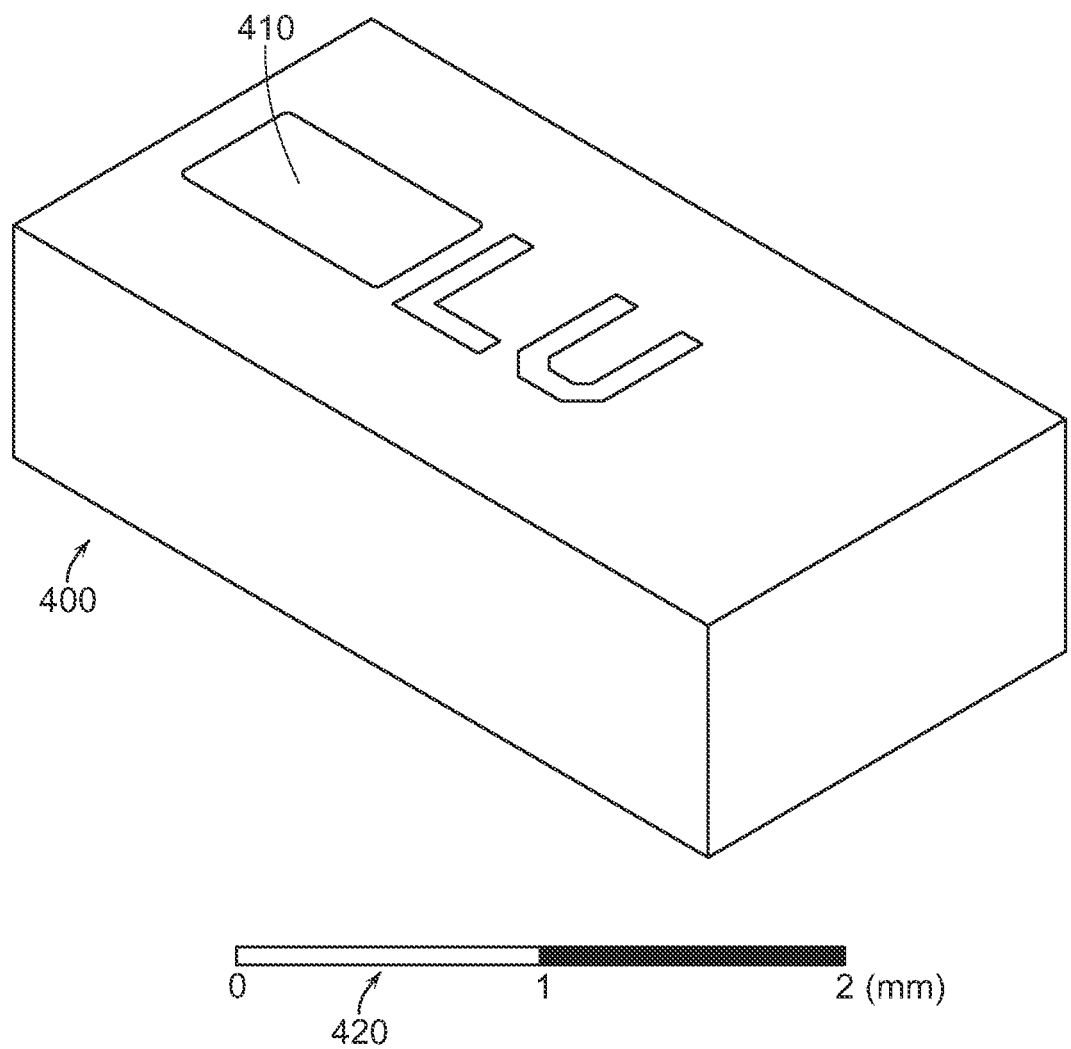
FIG. 4 depicts an exemplary diagram according to embodiments of the invention.

FIG. 4 depicts an exemplary embodiment of the invention. A device may be as in an embodiment depicted by FIG. 3, and may be observed from an alternate view, or an opposing view, depicted by FIG. 4, showing shield 400 fully encircling such a device, e.g. an LTCC filter electrical circuit, an RF circuit, etc. A marking 410 may be inscribed, printed, plated, or otherwise attached closer to an edge of shield 400 in a plane parallel to a mounting surface, and such plane residing on an opposing side to such mounting surface, e.g. in a solid rectangular package. Marking 410 may be used to indicate a function of a terminal or lead, e.g. a lead used as an input to an LTCC electrical circuit, an indication of guidance for orientation during attachment, or any other suitable function.

Figure 5:
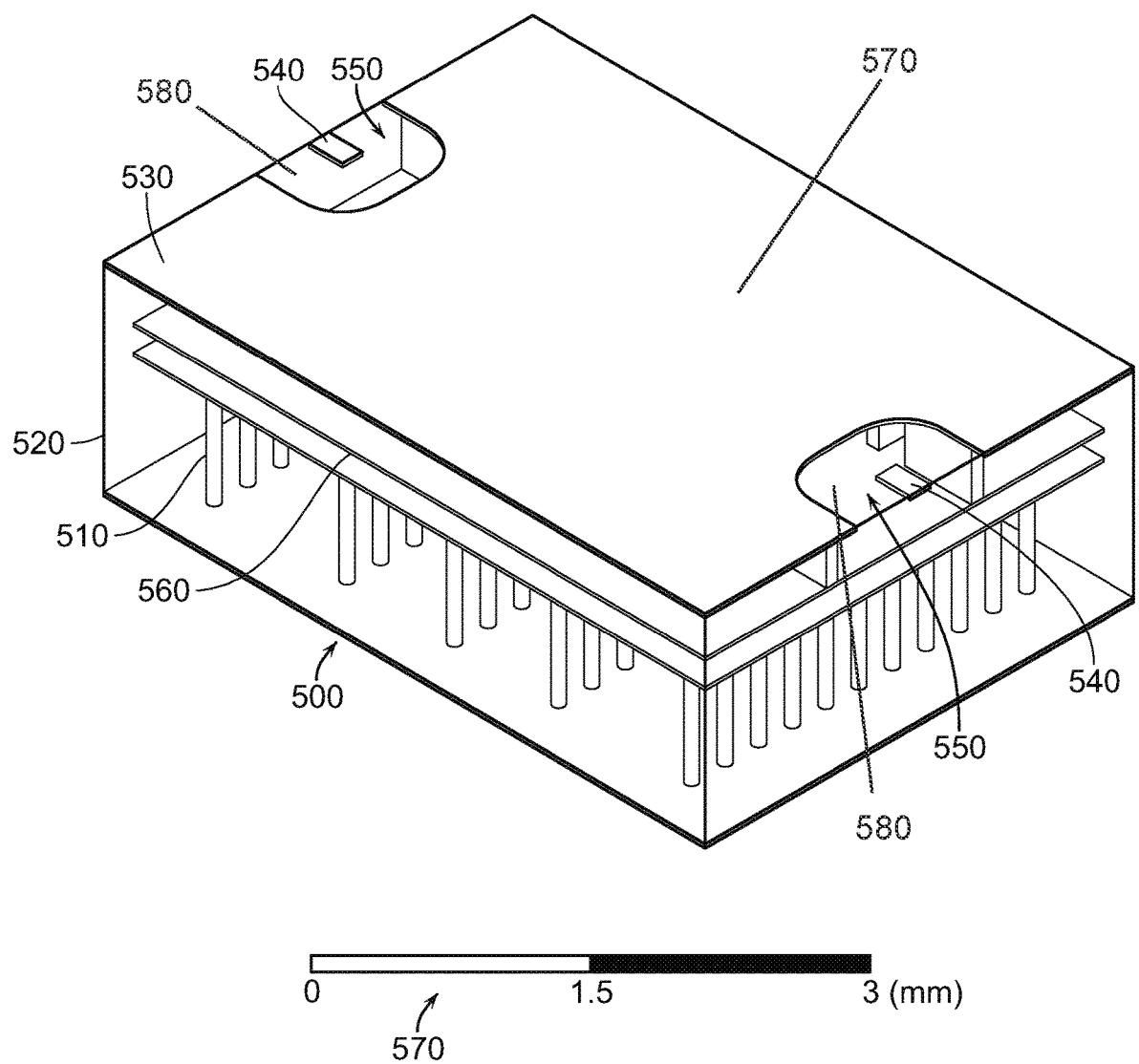
FIG. 5 depicts an exemplary diagram according to embodiments of the invention.

FIG. 5 depicts an exemplary embodiment of the invention. A shielded LTCC filter device 500 formed with a flat coplanar surface 570 may be surrounded by a metallic shield enclosure 520 or may be an enclosure made of another material, e.g., plastic, and may surround and/or encapsulate a device, e.g., an LTCC electrical AC filter circuit, and may provide electrical circuit grounding. A shield may have vertical metallic via holes components 510, and/or other vertical metallic shielding walls or alternate internal shielding components. Vertical metallic via holes may be arranged to be operable as an electrical wall, for example an electrical shielding wall, where a distance between successive vertical holes may be reduced to prevent RF electrical signal leakage. An internal shield may include horizontal shielding elements 560, e.g., plates, walls, etc., and may be conductive and/or attached to a device circuit ground. Two or more second apertures 580 can be provided having relief of a continuous metal on the coplanar surface side extending from the interior to the exterior of a metallic outer surface. A shield may be attached to a PCB with ground plane 530. An LTCC filter may have input and output connection leads 540 that may be connected to a transmission line and/or other electrical circuits and/or devices on a PCB. Each of input and output leads 540 may be separated from ground shield 530 by a planar relief area 550 around each terminal lead 540, larger than a terminal 540, with no metal or electrically conductive material, such that there may be no electrical connection between either of these leads 540 and a ground shield 550. Such a relief area may reside in the same plane as a terminal 540. The leads 540 also represent one or more geometric features of the metallic outer surface for attachment to metallic elements on a printed circuit board.

Figure 6:
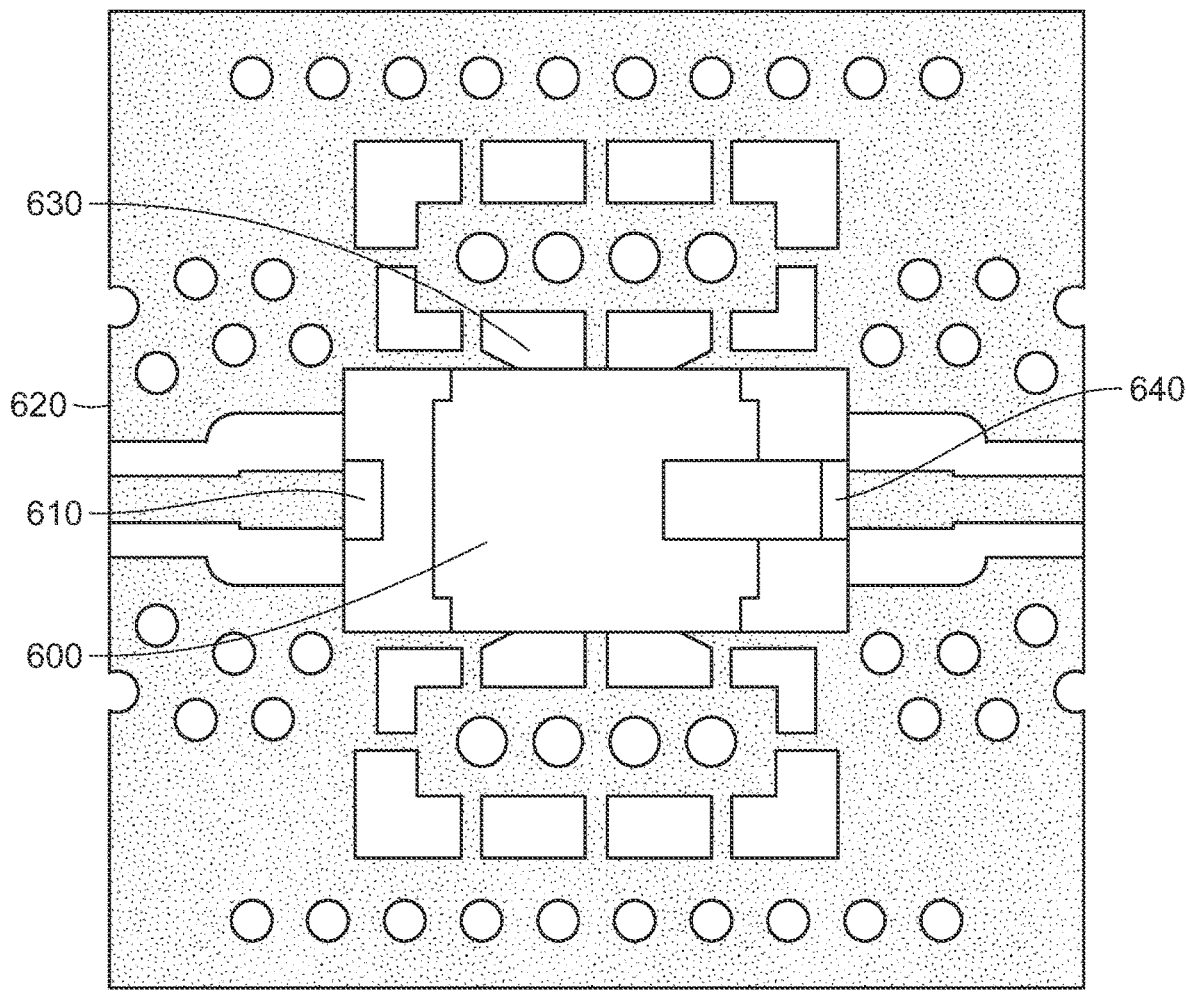
FIG. 6 depicts an exemplary diagram according to embodiments of the invention.

Referring to an exemplary embodiment depicted by FIG. 6, a device 600, e.g. an LTCC electrical RF filter circuit component, may be assembled or attached onto PCB 620. An input electrical lead connection may be made by attaching input lead 640 to for example, an RF transmission line on PCB 620. An output lead 610 may be similarly attached and/or electrically operably connected, for example to another transmission line on PCB 620. A shield may be constructed around LTCC filter device 600 and may be attached to PCB ground 630.

Figure 7:
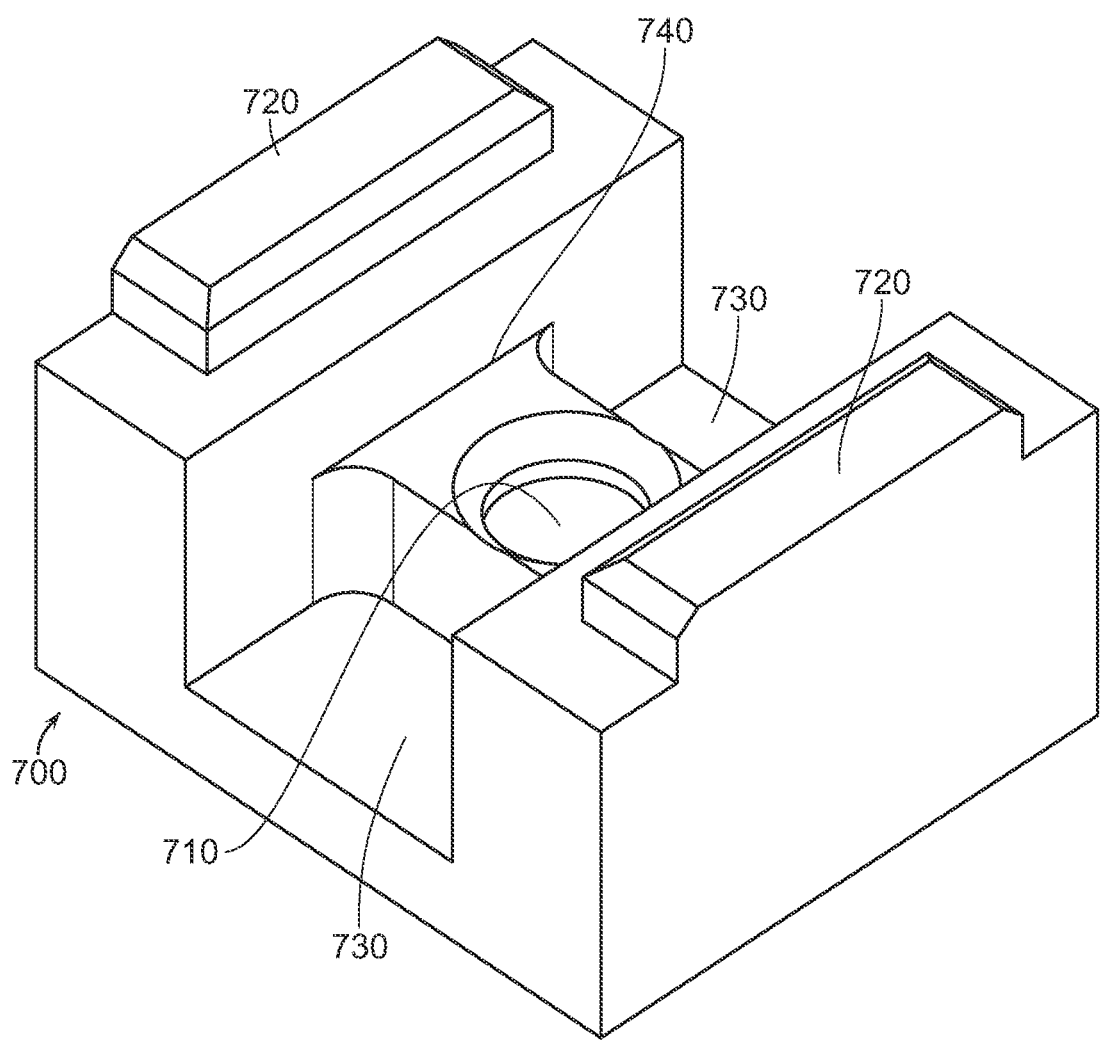
FIG. 7 depicts an exemplary diagram according to embodiments of the invention.

FIG. 7 depicts an exemplary embodiment of the invention. According to an embodiment of the invention, a metallic shield 700, e.g. a shield for enhanced RF electrical isolation of an enclosed LTCC frequency selective filter, may be constructed. Such a shield may have a solder cup 710 feature for ease of construction and/or attachment using solder, or for facilitating use of a predetermined amount of solder. One or more cavities 730 may be constructed, e.g. metallic shield material may be removed, milled away, etc., to form a cavity, such that cavities 730 may be located vertically above, or partially around, one or more filter circuit elements, or other electrical transmission lines, components, etc., when mounted and/or attached to such enclosed electrical circuit. A shield element may be comprised of one or more stepped shield legs 720, as part of such a shield, and may be, for example, for attachment to a PCB ground plane. In some embodiments, shield 700 may be manufactured in a same work part as other such shields, and may have a common orientation of features 740, e.g. milled features, among all such work parts. Vertically above may refer to a position relative to a component, for example an enclosed LTCC circuit, when such component is mounted to a PCB and such PCB is referred to as below a component. Metallic shield 700 may be a single metallic element, or may be comprised of two or more metallic elements or metallic plated elements, each electrically, mechanically and/or operably connected.

Figure 8:
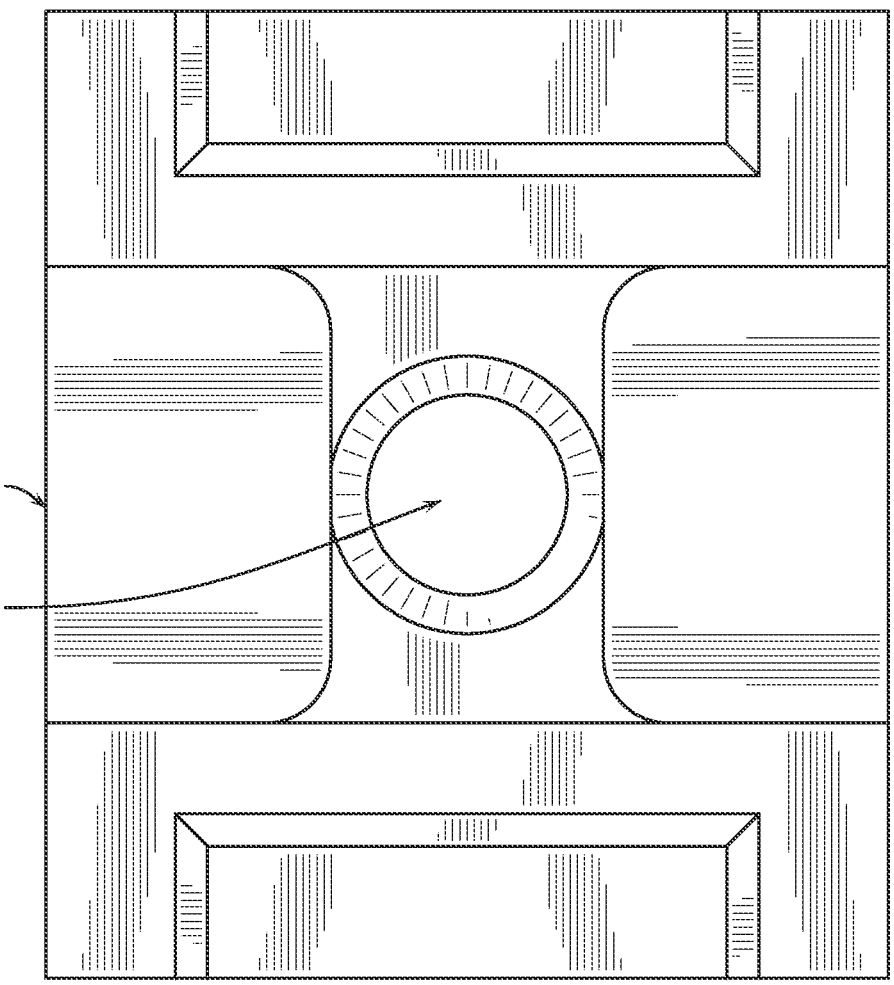
FIG. 8 depicts an exemplary diagram according to embodiments of the invention.

FIG. 8 depicts an exemplary embodiment of the invention. A shield 800 may be as in an embodiment depicted by FIG. 7, and may be observed from an alternate view, as depicted in FIG. 8. Such a view of shield 800 may depict soler cup 810 as an exemplary embodiment where it may be a circular, or concentric cylindrical, solid feature. A solder cup may be any other suitable three-dimensional solid geometric shape, and may have at least one open side.

Figure 9:
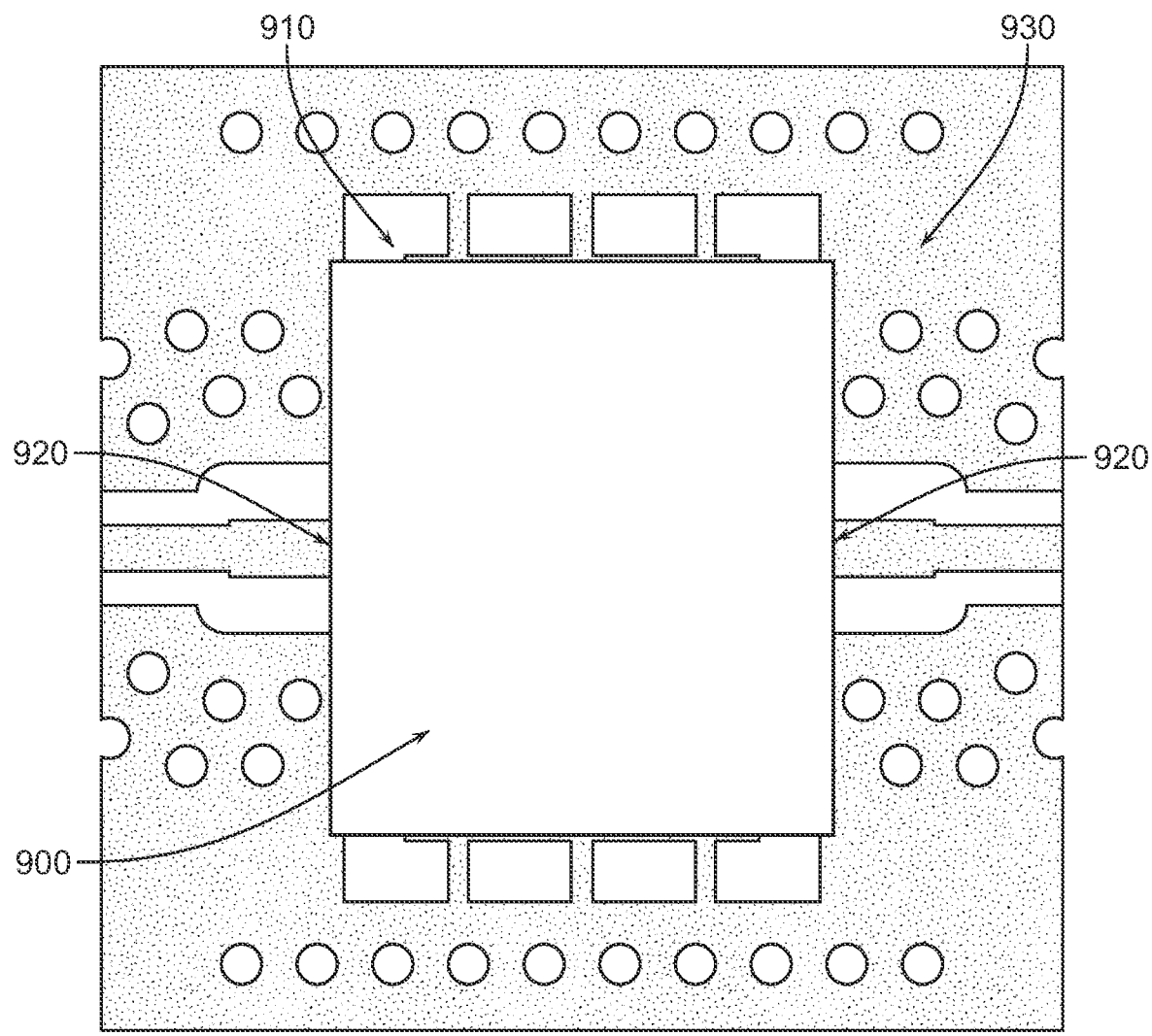
FIG. 9 depicts an exemplary diagram according to embodiments of the invention.

FIG. 9 depicts an exemplary embodiment of the invention. A shielded LTCC RF filter component 900 may be attached to a PCB 930. An input connection 920 and an output connection 920 may be made between LTCC filter 900 and two or more, e.g. at least one input and one output, transmission lines on PCB 930. A shield of LTCC filter component and/or device 900 may be attached to a ground 910 on PCB 930.

Figure 10:
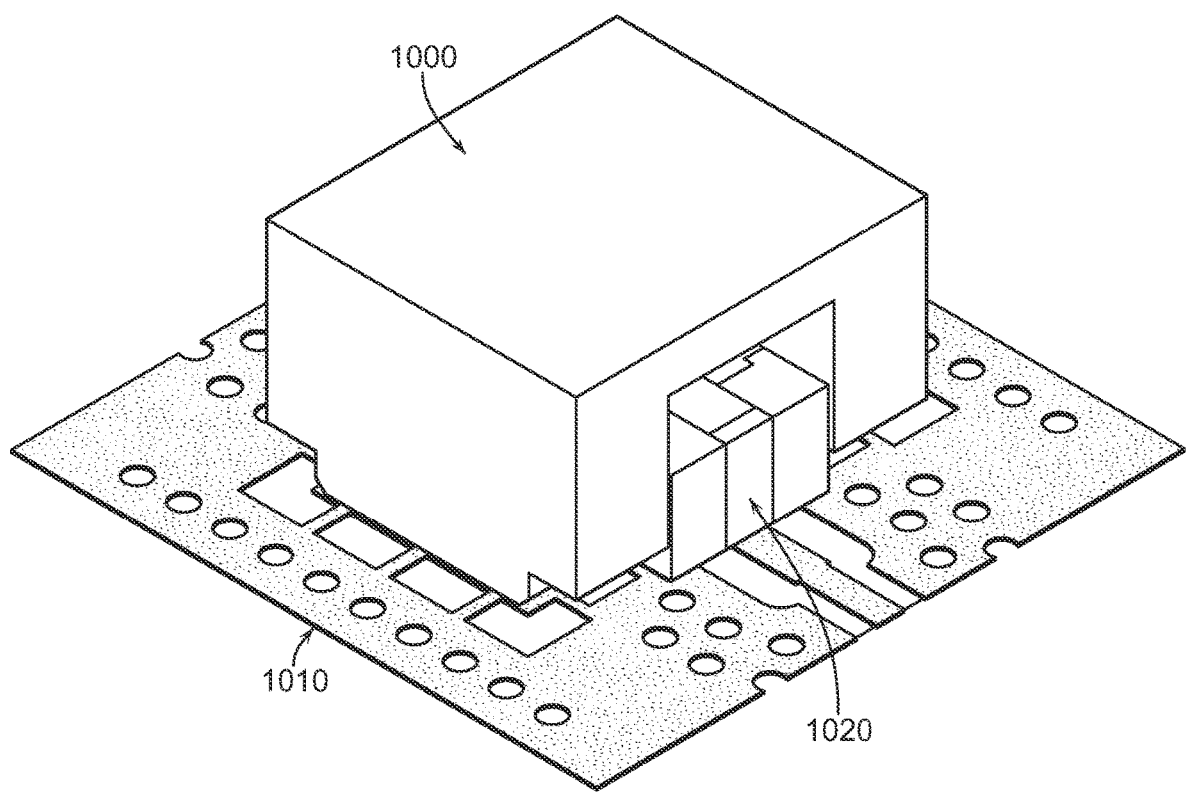
FIG. 10 depicts an exemplary diagram according to embodiments of the invention.

FIG. 10 depicts an exemplary embodiment of the invention. A component 1020, e.g., an LTCC RF filter component, may be surrounded by a shield 1000, and may be attached to a PCB 1010. Shield 1000 may be attached to LTCC filter 1020 prior to attachment to PCB 1010, during such attachment process, or after attachment of LTCC device 1020. According to embodiments of the invention, shield 1000 may operate in a same manner independent of when it may become surrounding of LTCC component 1020, with respect to an order of attachment to PCB 1010. Shield 1000 is depicted with a first and a second side parallel to each other and each perpendicular to the plane of the PCB, each comprising solid electrically conductive material. Third and fourth sides are parallel to each other and are each mutually perpendicular to the plane of the PCB and the plane of the first and second sides, where the third and fourth sides each have an aperture allowing transfer of an electrical signal between an interior and an exterior of shield 1000. An aperture may comprise an air insulator, a ceramic insulator, a polymer insulator, a glass insulator, any other suitable insulator, or a combination of two or more insulators. For example, an aperture in shield 1000 is depicted as a combination of an air insulator and a ceramic insulator, where a ceramic may be part of component 1020. An insulator may also include a separation on a PCB of a signal conductor, e.g., a circuit trace, and a ground plane on a PCB. An aperture may be designed and/or constructed as a transmission line, e.g., a TEM transmission line, and may have predetermined dimensions and/or predetermined distances between conductive lines and ground planes. An aperture may alternately be a position where electrical signals may be conducted between an interior and an exterior of shield 1000 with one or more insulators, air gap, etc. between a signal conductor and a ground plane and/or shield 1000.

Figure 11:
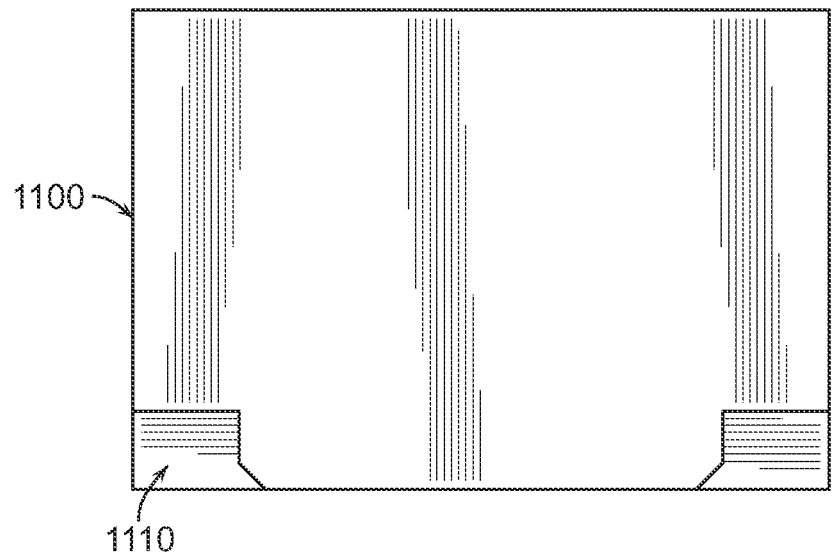
FIG. 11 depicts an exemplary diagram according to embodiments of the invention.

FIG. 11 depicts an exemplary embodiment of the invention. Shield 1100 may be comprised of a homogeneous material, or of two or more materials 1110 fused or otherwise attached or combined together, or of two or more layers of a same material, or any combination thereof, to form such a shield 1100. Shield 1100 may depict a shield internal to a device or external to a device. Two or more materials 1110 may be depicted within a cut-away view 1110, to better depict materials below a top material. Such a cut-away view or combination or combinations of layers is not meant to restrict a size of any one material or layer with respect any other.

Figure 12:
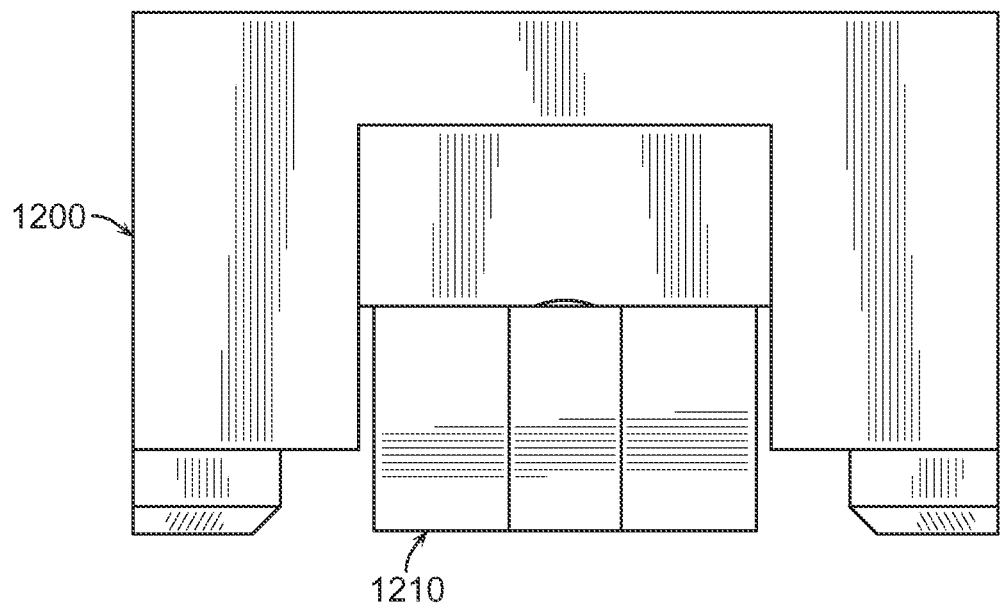
FIG. 12 depicts an exemplary diagram according to embodiments of the invention.

FIG. 12 depicts an exemplary embodiment of the invention. A component 1210, e.g., an LTCC RF filter component, may be surrounded by a shield 1200. Shield 1200 may be attached to LTCC filter device 1210 before, during or after attachment to, for example, a PCB. A combination of component 1210 and shield 1200 may be suitable for assembly or construction onto a PCB or other circuit.

Figure 13:
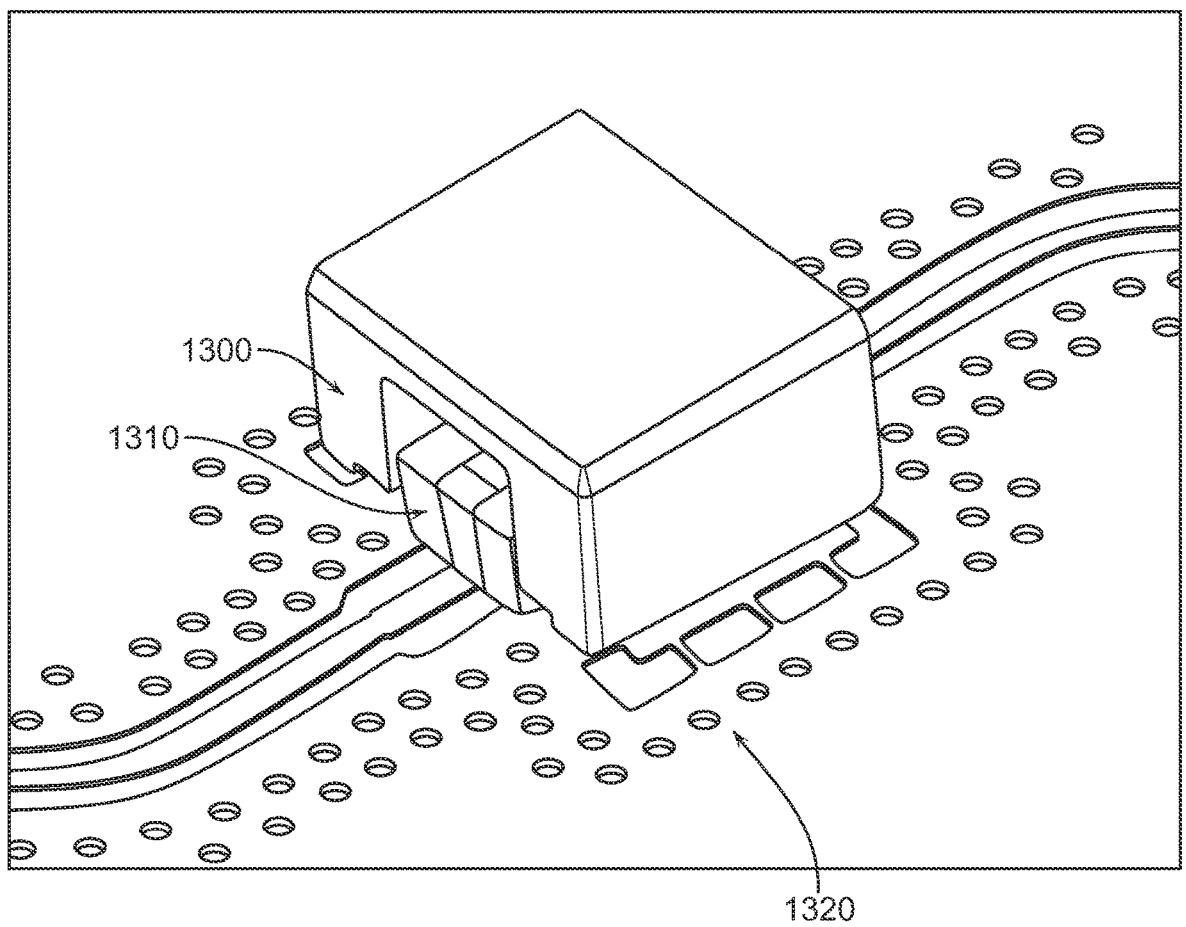
FIG. 13 depicts an exemplary diagram according to embodiments of the invention.

FIG. 13 depicts an exemplary embodiment of the invention. An LTCC RF filter component 1310 may be surrounded by a shield 1300 and may be attached to a PCB 1320. Attachment may be made at a circuit input connection, or lead, an output lead and/or at a ground connection. A ground connection may be between shield 1300 and electrical ground features of PCB 1320. Electrical ground features of PCB 1320 may be a ground plane, ground and/or attachment pins, leads or tabs, other attachment features, or any combination of such features. PCB 1320 may have a continuous ground plane, a ground plane with via holes, and/or other ground features.

Figure 14:
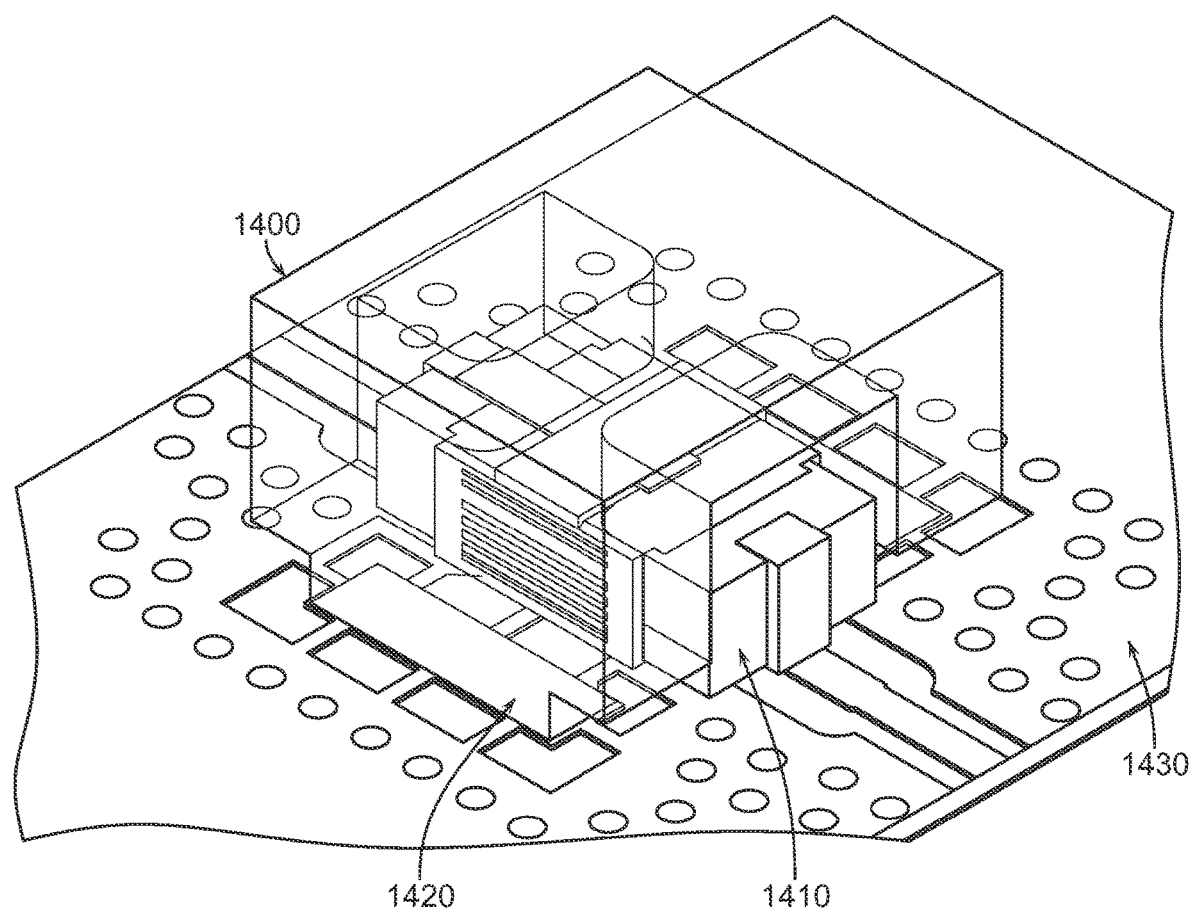
FIG. 14 depicts an exemplary diagram according to embodiments of the invention.

FIG. 14 depicts an exemplary embodiment of the invention. An isometric view of a device 1410, e.g., an LTCC device, with an external shield 1400 is shown, with elements of FIG. 14 shown with transparency for visual clarity of the figure. Internal and external grounding structures, as depicted by other figures, may be visible in such an exemplary embodiment. Grounding from shield 1400 to a PCB may be by attachment to a ground connection 1420 on PCB 1430.

Figure 15:
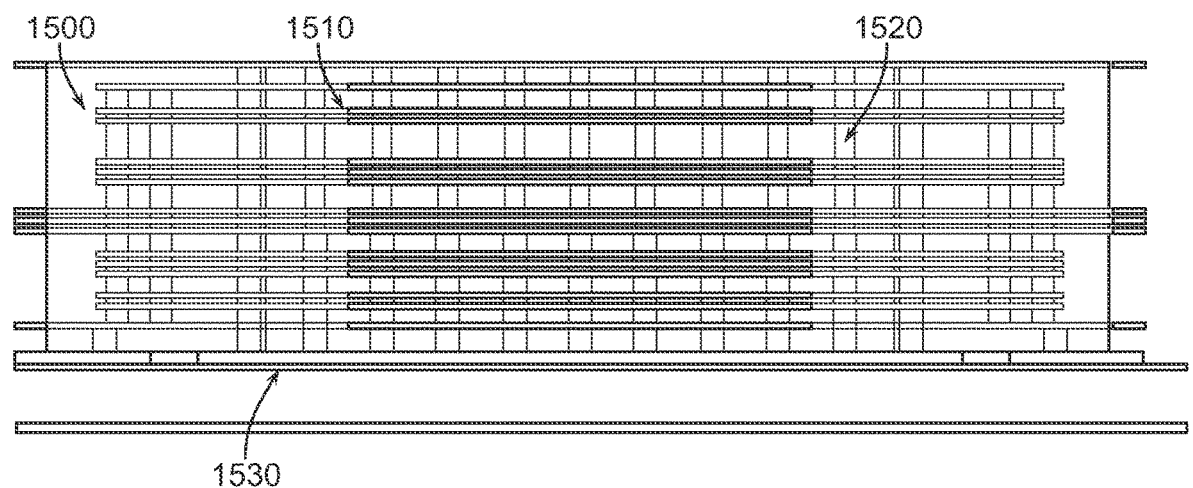
FIG. 15 depicts an exemplary diagram according to embodiments of the invention.

FIG. 15 depicts an exemplary embodiment of the invention. A side view of a device, e.g., an LTCC device, surrounded by a shield 1500 is depicted. An internal grounding structure, e.g. a grounding cage, may be comprised of horizontal shielding elements 1510, vertical shielding elements 1520, or a combination of one or more of each such elements. Shielding elements 1510, 1520 may be solid structures, via holes, or any combination of such elements. A shield may be attached to a PCB ground at 1530. A PCB ground attachment 1530 may be referred to as being below, or vertically below, a device, for example for purposes of relative description of orientations.

Figure 16A:
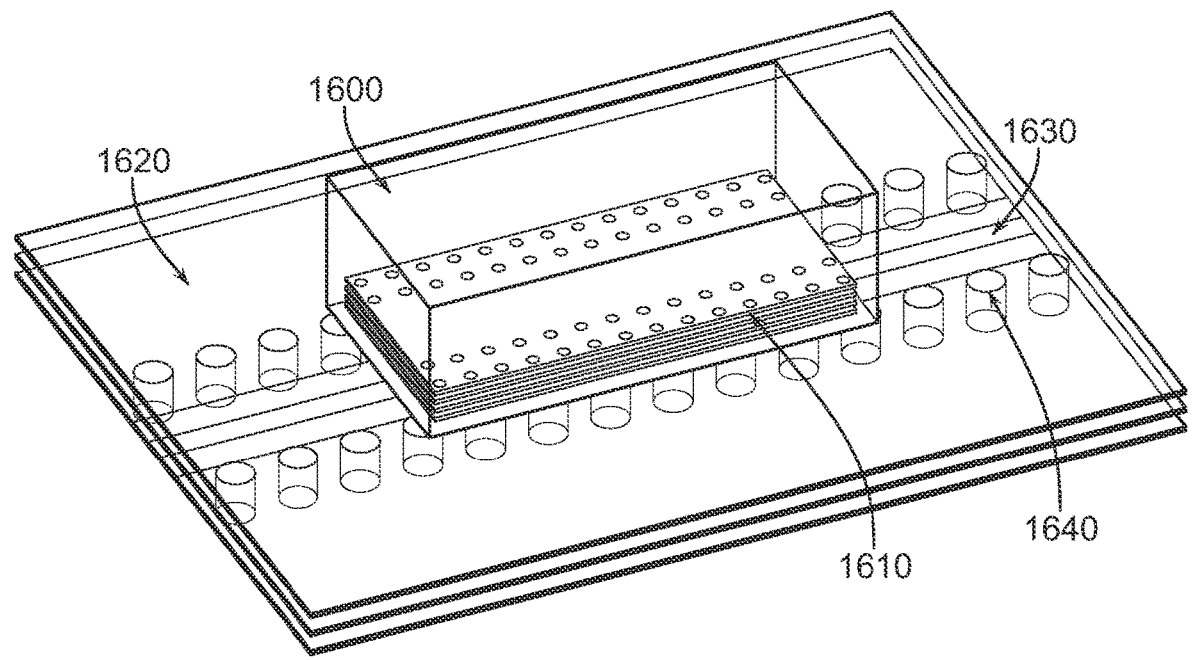
FIGS. 16a and 16b depict[s] an exemplary diagram according to embodiments of the invention.
Figure 16B:
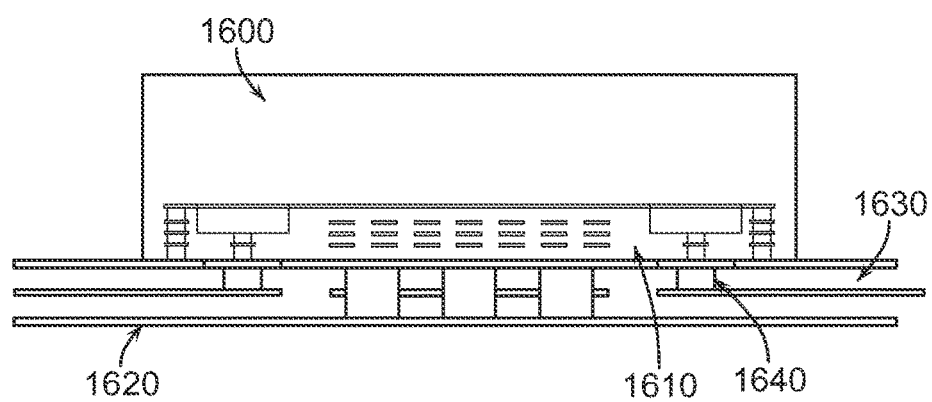

FIGS. 16a and 16b depict views of exemplary embodiments of the invention. A shield 1600 may surround an LTCC device 1610, e.g. an LTCC filter. Such shield 1600 and LTCC filter 1610 may be attached to a PCB 1620. PCB 1620 may be constructed and/or manufactured to support a transmission line, e.g., a stripline, microstrip, etc., electrical RF transmission structure having transmission lines 1630 that may not be exposed outside such a structure. Electrically conductive structures 1640, e.g. metallic vertical vias, may be formed within a top layer of stripline PCB 1620 to facilitate an electrically operable and/or conductive connection between transmission lines 1630, e.g. input and/or output transmission lines, and input and/or output connections, e.g. terminals, leads, ports, etc., of LTCC circuit 1610. Other vias 1640 may be used to electrically operable and/or conductively connect, for example, a top ground plane stripline ground conductor of stripline 1620 to a bottom stripline ground conductor of stripline 1620, and/or to grounding features of a shield of LTCC component 1600.

Figure 17:
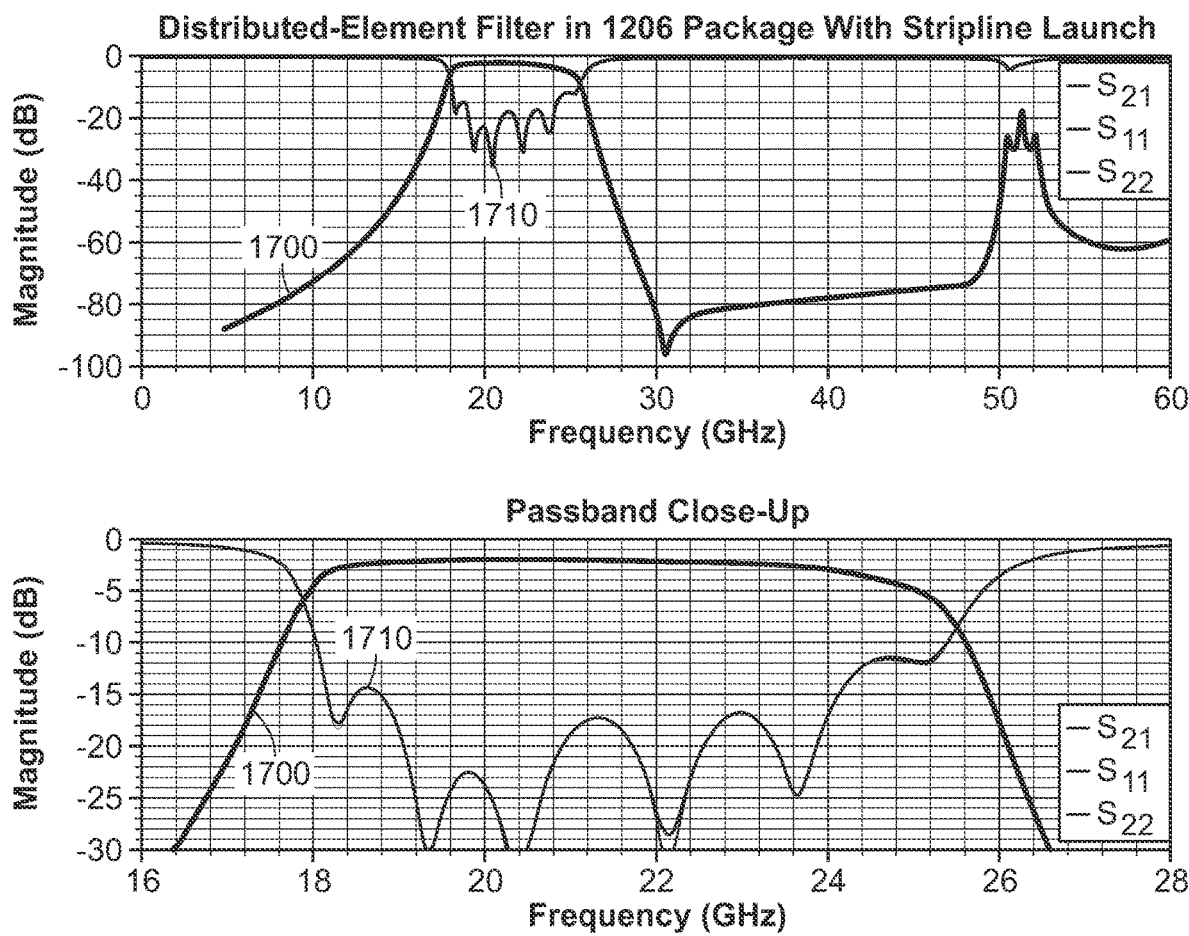
FIG. 17 depicts an exemplary diagram according to embodiments of the invention.

According to an exemplary embodiment of the invention, an LTCC filter may be constructed and mechanically attached to a PCB, and electrical operable connections may be made to allow measurement of an LTCC filter device. FIG. 17 shows an exemplary electrical performance result of such a measurement, depicting a same result both over a broad frequency range and over a narrow frequency range. Such a narrow frequency range may be a sub-set of a broad frequency range, and may be around and/or encompass, for example, a passband of an LTCC filter device constructed according to embodiments of the invention. A response of RF electrical energy transiting, or passing, through such an LTCC filter is depicted 1700, and may show minimal or no degradation of a passband signal 1700, for example, as a result of implementing and/or attachment of a shield in accordance with embodiments of the invention. A return loss, or reflection response, 1710 is depicted showing reduced reflections within a desired design passband and high reflections throughout a desired design stopband. High reflections may be an indication of a stopband performing as designed and/or as intended, where an increase in reflections in a stopband may be, for example, an indication of an improvement in a functioning of a filter. Such exemplary performance may be from, for example, an LTCC filter with a shield grounded to a stripline PCB, fully enclosing such device excepting only input and output ports, and may have internal vias and/or additional internal grounded shielding structures. Such electrical characteristics may be characterized as a filter with good, or improved, performance. Such a device according to embodiments of the invention represent improvements over other technologies and depicts clear performance advantages.

Figure 18:
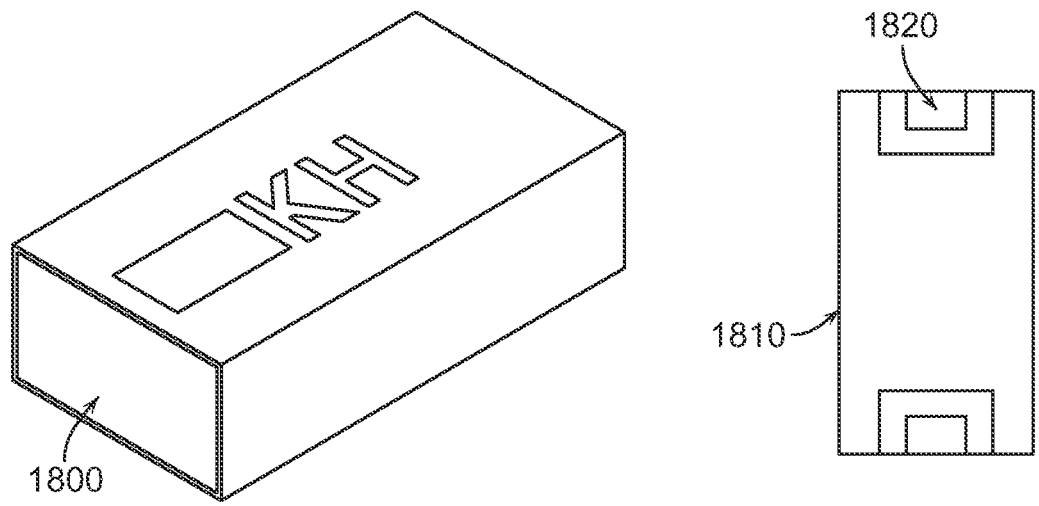
FIG. 18 depicts an exemplary diagram according to embodiments of the invention.

FIG. 18 depicts an exemplary embodiment of the invention. A shielded case 1800 of a device, e.g. an LTCC filter device, may have ports, or electrical signal launches, 1820 for attachment and use with a co-planar waveguide (CPW) and/or a microstrip PCB. Grounding of such a device 1800 may be by ground attachment 1810, electrically operably connected to a shield of device 1800. An exemplary device as depicted in FIG. 18 may have a shielding structure on four sides, where a fourth side with ground attachment 1810 may have apertures for transfer of electrical signal energy between an interior and an exterior of case 1800 that may be located coplanar with a surface for attachment to a PCB.

Figure 19:
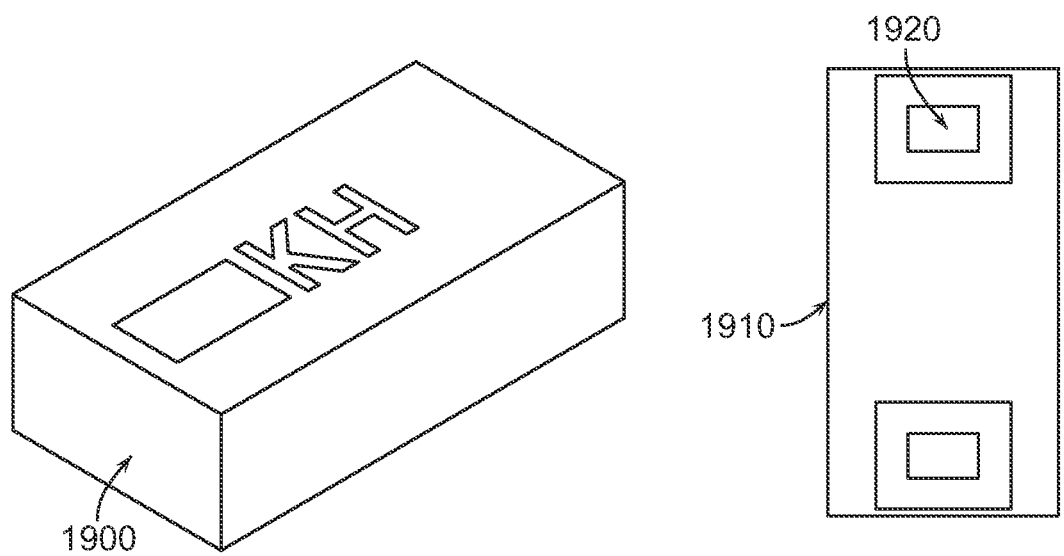
FIG. 19 depicts an exemplary diagram according to embodiments of the invention.

FIG. 19 depicts an exemplary embodiment of the invention. A shielded case 1900 of a device, e.g. an LTCC filter device, may have ports, or electrical signal launches, 1920 for attachment and use with a stripline PCB. Grounding of such a device 1900 may be by ground attachment 1910, electrically operably connected to a shield of device 1900. An exemplary device as depicted in FIG. 19 may have a shielding structure on six sides, where a fourth side with ground attachment 1910 may have apertures for transfer of electrical signal energy between an interior and an exterior of case 1900 that may be located coplanar with a surface for attachment to a PCB.

Figure 20:
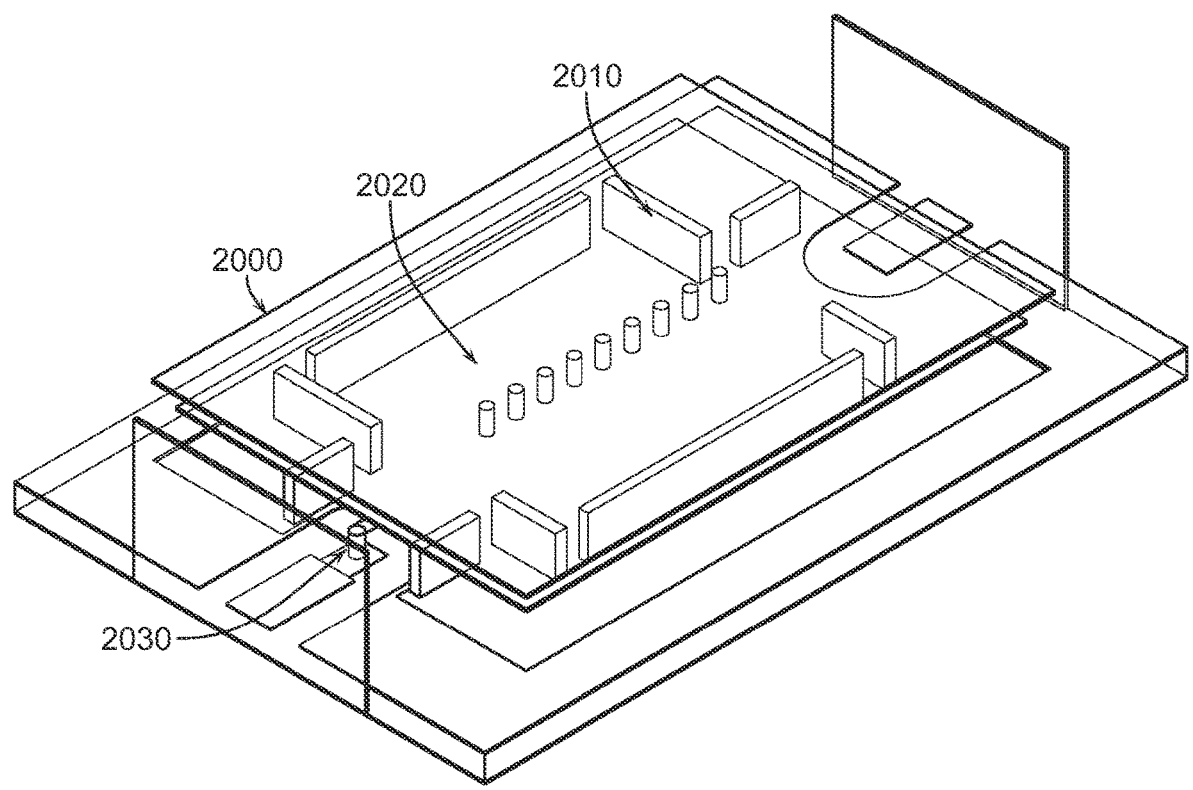
FIG. 20 depicts an exemplary diagram according to embodiments of the invention.

FIG. 20 depicts an exemplary embodiment of the invention. A shield 2000 of a device, e.g. an LTCC filter device 2020, or other circuit 2020, may be used to improve performance of such a filter device, and may be internal, e.g. mechanically embedded within, external, e.g. exposed to an environment around such a device, or a combination of both. A shield may be comprised of horizontal elements 2000, vertical elements 2010, e.g. walls, via holes, etc., or a combination of such elements, and may be electrically conductive, e.g. comprising an electrical signal energy transmission ground or electromagnetic ground or signal ground reference. A shield may be operably and/or electrically connected to a signal ground of a device within such a shield. Such a shield 2000 may be comprised of one or more layers, and such layers may be electrically operably and/or mechanically connected. A ground connection to and/or on a PCB may also be such a layer. For positional reference, horizontal may refer to a plane parallel to a mounting surface plane, or a plane of a top surface of a PCB onto which such an exemplary device may be mounted. Also, for positional reference, vertical may refer to a plane perpendicular to a mounting surface plane, or a plane of a top surface of a PCB onto which such an exemplary device may be mounted. Vertical elements 2010 may be solid rectangular, solid cylindrical, or any other suitable solid geometric shape. Electrical signal energy may flow into and/or out of such an LTCC filter 2020 via one or more electrically operable connections to a PCB 2030, for example, onto which such a circuit 2020 and its associated shield 2000 may be mounted, at input and/or output signal connections, e.g. leads, ports, terminals, etc., and may be through an aperture, for example an aperture in a shield. Electrically conductive layers may be embedded within an LTCC structure or may be exposed. In some embodiments, such a shielding structure may employ features, e.g., full tape thickness features, and such features may provide optimal electrical grounding and/or high electrical signal energy, e.g. RF signal, AC signal, etc., isolation, for example, from an input port to an output port of such a device. Some devices may be bi-directional, and input ports and output ports may be interchangeable.

Figure 21:
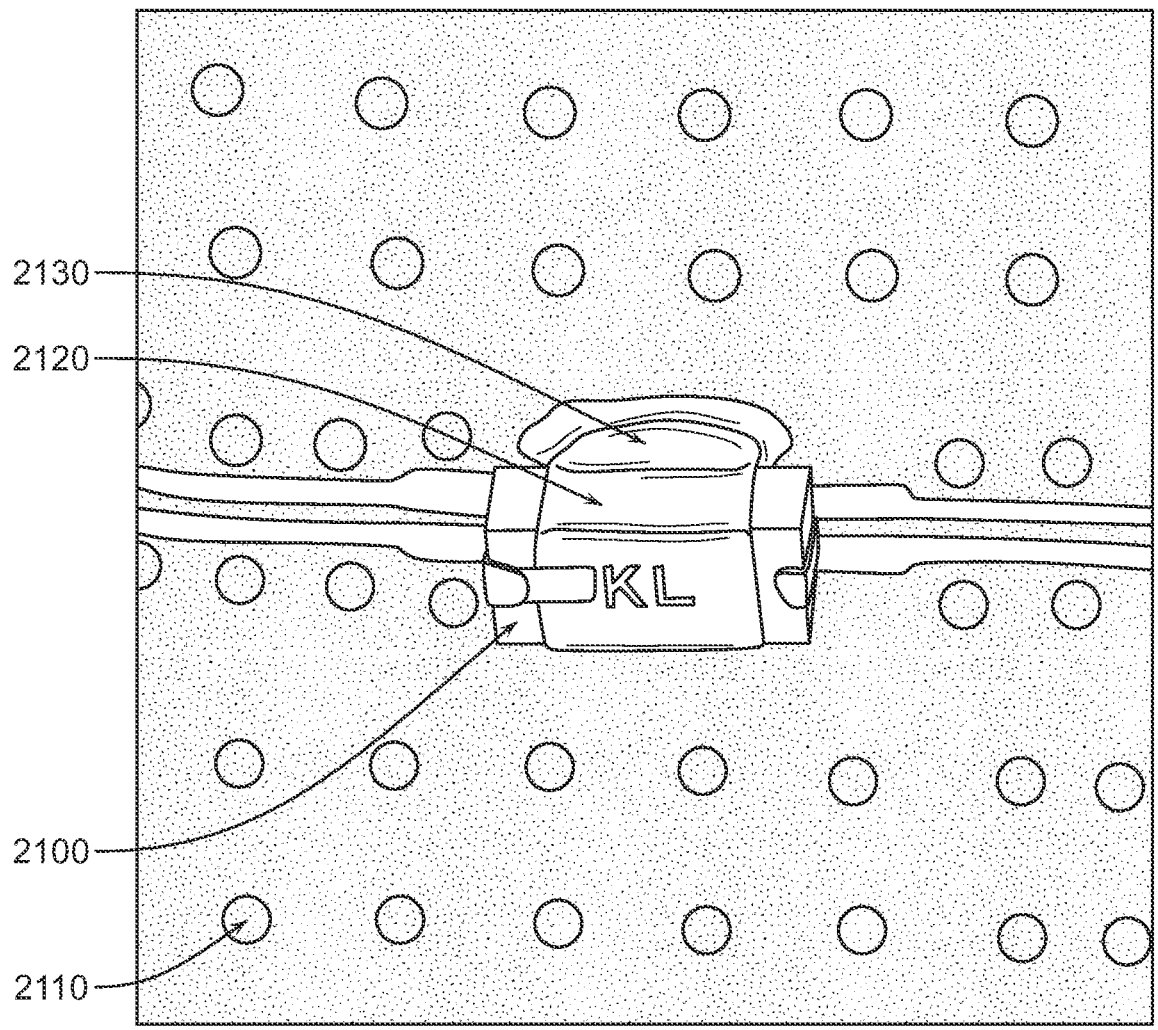
FIG. 21 depicts an exemplary diagram according to embodiments of the invention.

FIG. 21 depicts an exemplary embodiment of the invention. An LTCC filter device 2100 may be attached to a PCB 2110 according to embodiments of the invention, and may have a wrap-around ground structure. Such a wrap-around ground structure of LTCC device 2100, e.g. an LTCC filter, may be attached to a ground of PCB 2110.

Figure 22:
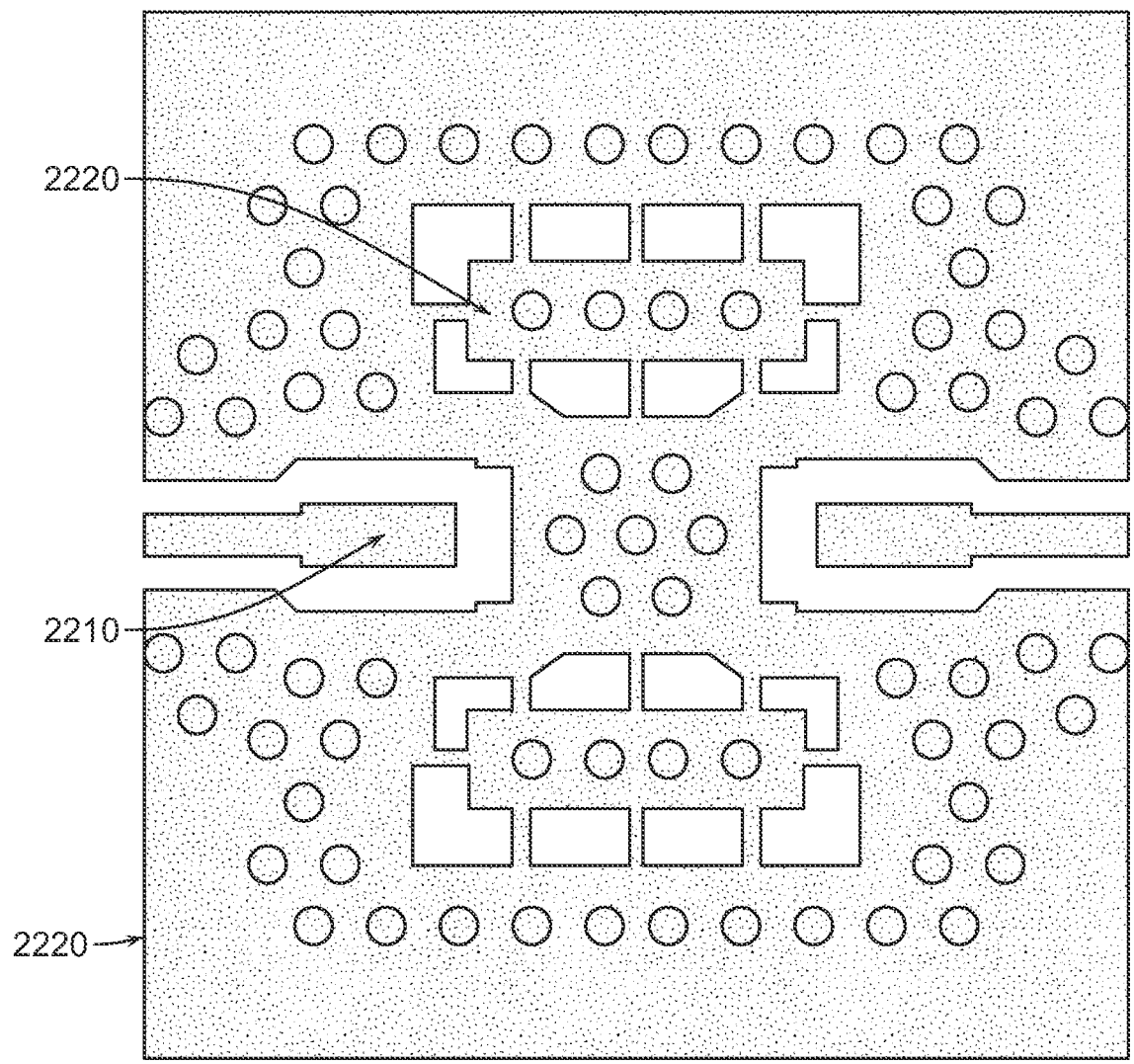
FIG. 22 depicts an exemplary diagram according to embodiments of the invention.

FIG. 22 depicts an exemplary embodiment of the invention. A PCB 2200 may be used for mounting, attachment, connection and/or use of devices according to embodiments of the invention. PCB 2200 may have one or more port connections 2210 and one or more electrical ground connections 2220. Ground connections 2220 may be ground plane cut-outs, and may constrain a position of leads, e.g. leads or legs of a filter, during a solder process, e.g. reflow soldering. Port connections 2210, e.g. traces, may be thin traces, and may provide surface tension that may prevent outflow of solder, for example, without a use of a solder mask, increasing efficiency and lowering cost of assembly. Ground connections 2220 may be stepped leg, e.g. a stepped leg cross section, may reduce an amount of solder needed to mount a shield to a PCB 2200, and may reduce a tendency of such a shield to move, or float, during an assembly process, e.g. reflow soldering. In some embodiments, thin lines may not be necessary. In other embodiments, a PCB 2200 may be fabricated with, for example, a full cut-out around a shield leg landing pad on such a PCB 2200, and electrically conductive ground vias that may be beneath such legs and/or ground contact may make electrical contact through a device's wrap-around, e.g. wrap-around shield. PCB 2200 may form a fourth side of an electrical shielding structure, according to embodiments of the invention.

Figure 23:
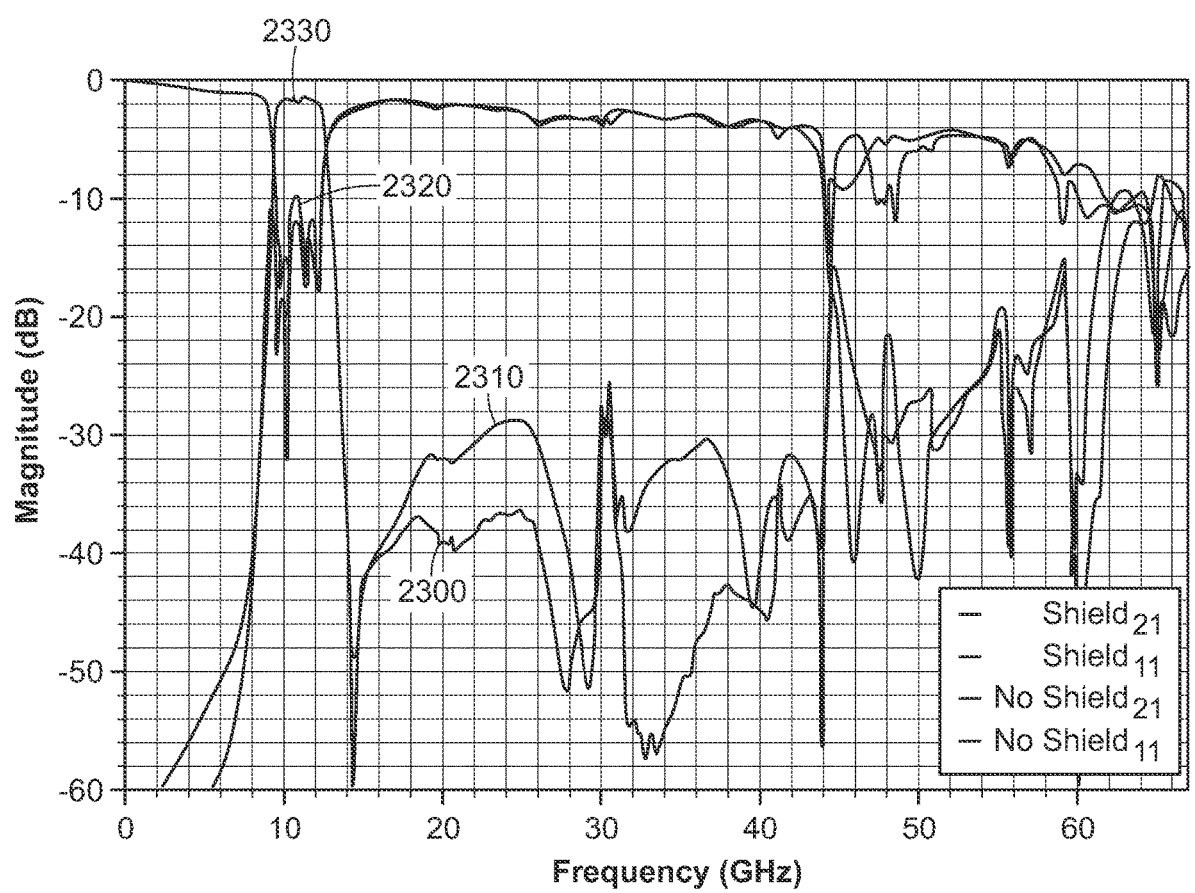
FIG. 23 depicts an exemplary diagram according to embodiments of the invention.

According to an exemplary embodiment of the invention, an LTCC filter may be constructed and mechanically attached to a PCB, and electrically operable connections may be made to allow measurement of an LTCC filter device. FIG. 23 shows an exemplary electrical performance result of such a measurement. An LTCC filter device may be constructed, and a shielding structure according to embodiments of the invention may be attached according to further embodiments of the invention. It may then be mechanically attached to a PCB, and after attachment, electrical operable connections may be made to allow measurement of a shielded LTCC filter device. FIG. 23 shows an exemplary electrical performance result of such a measurement. According to exemplary FIG. 23, performance within a passband frequency band may have no deviation or degradation in performance between a shielded or an unshielded LTCC filter, which may be a desired result. A shielded LTCC filter rejection performance 2300 has an increase in an electrical signal rejection in substantially all of a rejection band frequency band when compared to an unshielded LTCC filter performance 2310, which is an additional desired result. An increase in rejection may be, for example 20 decibels (dB), or another amount of increase of undesired electrical frequency signals.

Also depicted by exemplary FIG. 23 may be a measure of reflected signal 2320, which may be proportional to a mismatch experienced by an electrical signal when entering a device or structure, e.g. an LTCC filter. A measurement of a reflected signal 2320, S11, may be shown for both an LTCC filter without a shield and an LTCC filter with a shield constructed and installed according to embodiments of the invention. This exemplary measurement may show there may be no significant deviation in electrical performance when a shield may be used, which may be a further desired result.

Exemplary measurements may use, for example, through line de-embedding or other measurement techniques. Measurement techniques may be used to isolate electrical performance of a device under test (DUT), whether a control group device, e.g. an LTCC filter without a shield, a device with a shield constructed and installed according to embodiments of the invention, e.g. an LTCC filter with a shielding structure installed around it, or another device desired to have electrical performance measurements made and/or recorded.

Figure 24:
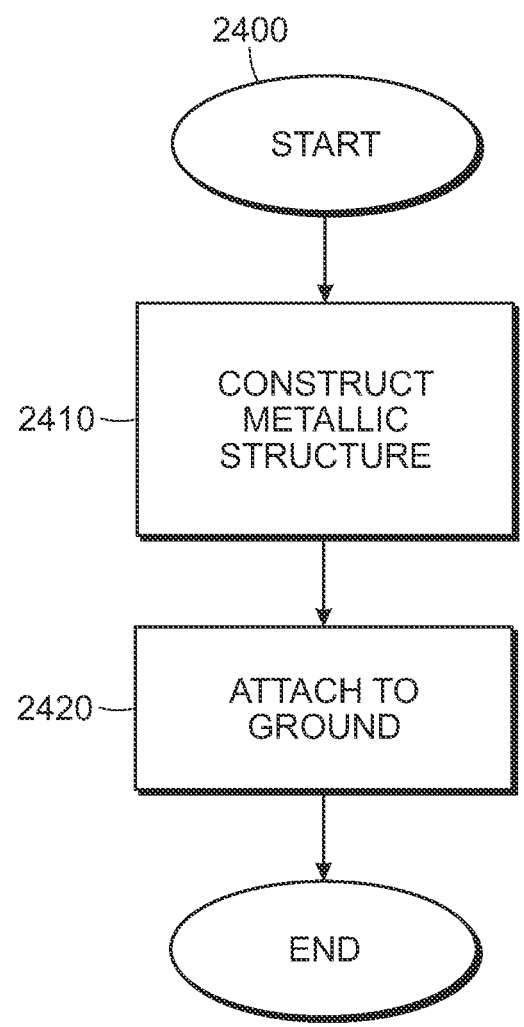
FIG. 24 depicts an exemplary method according to embodiments of the invention.

An exemplary method according to embodiments of the invention may be according to FIG. 24. An exemplary embodiment may be a method of shielding a surface mount device, e.g., an LTCC filter, an LTCC coupler, an LTCC power divider and/or combiner, or other LTCC devices and/or circuits. A method 2400 may start and may be to select a shield material having a metallic composition, another material having a metallic coating, another material having properties such that it may act as an electrical wall or shield, or a combination of such materials. Using such materials, a metallic structure, for example a shield or metallic shield, may be constructed 2410. Such structure may be a three-dimensional rectangular structure, for example a rectangular prism, or another solid structure that may be constructed to enclose, at least partially, a surface mount electrical device, e.g., an LTCC device, for mounting on a PCB, for mounting into a hybrid electrical circuit, or for inclusion, construction and/or assembly into other microelectronic circuits, components and/or systems. Such a structure may be a viscous material, e.g., a silver epoxy, that may be cured after application to, for example, harden such a material. Construction of a metallic structure 2410 may be, for example, by manufacturing a metallic rectangular prism into a shape that may extend to be around an LTCC surface mount electrical device or component, and may have apertures allowing passage of electrical signals, e.g., other than an electrical ground or ground signal, between an enclosed circuit and an external circuit, e.g., a circuit on a PCB, onto which such an LTCC device may be mounted. Construction of a metallic structure 2410 may be, for example, by applying a substance, e.g., a paste having a metallic content, an epoxy having a metallic content, or other such substance having metallic electrical properties, around at least three sides of a surface mount electrical device, e.g., an LTCC circuit or device, and each side may be fully or partially covered. Application of such a substance may be performed, for example, following attachment of a surface mount device to a PCB. Application may include physical application and/or attachment to an LTCC device and/or a PCB, and may include curing and/or hardening of such a substance, for example, into a conformed shape, and may be referred to as conformal coating, for example conformal coating of a silver epoxy around a surface mounted LTCC circuit or device.

A metallic structure that may be constructed 2410, and such a structure may be attached to ground 2420. Such attachment to ground may be by physical attachment, mechanical attachment, operable electrical attachment, e.g., electrical coupling, or any other suitable attachment method or combination of methods. A metallic structure may be attached to a ground plane and/or ground electrical contacts, on a PCB or other circuit or element onto which it may be assembled. A metallic structure may be attached, by, for example, direct physical and/or electrical contact, by operable electrical contact, by electrical signal coupling, or other electrical signal continuity attachment, to grounding elements, signal ground points and/or other circuit ground points of, for example, an enclosed, or partially enclosed, circuit or device, e.g., an LTCC circuit or device. A metallic shield structure may be attached to both a ground plane on a PCB and to a circuit ground of an enclosed circuit. In an embodiment a metallic shield may be attached to a PCB ground and an enclosed LTCC device or an LTCC circuit ground and may form an electrically continuous ground shield around such an enclosed LTCC device, that may, for example, increase and/or improve isolation from an external circuit and/or environment, and may improve an intended operation and/or intended function of enclosed device.

In an embodiment, conformal coating may refer to a process of coating a surface mount device, for example an LTCC circuit, an LTCC device and/or an LTCC monolithic structure, with a conductive paste that may conform to an external surface of such device or monolithic structure, may contour, and may provide a structure with a continuous external electrical shielding, either by physical continuous wrapping and/or electrical coupling wrapping.

Exemplary embodiments may include an apparatus for shielding that may comprise a metallic structure that may have continuous metal around its circumference, an attachment of one or more metallic structures to one or more metallic attachment points of a device, e.g., an LTCC device, that may be enclosed by a metallic structure, two or more apertures that may not have shield metallization extending from an interior to an exterior of a metallic structure, and one or more geometric features of a metallic structure that may be for attachment to metallic elements of an external circuit, for example, on a printed circuit board. An apparatus may be constructed of a material other than metal and a metal may be plated onto one or more surfaces of a structure. Plated metal may be both on an exterior and on an interior of a metallic structure. Apertures may include one or more metallic elements extending from an interior to an exterior of a structure and may be electrically disconnected from a continuous metal shield, each may be individually electrically connected to distinct metallic attachment points of an enclosed device. An enclosed device may be selected from a low temperature co-fired ceramic (LTCC) electrical device, a low temperature co-fired ceramic (LTCC) electrical circuit or a low temperature co-fired ceramic (LTCC) electrical filter, or a combination of such circuits and/or devices.

In some exemplary embodiments an enclosed device may be a filter, for example an electrical signal energy filter for passing through one or more bands of frequencies, e.g., pass band, and rejecting, or preventing from passing through, one or more bands of frequencies, e.g., reject bands or rejection bands, from an input to an output. An enclosed device may be an LTCC filter that may have a metallic structure and may reject additional electrical signal energy passing through from an input port to an output port throughout substantially all of its design stopband frequencies, where additional rejected electrical signal energy may be attributable to an electrically connected metallic shielding structure. An LTCC filter may have a metallic structure and may pass substantially the same electrical signal energy passing through from an input port to an output port throughout substantially all of its design passband frequencies, where passed electrical signal energy may have substantially no additional insertion loss from the electrical connection, addition and/or operable connection of a shielding structure, for example versus a device having no shielding structure. Metallic attachment points of a device enclosed by a metallic structure may be electrically connected to electrical grounding structures that may be within an electrical circuit of an LTCC device, an LTCC circuit and/or an LTCC filter.

In some exemplary embodiments one or more geometric features may be a flat and smooth surface that may be a co-planar surface to a printed circuit board, for example when attached to a printed circuit board. An attachment may be made by, for example, reflow soldering. One or more flat and/or smooth geometric features may facilitate self-alignment, for example, during reflow soldering, and may occur when a structure may be mechanically attached to a printed circuit board that may have one or more metallic features that may be geometrically matching a shape of a metallic structure. A printed circuit board may have metallic features that may include one or more of ground plane metallic relief, thin metallic electrical conductor attachments and/or a stepped leg cross-section, or any combination thereof. A geometric feature may be one or more solder cups that may be within, for example, the outer envelope of a metallic structure. A solder cup may contain solder paste, other solder and/or other attachment material during attachment, may contain excess solder and/or work to contain from overflow excess solder, and wick excess solder into a solder cup when solder may be in a molten state, to operably maintain a subsequently cooled solder fillet into a substantially thin attachment structure.

In some exemplary embodiments a metallic structure may be manufactured in bulk, for example, two or more at a time on a co-located workpiece, for example a workpiece of a large enough single piece size of raw material to provide for manufacture of two or more shield structures. A workpiece may be milled, machined and/or undergo another shaping process during a manufacturing process to shape a metallic structure that may simultaneously maintain a substantially constant geometric orientation relative to the geometric axes of the mill or machine. A workpiece may be diced or finished, for example, with additional manufacturing processes that may be subsequent to milling or machining, or such other shaping or forming.

An exemplary embodiment may be an apparatus for shielding a low temperature co-fired ceramic (LTCC) component that may comprise at least a metallic structure that may have continuous metal around its circumference, an attachment of a metallic structure to metallic attachment points of a device that may be enclosed by a metallic structure, two or more apertures that may have relieved metallization that may extend from an interior to an exterior of a metallic structure that may contain metallic electrical signal input and output terminal ports that may be electrically connected to corresponding input and output ports of an enclosed LTCC circuit, and may be electrically isolated from an enclosed metallic structure, one or more cavities that may be positioned to be vertically on top of terminal ports to operably reduce electrical capacitance of such terminal ports, and a smooth and/or flat surface of a metallic structure and a solder cup within a metallic structure for attachment to metallic elements on a printed circuit board. There may additionally be one or more additional metallic structures internal to an exterior of an LTCC component at least partially enclosing a device, and may be electrically connected to a metallic structure.

Embodiments of the invention may include one or more methods for manufacturing apparatuses, items, systems, devices and/or combinations thereof of the invention.

An exemplary embodiment of the invention may be an apparatus for shielding that may comprise a metallic structure that may have continuous metal around its circumference, and may have at least one radial side extending to a flat coplanar surface, where a radial side may be solid or may have one or more open first apertures to an interior. There may be an attachment of such a metallic structure to metallic attachment points of a device that may be enclosed by a metallic structure, and may have two or more second apertures each that may have relief of a continuous metallization that may extend from an interior to an exterior of a metallic structure, and may have one or more geometric features of a metallic structure that may be for attachment to metallic elements, for example, on a printed circuit board.

An exemplary embodiment may be constructed of a non-conductive material that may be other than metal and may have a continuous metal plated, deposited, or attached onto the surface of a structure. A plated or deposited metal may be on both exterior surfaces and/or on interior surfaces of a metallic or metal plated structure. An exemplary embodiment may include one or more metallic elements that may extend from an interior to an exterior of such a structure and may be electrically disconnected from a continuous metal around such a structure, where each may be individually electrically connected to distinct metallic attachment points of an enclosed device, for example an LTCC electrical device, an LTCC electrical circuit or an LTCC electrical filter. Such a device may be a filter or an electrical filter that may have frequency passband and frequency reject band properties.

An exemplary embodiment may contain an enclosed device that may be an LTCC electrical filter, where a continuous metallic structure may be operable in conjunction with an enclosed LTCC filter to reject additional electrical signal energy directed to passing through a first input aperture from an input port, through an enclosed LTCC filter, and subsequently directed to pass through a second output aperture as an output port throughout substantially all of its the design stopband frequencies of an enclosed LTCC filter, where additional rejected electrical signal energy may be attributable to an electrically connected metallic shielding structure, and where electrical signal energy passing through from a first input aperture, through an enclosed LTCC filter and through a second output aperture throughout substantially all of the design passband frequencies of an enclosed LTCC filter may experience substantially no additional insertion loss attributable to additional of a continuous metallic structure, for example versus an apparatus without such a shielding structure.

An exemplary embodiment may comprise metallic attachment points of a device that may be enclosed by a metallic structure, e.g. a metallic shielding structure, may be electrically connected to electrical grounding structures within an electrical circuit of an enclosed LTCC electrical device, where such an LTCC circuit may be an LTCC filter. A geometric feature may be a flat and smooth surface that may be a co-planar surface to metallic elements on a printed circuit board, and may be when attached to a printed circuit board that may further be operably connected to a ground plane, e.g. a circuit ground plane from a printed circuit board.

An exemplary embodiment may be an apparatus for shielding a low temperature co-fired ceramic (LTCC) component comprising a metallic rectangular solid structure having continuous metal around its radial circumference, where attachment of a metallic rectangular solid structure may be electrically connected to one or more metallic attachment points of a device enclosed by a metallic rectangular solid structure, and where a metallic rectangular solid structure may have on at least one radial side a smooth and flat surface that may be for mounting to a co-planar ground plane, for example, of a printed circuit board. There may be two or more apertures that may be coplanar to a smooth and flat surface of a metallic rectangular solid structure that may extend from an interior to an exterior of a metallic rectangular solid structure, each may encompass metallic electrical signal input and output terminal ports that may be electrically connected to corresponding input and output ports of an enclosed LTCC electrical circuit and may be electrically isolated from an enclosed metallic rectangular solid structure.

An exemplary embodiment may include one or more cavities that may be positioned radially outward from an enclosed LTCC electrical circuit and may be positioned on an opposing side from a smooth and flat surface and may be vertically on top of, or above, terminal ports and may operably reduce electrical capacitance of terminal ports. A smooth and flat surface of a metallic structure and one or more cylindrical volumes of removed metal interior to, and residing within a wall of, a metallic rectangular solid structure may be referred to as a solder cup, and may operate to capture solder flow of a reflow process and may prevent such solder from flowing across an enclosed LTCC electrical circuit or a printed circuit board, and may be within a metallic structure that may be for attachment to metallic elements on a printed circuit board. There may be one or more planar metallic structures that may be internal to an exterior of an enclosed LTCC electrical circuit or LTCC filter or LTCC component, and be at least partially enclosing an LTCC device, and may be electrically connected to a metallic rectangular solid structure and may be operable as one or more interior ground planes.

An exemplary method according to embodiments of the invention may be for constructing an apparatus that may comprise constructing a rectangular solid structure that may have continuous metal around its radial circumference, may have at least one radial side that may extending to a coplanar flat surface for mounting on a printed circuit board, and may have at least two apertures along an axis that may be parallel to a longitudinal axis. There may be attached to interior attachment points of a metallic structure metallic attachment points extending from a device, for example an LTCC filter device, that may be enclosed by a rectangular solid structure, or shielding structure. At least two apertures may include one or more metallic elements that may extend from an interior to an exterior of a structure that may be electrically disconnected from a continuous metal, each may be individually electrically connected to distinct metallic attachment points of an enclosed device. Exemplary embodiments may be where an enclosed device may be a low temperature co-fired ceramic (LTCC) electrical filter. There may also be at least one of a metallic attachment point of an enclosed device that may be electrically connected to electrical grounding points of an enclosed LTCC electrical filter. There may be an electrical connection of at least one radial side that may extend to, for example, a coplanar flat surface to a ground plane of a printed circuit board.

In an exemplary embodiment of the invention there may be a conformal coating around an LTCC device, for example an LTCC filter device. Such a conformal coating may be around an LTCC device and/or may encompass an LTCC device and a PCB onto which it may be mounted. A conformal coating may be continuous, or may have one or more apertures, for example through which one or more signals, voltages and/or other electrical connections may be made and/or transmitted. A conformal coating may be a single layer, or maybe two or more layers, for example as in concentric layers, fully encompassed layers, partially encompassed layers, or any other suitable combination of layers.

A material used for conformal coating may be an electrically conductive material, for example, a material comprising metallic elements, e.g., silver loaded epoxy. Such a material may be applied prior to attachment of an LTCC device to a PCB, during attachment, after mechanical attachment, or any combination thereof. Such a material may be applied in parts or simultaneously around encompassed devices.

A conformal coating may provide an electrically conductive shield or a shielding effect, for example as a form of a Faraday cage, and may increase isolation of electrical signals from a surrounding environment. A conformal coating that may have metallic properties may be electrically and/or mechanically connected to a ground plane. Such a ground plane may be grounded conductors within an LTCC device, grounded conductors on a PCB, or both.

In some embodiments a coaxial feed may be used to transfer electrical signals and/or electrical signal energy between a device, e.g., an LTCC device, and an electrical circuit, for example a circuit on a PCB. A coaxial feed may comprise, for example, a center conductor that may be surrounded by a second outer conductor, where such second conductor may be connected to a ground plane and/or ground connection. A center conductor and an outer conductor may be coaxial and may be circular concentric, for example where a cross section may show an outer conductor enclosing, e.g., fully enclosing, a center conductor.

A coaxial electrical transmission line structure may be used to create a coaxial feed. Such a coaxial feed may be attached at one end to an input and/or an output connection of, for example, a terminal of an LTCC device, e.g., an LTCC filter. An opposing end of a center conductor of a coaxial feed may be attached to an electrical connection on, for example, a PCB. An outer conductor, for example a shielding conductor, may be attached between an electrical grounding connection on or within an LTCC component and a grounding connection on a PCB, for example a PCB onto which an LTCC component may be mechanically, electrically and/or operably attached.

In some embodiments an LTCC component may be attached to a PCB by the use of an interposer, or intermediary material that may be positioned, for example, between an LTCC component and a PCB. Such an interposer may transfer electrical signals between an LTCC component and a PCB, for example, by a coaxial electrical structure. Such structure may be embedded within an interposer.

An interposer may be, for example, a PCB, another board material, a PCB with an electrical circuit, an insulator board, a PCB with electrical circuitry on side, both sides and/or multiple sides or layers, and such electrical circuitry may be electrically connected, or may be any combination of such materials and/or boards or other boards. Such an interposer may transfer electrical signals and/or electrical signal energy between an electrical component, e.g., and LTCC component, and an electrical circuit, e.g., an electrical circuit on a printed circuit board (PCB). An interposer may include, for example, a stripline launch a PCB and/or to an LTCC component.

An interposer may have one or more metallic layers. A metallic layer may be attached to a side of an interposer, and may contain relief of such metallic element in any pattern where isolation of electric signals may be desired, for example for isolation between a signal and a ground plane. A ground plane on one side, for example a top side, of an interposer may be electrically and/or operably connected to a ground plane on another side, for example a bottom side or an opposing side. Such connection may be by a variety of methods, for example by plated through holes, e.g., via holes, that may extend from, and attach to, a metallic ground plane on one side through the insulator material of the interposer to the metallic material of the ground plane on the opposing side, and may be attached thereto. Such plated through holes may be solid, may be open holes that may have metallic cylindrical walls, or may be of any other suitable configuration. An interposer may have one or more plated through holes to provide transmission of electrical signals from, for example, a top side to a bottom side, and such signal connections may be electrically isolated from a ground plane, for example a ground plane on either side. Such signal connections may be disconnected from such ground planes by one or more dimensions that may achieve, for example a constant impedance for such an electrical signal, and may be by creating an effect of a particular mode, e.g., a TEM coaxial mode.

An embodiment of the invention may be an LTCC component mechanically, electrically and/or operably connected to an electrical circuit, for example an electrical circuit on a PCB, where electrical signals are transferred between an LTCC component and a PCB. Such electrical signals may be transferred using a transverse electro-magnetic (TEM) mode, for example a coaxial mode. Such a coaxial mode may be by means of a coaxial feed, where an outer conductor may be separated from an inner conductor, for example by an insulator and/or a dielectric material, or other separator material, e.g., air, a vacuum, etc. A coaxial attachment, or coaxial feed, for example for use in transferring signals using a coaxial mode, may be used to transfer electrical signals between an LTCC component and a PCB. Such an attachment may contain connections for a center conductor and connections for an outer conductor, for example a ground conductor. A coaxial feed may provide a continuous shield of an electrical signal, which may improve isolation of such electrical signal energy from a surrounding environment. A coaxial feed may provide a constant impedance for transfer of electrical signal energy, which may reduce or eliminate electrical discontinuities between an LTCC component and an electrical circuit on a PCB, e.g., on a PCB. Reduction of discontinuities of electrical connections may result in improved signal energy transfer and a reduction in electrical energy loss. Such a discontinuity may, for example, result in a reflected electrical signal energy and/or a standing wave. A voltage standing wave ratio (VSWR) may be used to characterize such a standing wave and/or such a reflected electrical signal energy. Reduction of VSWR effects among electrical connections may be a benefit of such a coaxial feed.

In some embodiments of the invention an outer conductor of a coaxial feed may be electrically and/or conductively attached to one or more walled vias, for example within an LTCC component. Such attachment may create an electrically continuous ground potential, for example, among such walled vias and such outer conductors. Such a continuous electrical ground potential may increase isolation of desired electrical signal energy from undesired electrical signal energy, e.g., discontinuity reflections, etc. A walled via may be, for example, a physical and/or mechanical wall, e.g., a metallic wall that may be located within a device and/or an interposer. A walled via may be comprised of two or more parallel via holes in intimate contact with each other, e.g., such as to together form a mechanical wall, or a combination thereof. Via holes may be used to create such a walled via by, for example, having no space between successive via holes. In such a configuration via holes may combine to form a continuous physical and/or mechanical wall. Such a wall may be along a plane, along a circular shape and/or formed to be of any suitable geometric shape. Any such shape of such a wall may be arranged to be, for example, continuously orthogonal to a plane of a mounting surface. A walled via may be a solid mechanical element, and it may be solid throughout or may have a three-dimensional outline shape with a cavity through its center, and such cavity may extend so as to be orthogonal to a plane of a mounting surface. A walled via and/or a via hole may be filled with solid metal, may be filled with a conductive epoxy and/or paste, or any combination thereof. A conformal coating may be electrically and/or mechanically continuous with a walled via, a via hole and/or a combination of both.

An LTCC component may be a filter, for example a high rejection filter. A series of such high rejection filters may be designed and/or manufactured using LTCC technology. An LTCC filter, or an LTCC high rejection filter, may be designed and/or manufactured into a package, or case, that may have a small footprint, and/or small total envelope.

An LTCC filter may be attached to a PCB, for example, for use in an electric circuit. Such a PCB may be any of a variety of PCB configurations and/or materials, for example a PCB may be a multilayer PCB. Such a PCB may have a stripline launch, for example, for enabling electrical, mechanical and/or operable connection between an LTCC device, including contained circuitry and/or components, and an electrical circuit on a PCB. An LTCC device, e.g., an LTCC filter, may be designed, for example, for optimal compatibility with a PCB multilayer stripline launch.

Some PCBs may be designed and/or manufactured using a PCB material and/or configuration using a variety of methods. It may be desired to use, for example, an LTCC filter that may be designed for use with a multilayer stripline launch, with a PCB that may be designed and/or manufactured with one or more other PCB technologies, for example a top-layer transmission line configuration. An LTCC filter, for example an LTCC filter that may have been designed for an optimized attachment to a multilayer stripline launch, may be attached to a PCB that may have a top layer transmission line, for example a single layer on top transmission line. For such an attachment configuration it may be highly advantageous for there to be an interposer attached between an LTCC component and a PCB. Such an interposer may facilitate maintaining, or substantially maintaining, properties, for example high isolation of an LTCC filter, for an exemplary combination of a device that may be designed for optimized use with a multilayer stripline and a top layer transmission line PCB. Such a PCB may have additional layers and may have a top side attachment for attachment of an LTCC component. Such an interposer may be designed and/or manufactured with a coaxial, or quasi-coaxial, mode for transporting electrical signal energy between an LTCC component and a PCB.

Figure 25:
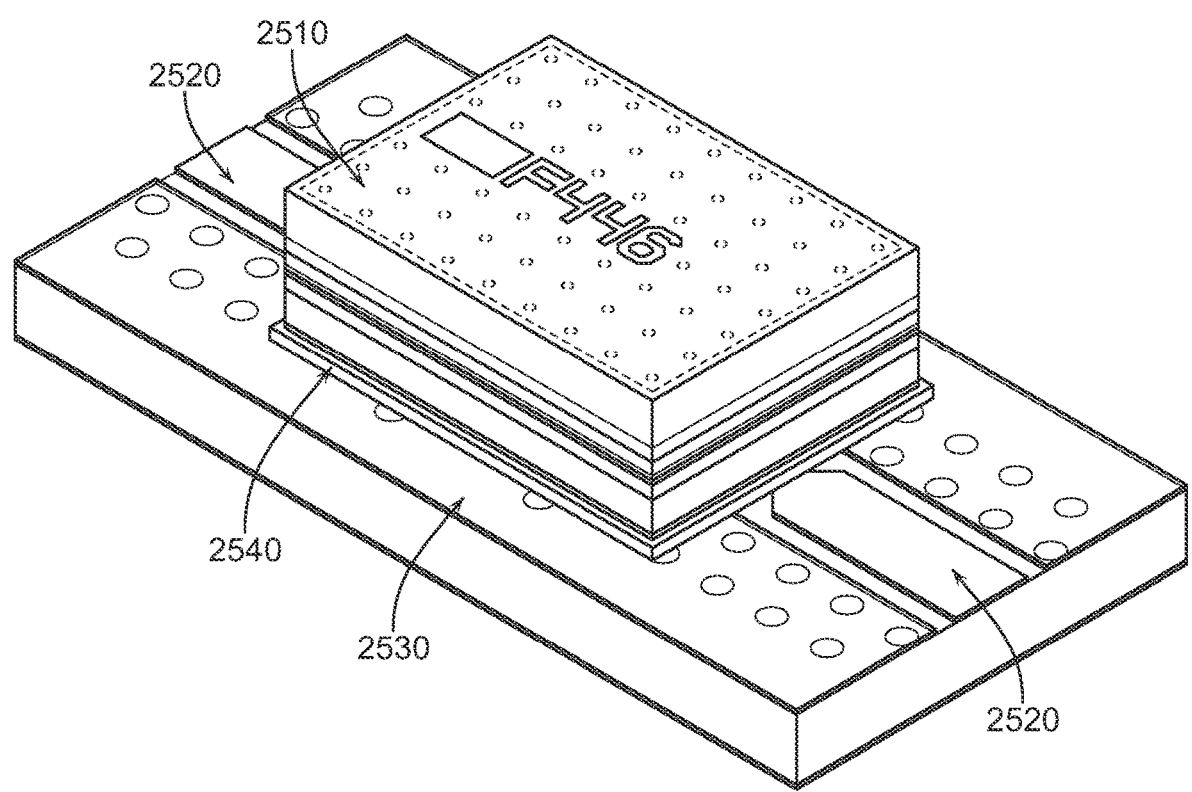
FIG. 25 depicts an exemplary diagram according to embodiments of the invention.

FIG. 25 depicts an exemplary embodiment according to the invention. An LTCC component 2510 may be attached to a PCB 2530 by using an interposer 2540. PCB 2530 may have a top layer transmission line 2520 configuration for an input and for an output of electrical signals to and from LTCC component 2510. Interposer 2540 may have a planar surface that may be in contact with LTCC device 2510 extending on a plane, or substantially an entire plane, of an attachment surface of LTCC device 2510. An opposing planar surface of interposer 2540 may, for example after attachment and/or assembly, simultaneously be in contact with PCB 2530 extending on a plane of an attachment surface of PCB 2530. In some embodiments LTCC device 2510 may be prevented from direct physical contact with PCB 2530 by interposer 22540.

Figure 26:
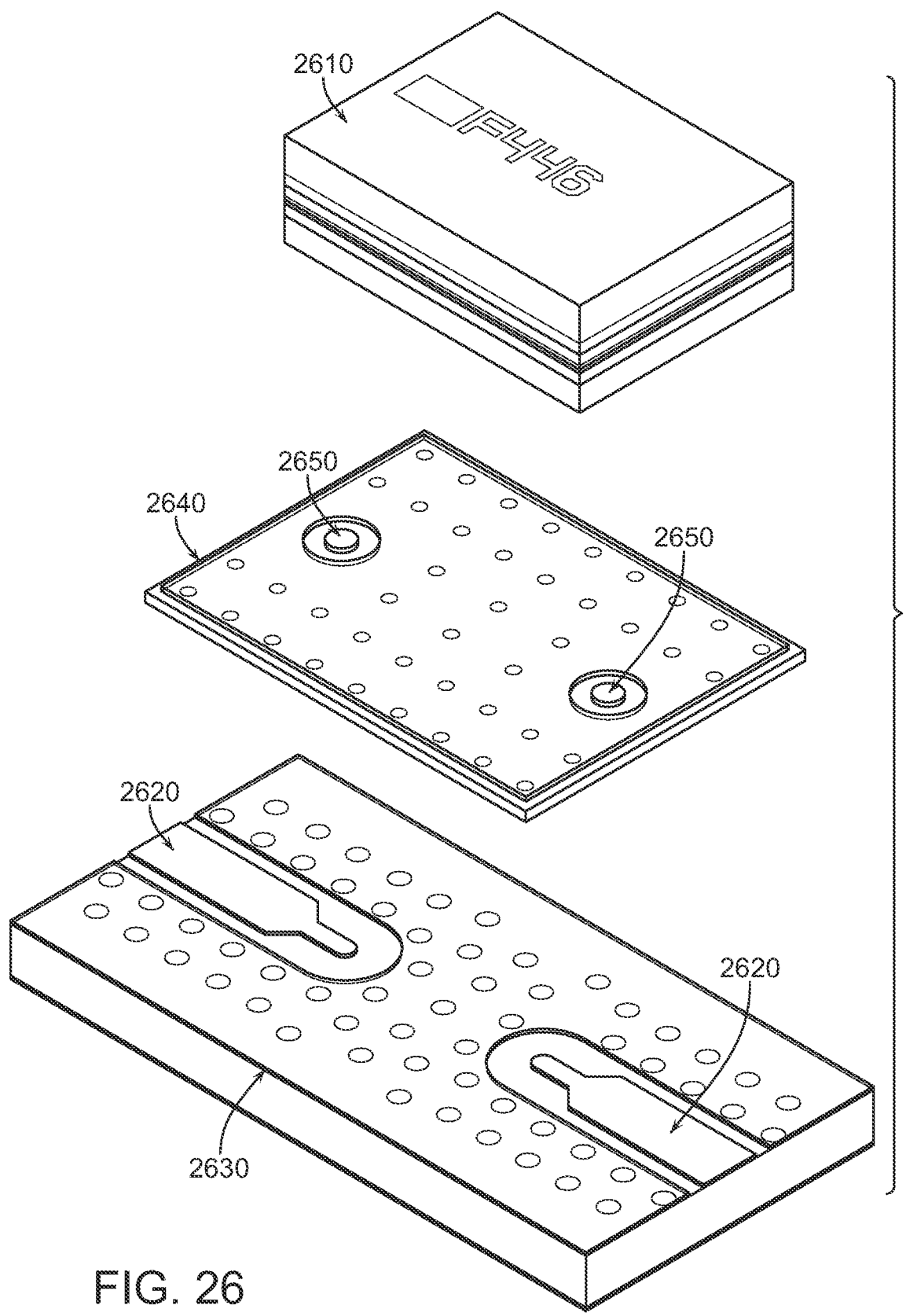
FIG. 26 depicts an exemplary diagram according to embodiments of the invention.

FIG. 26 depicts an exemplary embodiment according to the invention. LTCC device 2610, e.g., a high isolation LTCC filter, may be positioned to be attached to an interposer 2640. An interposer 2640 may be positioned to be attached to a PCB 2630. In an exemplary embodiment LTCC component 2610 may have an electrical signal attachment that may be optimized for a multilayer stripline PCB, PCB 2630 may be a top layer transmission line PCB, and interposer 2640 may be inserted between them to facilitate maintaining, for example, high isolation properties of an LTCC device 2610, e.g., a filter, when attached to PCB 2630. Interposer 2640 may include electrical signal energy transfer lines, for example via holes 2650, and such via holes may be electrically isolated from a ground plane, for example by relief of a metallic connection. Such relief may be, for example, concentric around a circular via hole 2650.

Figure 27:
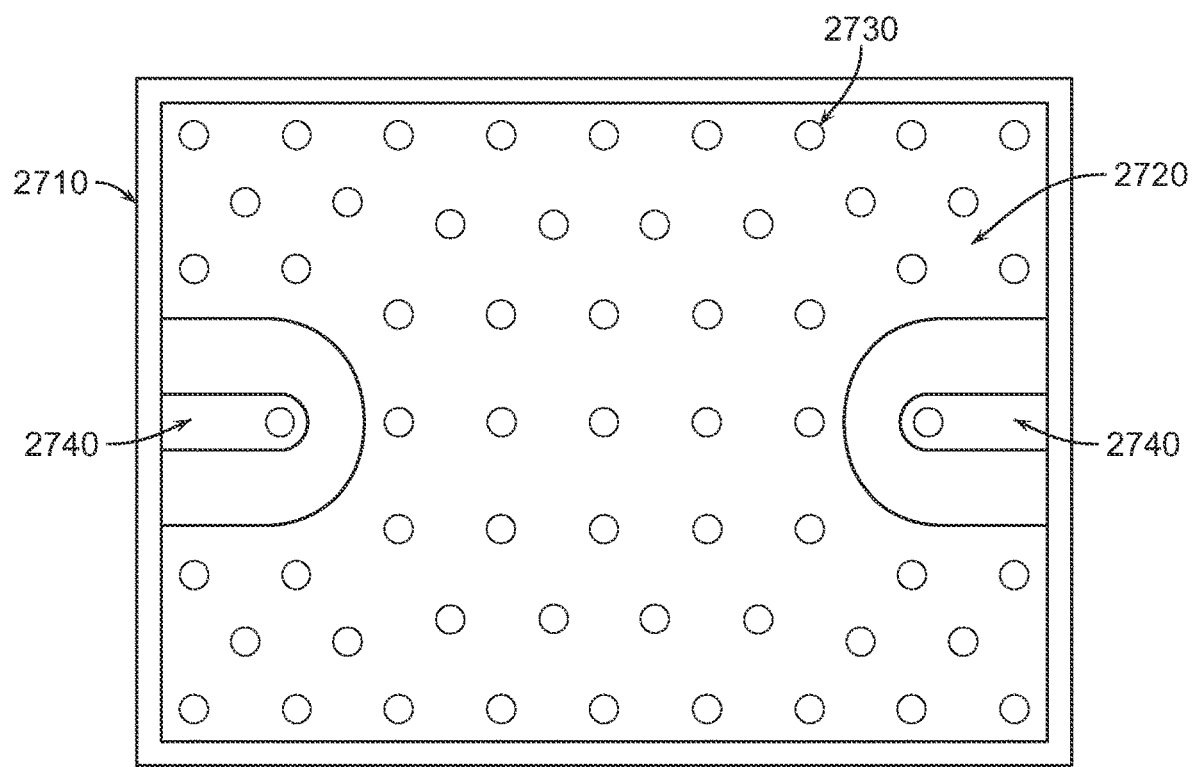
FIG. 27 depicts an exemplary diagram according to embodiments of the invention.

FIG. 27 depicts an exemplary embodiment according to the invention. An interposer 2710 may have a ground plane 2720 on a bottom side and/or a top side. A ground plane 2720 may be electrically and/or operably connected to a ground plane on a top side by one or more via holes 2730. Via holes 2730 may be located in predetermined positions, for example by use of a pattern or geometric sequence. A bottom side of an interposer 2710 may be designed and/or manufactured to be in contact with a top side of a PCB, for example a PCB with a top side single layer transmission line. An interposer 2720 may have metallic features 2740 for attachment to such transmission lines, and such features may be designed and/or manufactured to match geometric properties of such transmission lines. Features 2740 may include via holes for electrical connection of such transmission lines to electrical signal attachment points of, for example an LTCC component or device. Features 2740 may be electrically isolated from ground plane 2720. Such isolation may be by a separation of a metallic surface, or other metallic connections, between features 2740 and ground plane 2720. Dimensions of such separation may be predetermined, and may be, for example, geometrically designed for maintaining a constant impedance, or for other predetermined electrical properties, e.g., minimizing VSWR at component and/or material attachments, etc.

Figure 28:
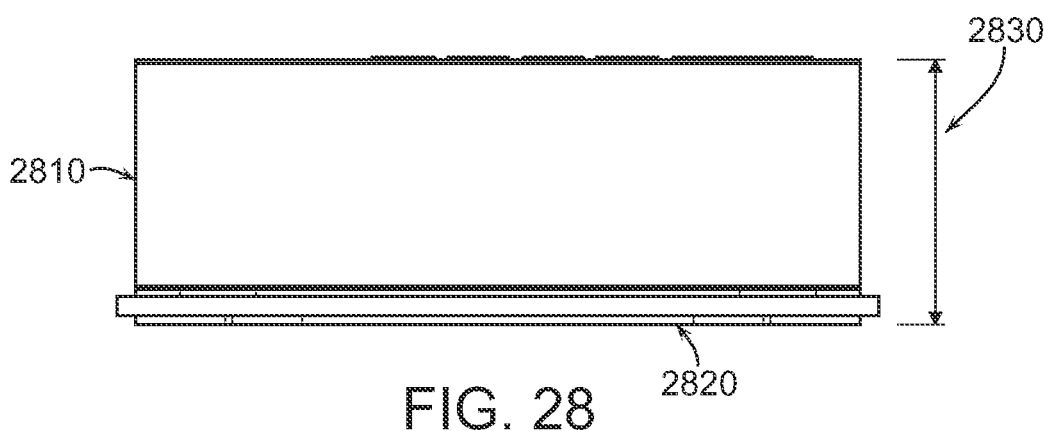
FIG. 28 depicts an exemplary diagram according to embodiments of the invention.

FIG. 28 depicts an exemplary embodiment according to the invention. An LTCC component 2810 may be attached to an interposer 2820. A cross section or side view of an interposer 2820 may depict a top side metallic surface, or metallization, a bottom side metallization, and the two mentalizations may be separated by an insulation material, e.g., a polymer material or any other PCB material. An LTCC component may be of, for example a small size. An exemplary height 2830 of an LTCC component, e.g., a high isolation LTCC filter, for example extending above an interposer, may be 1.9 millimeters, 0.075 inches, or any other suitable height 2830.

Figure 29:
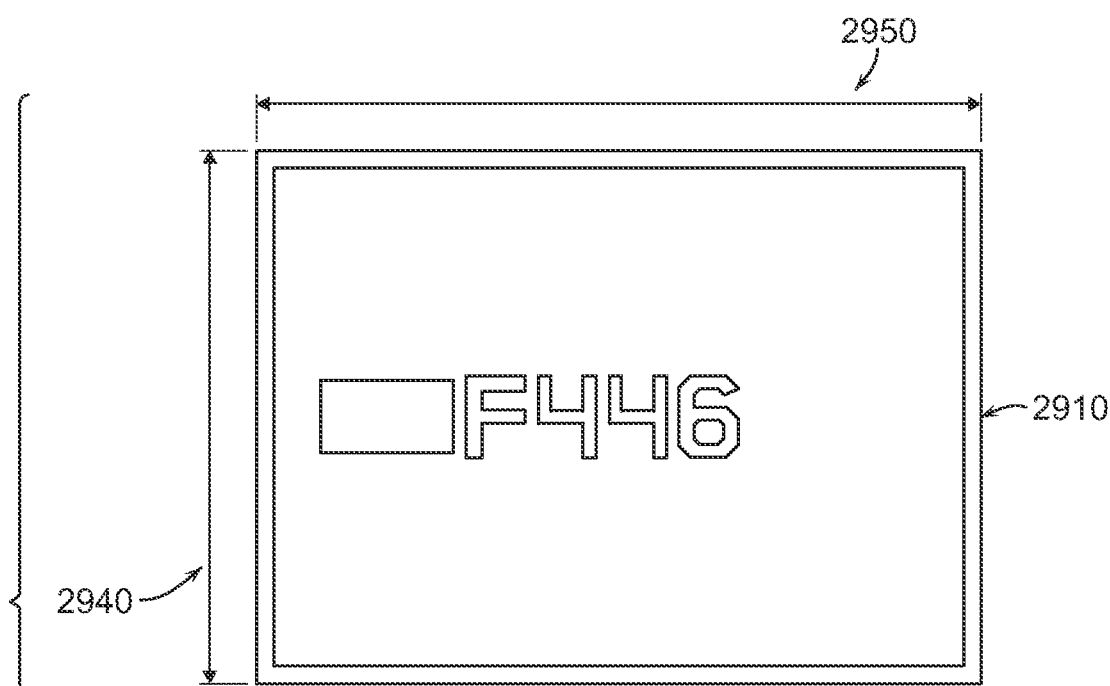
FIG. 29 depicts an exemplary diagram according to embodiments of the invention.
Figure 29:
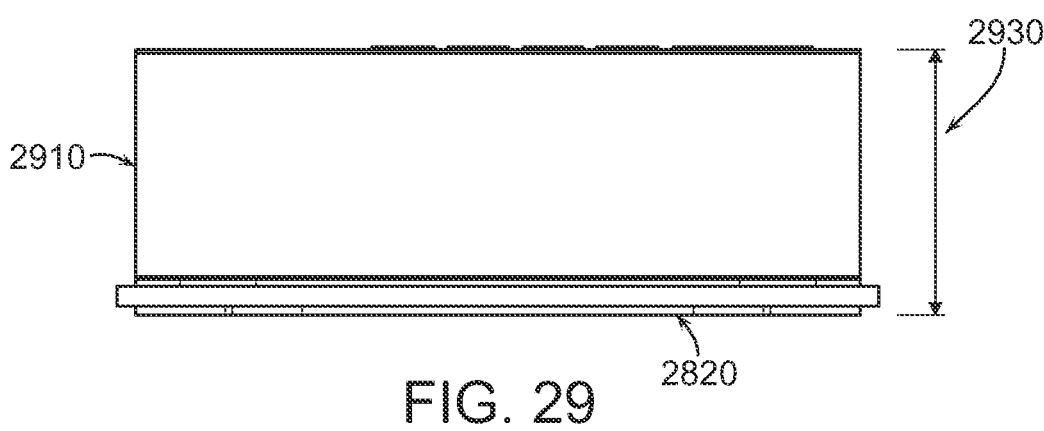

FIG. 29 depicts an exemplary embodiment according to the invention. An LTCC component 2910 may extend a height 2930 above a surface of an interposer 2920. An exemplary height 2930 of an LTCC component may be 1.9 millimeters, 0.075 inches, or any other suitable height. An LTCC component may have an exemplary dimension of a width 2950 of 4.95 millimeters, or 0.195 inches, or any other suitable width 2950. An LTCC component may have an exemplary dimension of a length 2940 of 3.65 millimeters, or 0.144 inches, or any other suitable length 2940.

Figure 30:
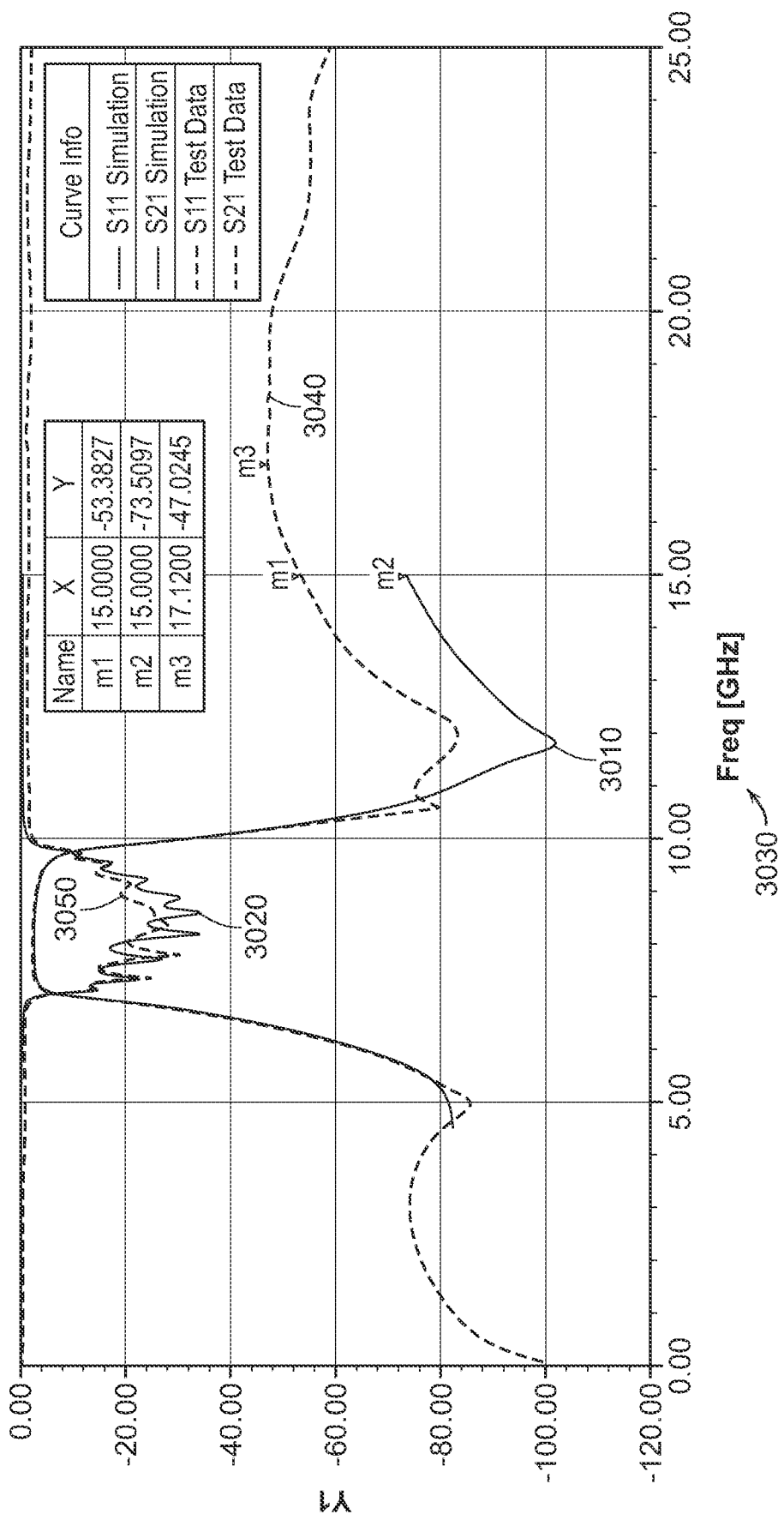
FIG. 30 depicts an exemplary diagram according to embodiments of the invention.

FIG. 30 depicts an exemplary embodiment according to the invention. An LTCC component, e.g., an LTCC filter, may be attached to an interposer, and the assembly of both may be attached to a PCB. A design simulation of an embodiment may be constructed and depicted by, for example solid lines. An insertion loss 3010 of signal energy transitioning through a device may be depicted versus a frequency band 3030. A return loss 3020 may be depicted versus a frequency band 3030. A physical construction of an embodiment may be constructed, e.g., a model BFHK-8501+, and depicted by dashed lines. An insertion loss 3040 of signal energy transitioning through a device may be depicted versus a frequency band 3030. A return loss 3050 may be depicted versus a frequency band 3030. Comparison of performance of design simulation results and physical construction results depict similar or the same performance of insertion loss and VSWR in a passband. VSWR in rejects bands, both upper and lower reject bands, are also the same or similar. Insertion loss performance in both a lower reject band and an upper reject band are similar and only minor perturbations are depicted. Such an exemplary depiction may demonstrate feasibility of construction of a design model that closely represents performance of a physical construction of an embodiment of the invention.

Figure 31:
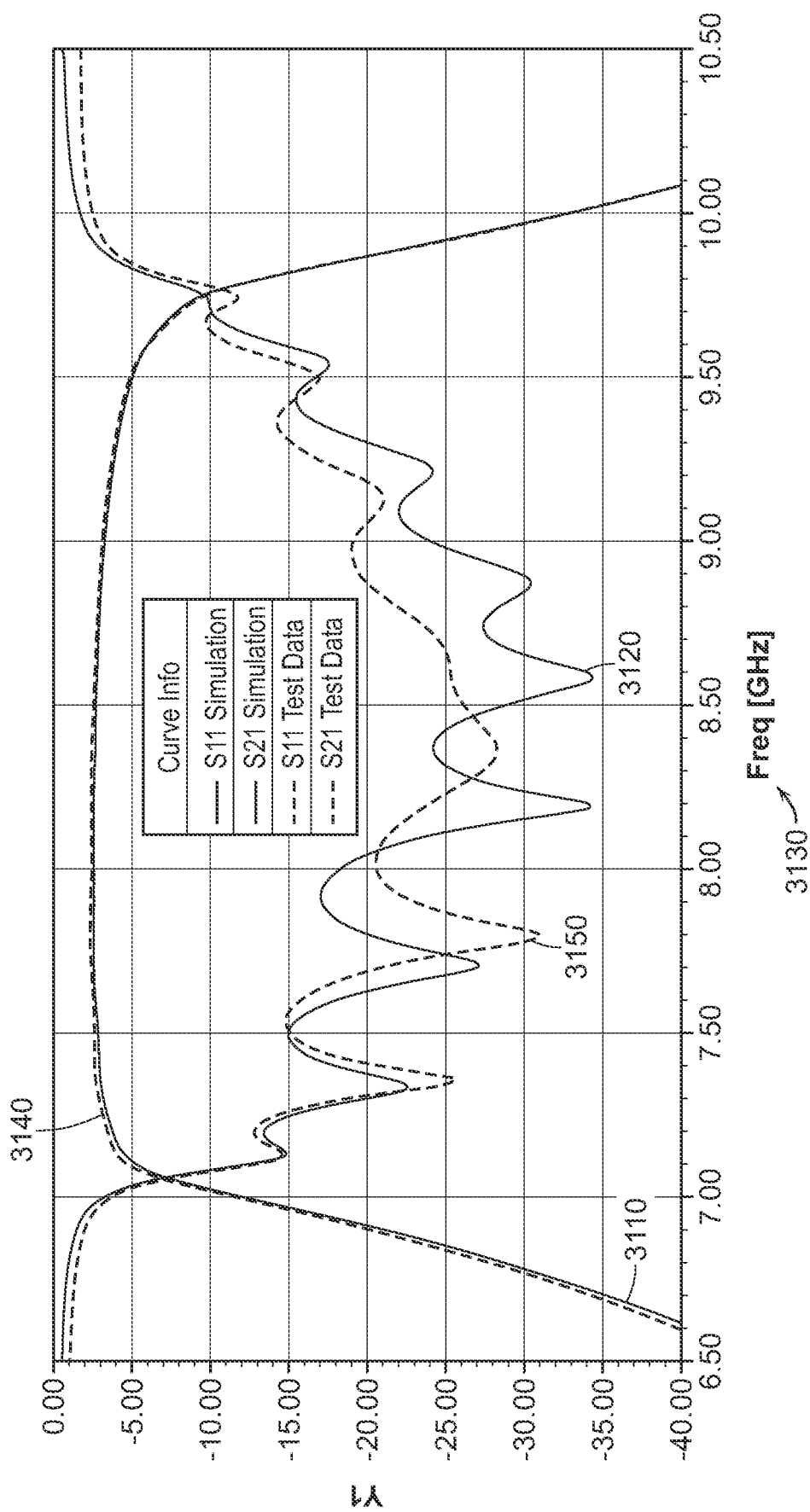
FIG. 31 depicts an exemplary diagram according to embodiments of the invention.

FIG. 31 depicts an exemplary embodiment according to the invention. A same depiction as depicted by FIG. 30 is depicted by FIG. 31, and with additional detail depicted across a passband. A design simulation of an embodiment may be constructed and depicted by, for example solid lines. An insertion loss 3110 of signal energy transitioning through a device may be depicted versus a frequency band 3130. A return loss 3120 may be depicted versus a frequency band 3130. A physical construction of an embodiment may be constructed, e.g., a model BFHK-8501+, and depicted by dashed lines. An insertion loss 3140 of signal energy transitioning through a device may be depicted versus a frequency band 3130. A return loss 3150 may be depicted versus a frequency band 3030. Such additional detail further defines similarities between such a design model and such a physical construction of an embodiment of the invention.

Figure 32:
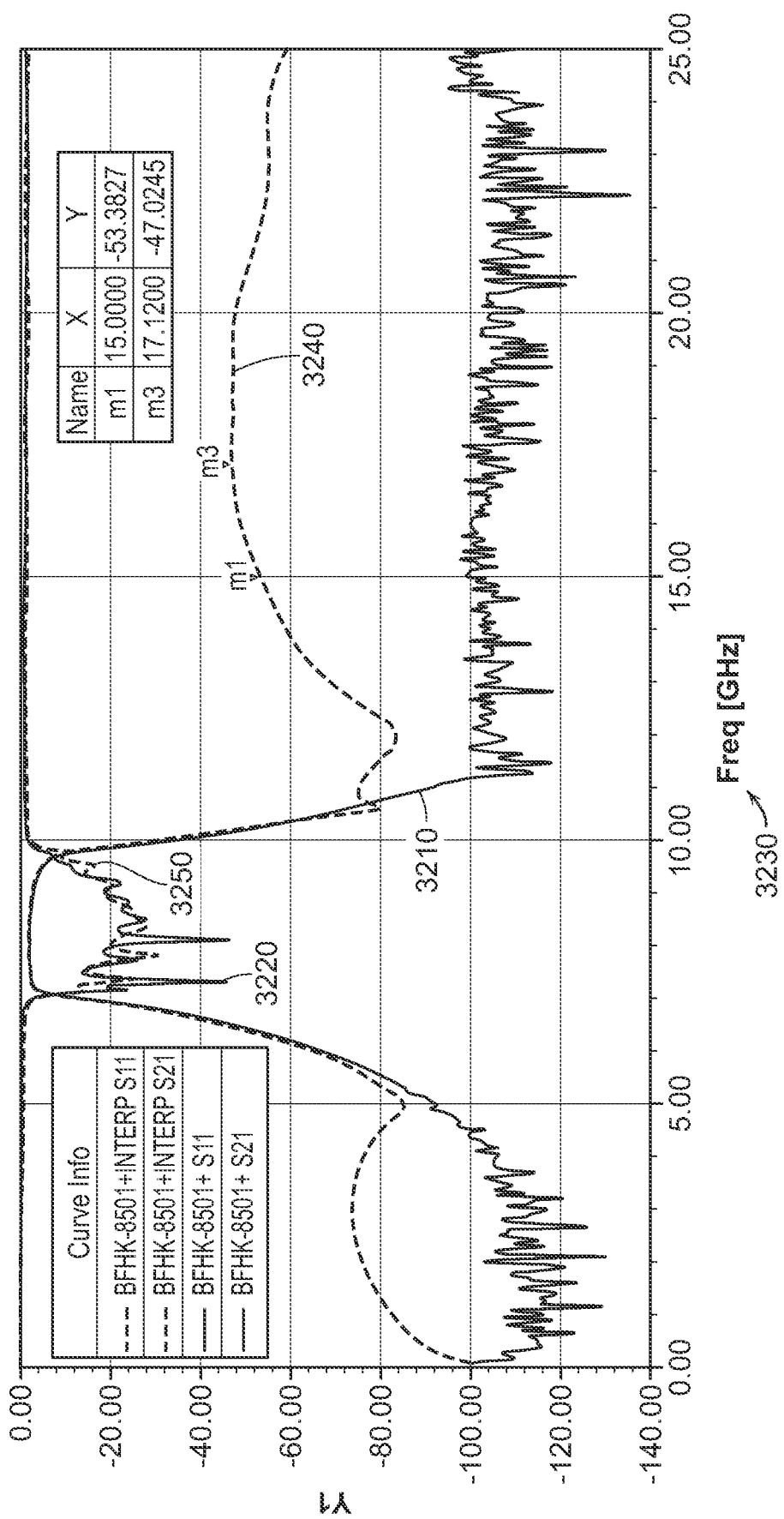
FIG. 32 depicts an exemplary diagram according to embodiments of the invention.

FIG. 32 depicts an exemplary embodiment according to the invention. An LTCC component, e.g., an LTCC filter, may be attached to an interposer, and the assembly of both may be attached to a PCB. An LTCC component, e.g., model BFHK-8501+, may be constructed by direct attachment to a PCB, and depicted by, for example solid lines. An insertion loss 3210 of signal energy transitioning through such a device construction may be depicted versus a frequency band 3230. A return loss 3220 may be depicted versus a frequency band 3230. A physical construction of an embodiment with an interposer may be constructed, e.g., a model BFHK-8501+, and depicted by dashed lines. An insertion loss 3240 of signal energy transitioning through such a device construction may be depicted versus a frequency band 3230. A return loss 3250 may be depicted versus a frequency band 3230. Comparison of performance of direct attachment results and physical construction with an interposer result depicts similar or the same performance of insertion loss and VSWR in a passband. VSWR in rejects bands, both upper and lower reject bands, are also the same or similar. Insertion loss performance in both a lower reject band and an upper reject band are similar and only minor perturbations are depicted, for example higher rejection may be achieved with direct attachment to a PCB with a PCB designed to match a geometry of an LTCC component. Such an exemplary depiction may demonstrate feasibility of construction using an interposer that closely represents performance of a direct attachment, and allows for greatly expanded uses and/or implementation of LTCC devices, e.g., LTCC filters, for example in PCB attachment applications where a PCB may not be specifically designed for high isolation, e.g., stripline, LTCC attachment.

Figure 33:
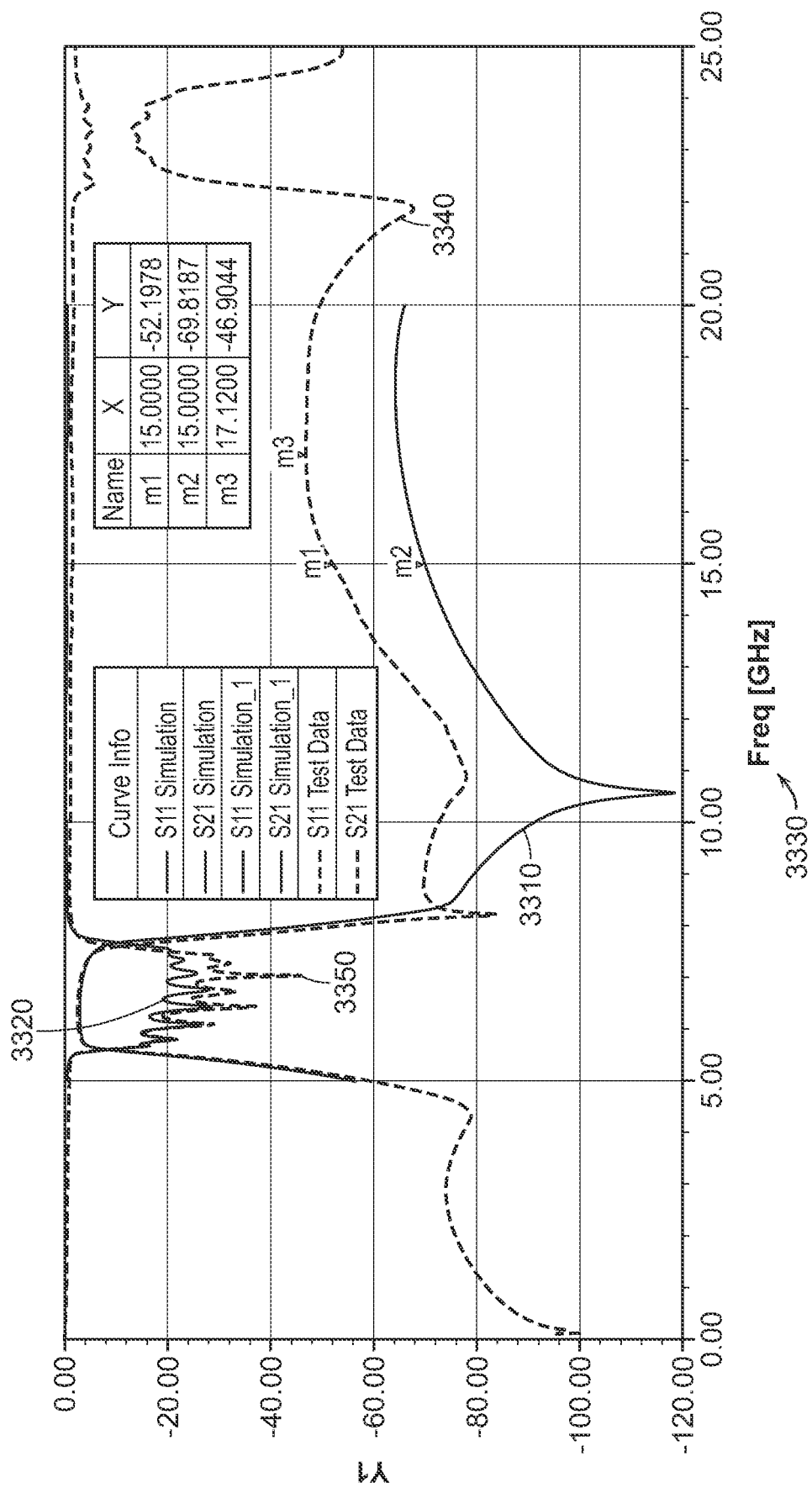
FIG. 33 depicts an exemplary diagram according to embodiments of the invention.

FIG. 33 depicts an exemplary embodiment according to the invention. An LTCC component, e.g., an LTCC filter, may be attached to an interposer, and the assembly of both may be attached to a PCB. A design simulation of an embodiment may be constructed and depicted by, for example solid lines. An insertion loss 3310 of signal energy transitioning through a device may be depicted versus a frequency band 3330. A return loss 3320 may be depicted versus a frequency band 3330. A physical construction of an embodiment may be constructed, e.g., a model BFHK-6751+, and depicted by dashed lines. An insertion loss 3340 of signal energy transitioning through a device may be depicted versus a frequency band 3330. A return loss 3350 may be depicted versus a frequency band 3330. Comparison of performance of design simulation results and physical construction results depicts similar or the same performance of insertion loss and VSWR in a passband. VSWR in rejects bands, both upper and lower reject bands, are also the same or similar. Insertion loss performance in both a lower reject band and an upper reject band are similar and only minor perturbations are depicted. Such an exemplary depiction may demonstrate feasibility of construction of a design model that closely represents performance of a physical construction of an embodiment of the invention.

Figure 34:
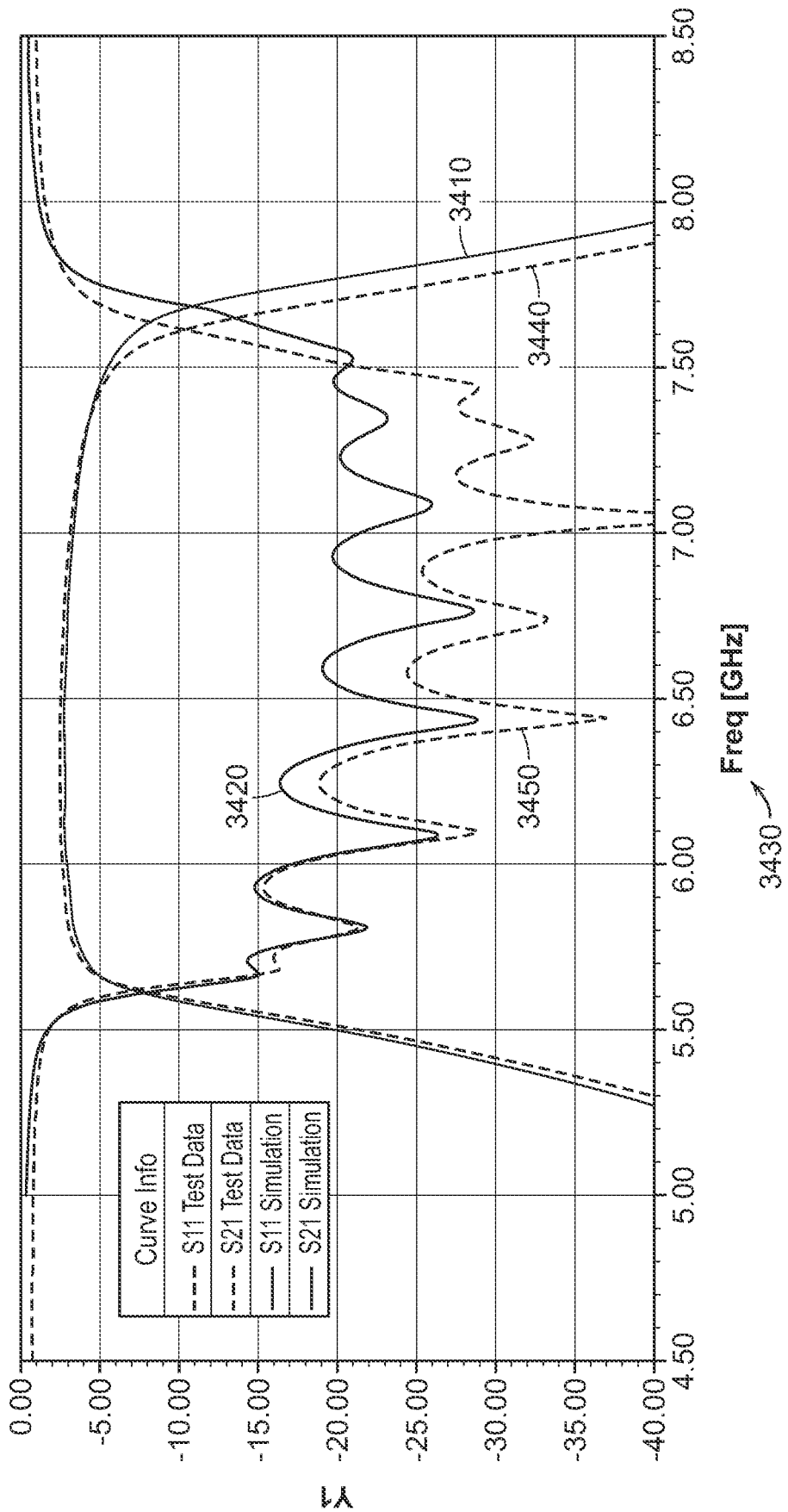
FIG. 34 depicts an exemplary diagram according to embodiments of the invention.

FIG. 34 depicts an exemplary embodiment according to the invention. A same depiction as depicted by FIG. 33 is depicted by FIG. 34, and with additional detail depicted across a passband. A design simulation of an embodiment may be constructed and depicted by, for example solid lines. An insertion loss 3410 of signal energy transitioning through a device may be depicted versus a frequency band 3430. A return loss 3420 may be depicted versus a frequency band 3430. A physical construction of an embodiment may be constructed, e.g., a model BFHK-6751+, and depicted by dashed lines. An insertion loss 3440 of signal energy transitioning through a device may be depicted versus a frequency band 3430. A return loss 3450 may be depicted versus a frequency band 3430. Such additional detail further defines similarities between such a design model and such a physical construction of an embodiment of the invention.

Figure 35:
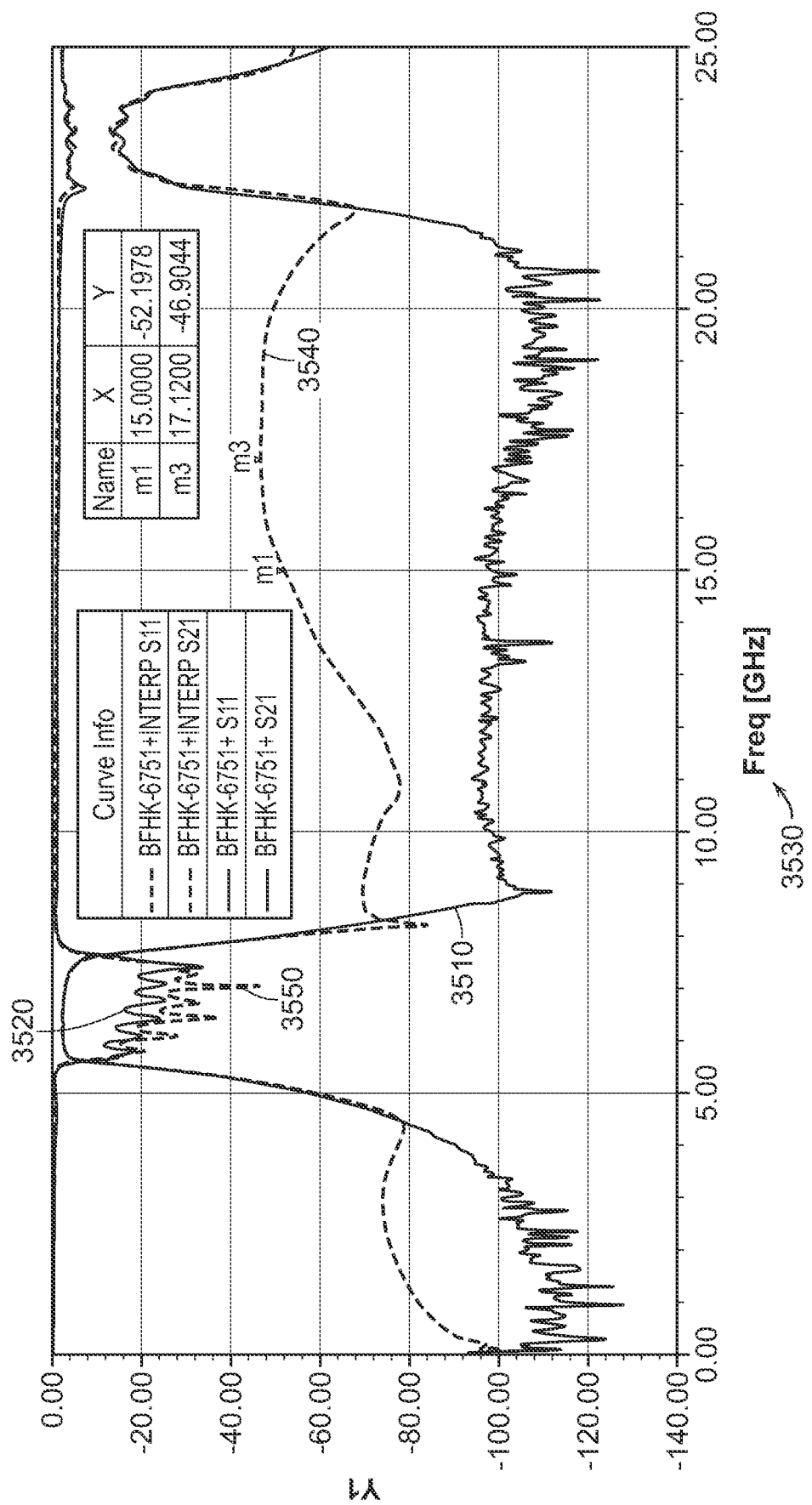
FIG. 35 depicts an exemplary diagram according to embodiments of the invention.

FIG. 35 depicts an exemplary embodiment according to the invention. An LTCC component, e.g., an LTCC filter, may be attached to an interposer, and the assembly of both may be attached to a PCB. An LTCC component, e.g., model BFHK-6751+, may be constructed by direct attachment to a PCB, and depicted by, for example solid lines. An insertion loss 3510 of signal energy transitioning through such a device construction may be depicted versus a frequency band 3530. A return loss 3520 may be depicted versus a frequency band 3530. A physical construction of an embodiment with an interposer may be constructed, e.g., a model BFHK-6751+, and depicted by dashed lines. An insertion loss 3540 of signal energy transitioning through such a device construction may be depicted versus a frequency band 3530. A return loss 3550 may be depicted versus a frequency band 3530. Comparison of performance of direct attachment results and physical construction with an interposer result depicts similar or the same performance of insertion loss and VSWR in a passband. VSWR in rejects bands, both upper and lower reject bands, are also the same or similar. Insertion loss performance in both a lower reject band and an upper reject band are similar and only minor perturbations are depicted, for example higher rejection may be achieved with direct attachment to a PCB with a PCB designed to match a geometry of an LTCC component. Such an exemplary depiction may demonstrate feasibility of construction using an interposer that closely represents performance of a direct attachment and allows for greatly expanded uses and/or implementation of LTCC devices, e.g., LTCC filters, for example in PCB attachment applications where a PCB may not be specifically designed for high isolation, e.g., stripline, LTCC attachment.

Figure 36A:
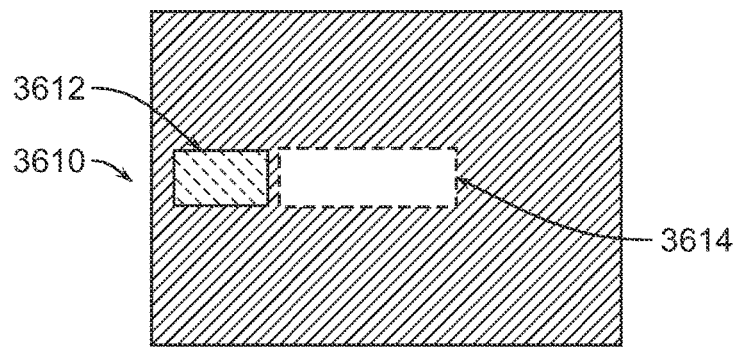
FIGS. 36A, 36B and 36C depict top, bottom and side views on an exemplary diagram according to an embodiment of the invention.
Figure 36B:
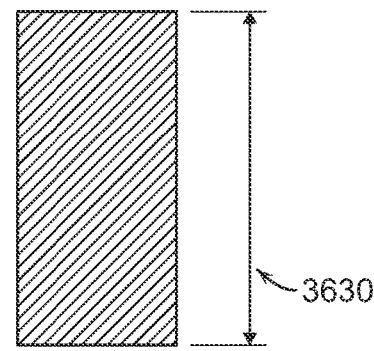
Figure 36C:
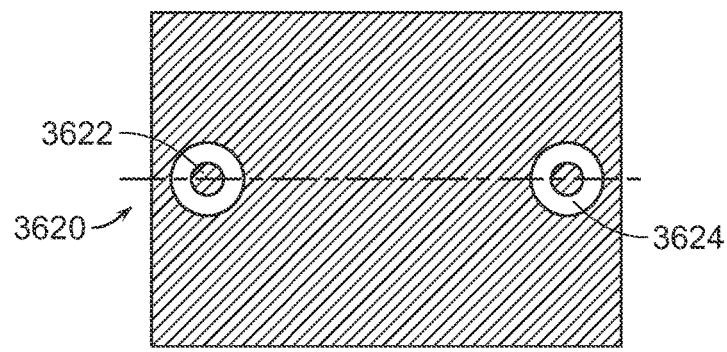

FIGS. 36A, 36B and 36C depict an exemplary embodiment according to the invention. An LTCC component, for example a high isolation LTCC filter, e.g., having a case style NM or NM1812C-3, or any suitable case style, size, form factor and/or dimensions, may have predetermined dimensions. Dimensions may be shown according to a design, a production lot of devices, or as a reference to, for example, a designer that may use such dimensions when designing an electrical circuit and/or mechanical design of an electrical circuit, or any other suitable purpose. One or more mechanical views may be depicted. A top view 3610 may be shown. FIG. 36A illustrates that a top 3610 may be in the form of a rectangular prism shaped device, that may be in a plane parallel to a mounting surface plane, and may be on an opposite side of such a mounting surface plane. A top view 3610 may indicate, for example, an area and/or a region 3612, 3614 where a marking, e.g., an index, may be located. Such an index may indicate a reference to one or more predetermined and/or predesignated electrical signal attachment points, e.g., an input attachment or pin. A bottom view 3620 is shown in FIG. 36B. The bottom view 3620 may be a view of a device showing a surface that may be attached such as to be coplanar to a mounting surface, attached to a mounting surface and/or be a mounting surface. A bottom view 3620 may indicate positions of one or more electrical signal energy attachments points, e.g., signal connections. A bottom view 3620 may depict a coaxial configuration of such attachments, for example depicting a center conductor 3622, a space around such a center conductor 3624, e.g., for an insulating material, and a ground plane and/or ground plane connection. One or more side views 3630 may be shown. Illustrated in FIG. 36C a side view 3630 may depict a height of, for example, an LTCC device, a rectangular prism shaped device, an electrical circuit device or any other device according to embodiments of the invention, of a top surface and/or top surface plane above a mounting surface and/or a mounting surface plane. The embodiment of FIGS. 36A, 36B and 36C may be considered with exemplary set of such dimensions. Dimensions may be provided, for example, in English units, metric units, e.g., within brackets, or any other suitable units. A case material, e.g., ceramic, may be indicated. A finish of one or more termination material, for example a metallic signal attachment point and/or element, may be indicated, for example directly and/or by reference to one or more supplementary data sheets. An exemplary finish may be, for example, a tin plating over a nickel plating, with one or both over a base metallic termination material, e.g., copper. A marking and/or a marking location, may be either specific or approximate, may be indicated, may be referenced, e.g., dimensionally, to a device edge or other device mechanical feature, and such marking may be comprised of alpha characters, numeric characters, alphanumeric characters, other characters, other symbols, other markings, or any combination thereof. In some embodiments, one or more marking may be located on another surface and/or both a top surface and one or more other surfaces.

Figure 37:
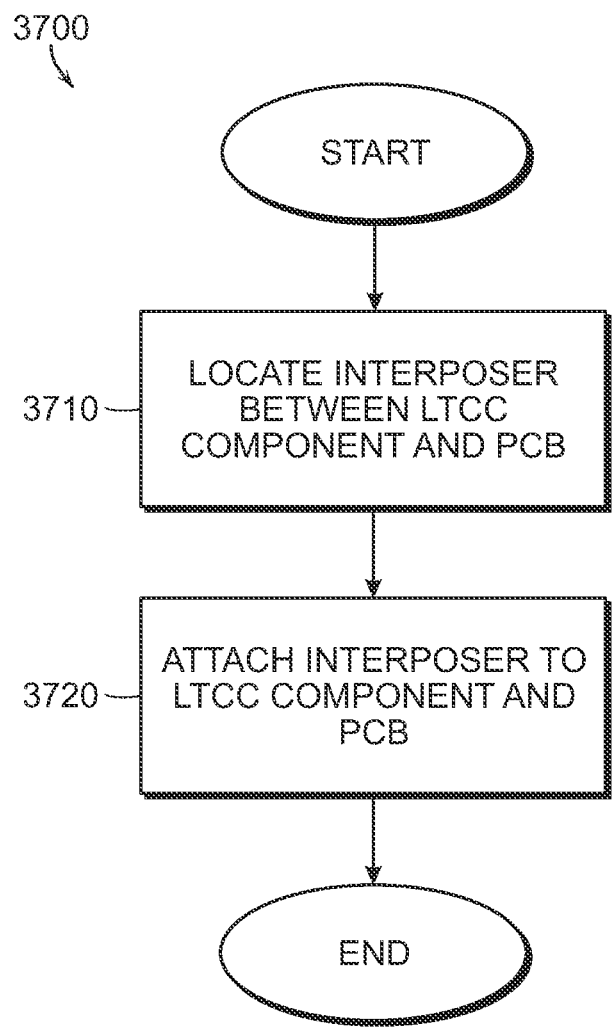
FIG. 37 depicts an exemplary method according to embodiments of the invention.

An exemplary method according to embodiments of the invention may be according to FIG. 37. An exemplary embodiment may be a method of using an interposer to facilitate improved electrical signal transfer between a surface mount device, e.g., an LTCC component and a PCB. A method 3700 may start and an interposer may be located between an LTCC component and a PCB 3710 according to embodiments of the invention. An LTCC component may be attached to an interposer on one side of such an interposer, and an opposing face of an interposer may be attached to a PCB 3720 according to embodiments of the invention. Attachment 3720 may be facilitated by alignment of electrical signal contact points and/or ground planes.

An exemplary method according to embodiments of the invention may be a method of constructing an apparatus that may comprise constructing a rectangular solid structure that may surround a device that may have continuous metal around its radial circumference, meaning, for example on four sides where two sides without such metal may be parallel and on opposing sides of such rectangular structure. In some embodiments, such metal may also be on five or six sides. Such metal may be electrically, mechanically, or both, connected from any side to any other adjacent side. Such metal may have one or more relief apertures, each on one or more sides, where such relief apertures may lack such metal, and such metal may be otherwise continuous throughout a remainder of such a side. Such a relief aperture may extend to an edge of one or more sides and/or may wrap around an edge to be continuous among two adjacent sides. Any other suitable configuration of surrounding metal and/or relief apertures may be used. Metal may surround a rectangular structure, or other shape structure, and may form a Faraday cage electrical isolation effect, for example in conjunction with a ground plane, and may surround and/or shield a device surrounded and/or enclosed by such rectangular structure and metal.

A metallic rectangular solid structure may be electrically connected to one or more metallic attachment points of a device that may be enclosed by such a metallic rectangular solid structure. A metallic rectangular solid structure may have, for example, on at least one side a smooth and flat surface that may be for mounting to a surface, for example a co-planar ground plane of a printed circuit board. A metallic rectangular solid structure may have two or more apertures, e.g., relief apertures that may be coplanar to, for example, a smooth and/or flat surface of a metallic rectangular solid structure that may extend from an interior to an exterior of a metallic rectangular solid structure. Each aperture may encompass and/or contain a metallic electrical signal terminal port that may be electrically isolated from a metallic portion of a rectangular solid structure and may be electrically connected to, for example, a corresponding port of an enclosed device on one end. Such an electrical signal terminal port may be constructed of an electrically conductive material, e.g., copper, and may be plated on its surface with one or more other metals. Such an electrical signal terminal port may be arranged for attachment, for example on an opposing end, to one or more center conductors, for example, of a multilayer stripline launch transmission line on a printed circuit board.

An interposer may be located between a metallic rectangular solid structure and a printed circuit board, and may be oriented, for example, to have alignment with corresponding attachment points to a metallic rectangular solid structure on one side and to, for example simultaneously, have alignment with corresponding attachment points to a printed circuit board an opposing side. A printed circuit board may comprise two or more top-side planar transmission lines, each transmission line for transfer of electrical signal energy between, for example, an electrical circuit on a printed circuit board and an electrical device that may be mounted and/or attached thereon. Such transmission lines may have features such as to facilitate attachment of a device, for example a break in such transmission line intended to be bridged by a component and/or device attached thereon, where such bridging completes an electrical circuit, or part of an electrical circuit, with one transmission line in series with such a component and then in series, for example continuing along such a circuit, with another transmission line.

After locating such an interposer, it may be attached electrically and/or mechanically on one side to a metallic rectangular solid structure, where an attachment may comprise at least one or more electrical attachments to a continuous metal, for example, as an electrical ground connection, and at least two or more electrical attachments may each be to a metallic electrical signal terminal port, for example, within an aperture. In an exemplary embodiment, an electrical attachment may be an input signal connection and another electrical attachment may be an output connection, where such input and output may be with respect to a device and/or component. In some embodiments there may be one input, two or more inputs, one output, two or more outputs, or any combination thereof. In some embodiments one or more electrical connections may be bias connections, and may be in addition to any number of input or output connections. In some embodiments an input connection and an output connection may be located near and/or at opposing ends of a planar mounting surface, or input, output and/or bias connections may be located at any suitable locations on such planar mounting surface. In some embodiments such connections may wrap and/or partially wrap from a planar mounting surface to an adjacent orthogonal surface.

An interposer may be attached electrically and/or mechanically on one side to a device and/or component, and on another side, for example on an opposing side, to a printed circuit board. On such printed circuit board attachment, for example, an attachment may comprise at least one or more electrical and/or mechanical attachments by an electrical conductor that may be electrically and/or mechanically connected to an electrical ground connection. Such an electrical ground connection may, for example, be a ground connection, ground conductor of a transmission line and/or ground plane of a printed circuit board, e.g., a top-side planar transmission line ground conductor. There may be at least two or more electrical attachments by electrical signal terminal ports that may be electrically and/or mechanically connected to two or more corresponding transmission line center conductors. A signal terminal port may be a metallic connection that may be within an aperture.

IN some embodiments an enclosed device may be selected from a low temperature co-fired ceramic (LTCC) electrical device, a low temperature co-fired ceramic (LTCC) electrical passive circuit or a low temperature co-fired ceramic (LTCC) electrical filter, any other LTCC device or circuit, or may be any other electrical device and/or circuit or any combination of two or more such devices and/or circuits.

In some embodiments an interposer may electrically connect between electrical port launches from a metallic rectangular solid structure and a printed circuit board, where such launches may be selected from a coaxial to coaxial transition, a coaxial to co-planar waveguide transition, a coaxial to microstrip transition, other such electrical circuit transitions, for example, across a mechanical discontinuity, or any combination thereof.

In some embodiments via holes may extend from one side to another side of an interposer, and may be arranged to form a coaxial feed with a coaxial ground plane that may each be perpendicular to each of the two sides. One or more via holes may be used to form the ground conductor connection. Two or more via holes may be spaced at a predetermined distance from each other and may surround a center conductor via hole. Such a predetermined distance may be designed and/or manufactured to provide a Faraday enclosure effect, a coaxial transmission line effect, or any other effect where a constant impedance may be used during the transition across or through an interposer.

In some embodiments an attachment may be made by soldering and/or by electrically conductive epoxy, or by any other suitable electrical and/or mechanical attachment and/or electrical connection method. In some embodiments a conformal coating may be applied around a metallic rectangular solid structure and may enclose an electronic device and/or circuit. Such conformal coating may contact a printed circuit board on one or more, or for example at least two, sides of a metallic rectangular solid structure. A conformal coating material may be electrically conductive, and may form a Faraday shielding effect, or other electrical effect, around an electronic device and/or circuit. Such conformal coating may provide a shielding effect that may isolate electrical signals within its enclosure, e.g., signals that may be transiting an enclosed electronic device and/or circuit, from a surrounding environment, e.g., other signals on a printed circuit board. Such electrical isolation may, for example, improve electrical performance of a filter, e.g., an LTCC filter, that may be enclosed, either partially or fully, by such conformal coating. An improved electrical performance may be, for example, additional signal rejection in a stop band, and may be in conjunction with negligible or no additional insertion loss in a pass band.

An exemplary embodiment of the invention may be an apparatus, for example for shielding, that may comprise a rectangular prism structure that may have continuous metal around its outer surface, may have at least one side that may extend to a flat coplanar surface, where a side may be solid or may have one or more open first apertures to an interior, and attachment of a metallic outer surface to one or more metallic attachment points of a device that may be enclosed by such a structure. It may have two or more second apertures that may have relief of a continuous metal on a coplanar surface side that may extend from an interior to an exterior of a metallic outer surface. It may have one or more geometric features of a metallic outer surface that may be for attachment to metallic elements, for example, on a printed circuit board, where a printed circuit board may be coplanar with a flat coplanar surface.

Such an apparatus may be constructed, for example, of a non-conductive material and a continuous metal may be plated or deposited onto a surface of a structure. Such an apparatus may have plated or deposited metal and may be both on exterior surfaces and/or on interior surfaces of a structure, and such plated or deposited metal may be electrically connected. Such an apparatus may have apertures that may include one or more metallic elements that may extend from an interior to an exterior of a structure that may be electrically disconnected from a continuous metal, for example an encompassing metal, each that may be individually electrically connected to distinct metallic attachment points of an enclosed device, e.g., an LTCC device. Such metallic elements may be arranged to form a coaxial electrical signal feed that may be in combination with a metallic surface of a structure.

Such an apparatus may have an enclosed device that may be selected from a low temperature co-fired ceramic (LTCC) electrical device, a low temperature co-fired ceramic (LTCC) electrical passive circuit and/or a low temperature co-fired ceramic (LTCC) electrical filter. Such an apparatus may have an enclosed device that may be, for example, an LTCC electrical filter, where such continuous metal structure may be operable in conjunction with an enclosed LTCC filter, for example, to reject additional electrical signal energy directed to pass through an aperture as an input port, through an enclosed LTCC filter, and subsequently directed to pass through another aperture as an output port throughout substantially all of design stopband frequencies of an enclosed LTCC filter, and such rejected additional electrical signal energy may be attributable to such electrically connected metallic shielding structure, and where electrical signal energy passing through from an aperture, through an enclosed LTCC filter and through another aperture throughout substantially all of design passband frequencies of an enclosed LTCC filter may experience substantially no additional insertion loss that may be attributable to such continuous metallic structure.

Such an apparatus may have metallic attachment points of a device that may be enclosed by a structure, may be electrically connected to electrical grounding structures within an enclosed LTCC electrical device, and may have electrical grounding structures that may be comprised of electrically conductive via holes and/or electrically conductive walled vias. Such an apparatus may have via holes that may be spaced to be operable, for example, as an electrical and/or mechanical, e.g., metallic, physical and/or structural, shielding wall, and may have a distance between successive vias that may be reduced, for example, to prevent RF electrical signal leakage through such electrical shielding wall, may have a zero distance where such holes may be in intimate contact, or a combination of both. Such an apparatus may have electrically conductive via holes and/or electrically conductive walled vias that may be oriented such that they are perpendicular to a flat coplanar surface, or may be oriented in any other suitable direction or geometry. An electrically conductive walled via may be, for example, a physical and/or mechanical wall, e.g., a metallic wall that may be located within a device, e.g., an LTCC electrical device, and/or an interposer. Such a walled via may be metallic, may be metallic and plated with a metallic coating of one or more metals, comprised of a non-metallic material and plated with a metallic coating of one or more metals, or any combination thereof. A walled via may be designed and/or constructed as a singular element, in conjunction with one or more additional walled vias, and/or in conjunction with one or more via holes. A walled via designed and/or constructed in such conjunction may be spaced so as to form an electrical wall, may be in intimate contact with such conjunctive element so as to form a physical and/or mechanical wall and/or barrier, or may a combination of both. A walled via and/or a via hole, either singular or in such conjunction may each be filled with solid metal, may each be filled with a conductive epoxy and/or paste, may each be filled with other electrically conductive material, may each be filled with a mechanically structural material, where any such material may be applied and then cured into a final form and/or composition, or any combination thereof. A conformal coating, e.g., an electrically conductive conformal coating, conductive epoxy coating, conductive paste coating, etc., may be electrically and/or mechanically continuous with a walled via, a via hole and/or a combination of both.

Such an apparatus may comprise an interposer between a flat coplanar surface and a printed circuit board, where such an interposer may comprise an aperture and another aperture, for example where each aperture may contain a metallic element that may be arranged, for example, to form a coaxial electrical signal feed that may be in combination with a metallic surface of a structure and connected thereto. Such an apparatus may have a printed circuit board that may include, for example, a single layer transmission line, and a structure may include metallic elements that may be arranged for attachment, for example, to a multilayer stripline launch. An interposer may be attached on one side to a printed circuit board and may be attached on another side to a structure, and may be aligned to use a coaxial electrical signal feed, for example, to transfer electrical signal energy between an enclosed device, e.g., an LTCC device, an LTCC filter, etc., and a transmission line. Such an apparatus may have a coaxial electrical signal feed of an interposer that may comprise via holes, for example one or more via holes.

An embodiment of the invention may be an apparatus that may comprise a metallic rectangular solid structure that may have continuous metal around its radial circumference, and such a metallic rectangular solid structure may be electrically connected to one or more metallic attachment points of a device enclosed by a metallic rectangular solid structure, and a metallic rectangular solid structure may have on at least one side a smooth and flat surface, for example, for mounting to a co-planar ground plane of a multilayer stripline launch on a printed circuit board. Such an embodiment may also comprise two or more apertures coplanar to a smooth and/or flat surface of a metallic rectangular solid structure that may extend from an interior to an exterior of a metallic rectangular solid structure, where each may encompass a metallic electrical signal input and/or output terminal ports that may be electrically connected, for example, to corresponding input and/or output ports of an enclosed a low temperature co-fired ceramic (LTCC) electrical circuit, that may be electrically isolated from an enclosed metallic rectangular solid structure, and may be arranged, for example, for attachment to center conductors of a multilayer stripline launch. Such an embodiment may also comprise a printed circuit board that may include, for example, two or more top-side planar transmission lines, each transmission line may be for transfer of electrical signal energy between an electrical circuit on a printed circuit board and an enclosed device. Such an embodiment may also comprise an interposer that may have a side with electrical conductors that may be arranged, for example, for attachment to planar transmission lines and may be attached to planar transmission lines of a printed circuit board, and may have another side that may have electrical conductors, for example, that may be arranged for attachment to a center conductor and/or a ground plane of, for example, a multilayer stripline and may be attached to LTCC center conductors and/or an LTCC ground plane, and may have, for example, three or more via holes through an interposer that may attach electrical conductors on one side to electrical conductors on another side. For example, one or more via holes may be for an input signal, one or more via holes may be for an output signal and one or more via holes may be for a ground connection and/or a ground plane connection. Such an apparatus may have via holes that may extend through an interposer and may be arranged to form a coaxial feed with a coaxial ground plane.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:
1. An apparatus for shielding comprising:
   a rectangular prism structure having continuous metal around its outer surface, and having at least one side extending to a flat coplanar surface, where said side is solid or has one or more open first apertures to the interior;

attachment of said metallic outer surface to one or more metallic attachment points of a device enclosed by a structure;

two or more second apertures having relief of said continuous metal on said coplanar surface side extending from the interior to the exterior of said metallic outer surface;

one or more geometric features of said metallic outer surface for attachment to metallic elements on a printed circuit board, where said printed circuit board is coplanar with said flat coplanar surface; and said apertures include one or more metallic elements extending from the interior to the exterior of said structure electrically disconnected from said continuous metal, each individually electrically connected to distinct metallic attachment points of said enclosed device, wherein said metallic elements are arranged to form a coaxial electrical signal feed in combination with said metallic surface of said structure;

wherein said apparatus further comprising an interposer between said flat coplanar surface and said printed circuit board, wherein said interposer comprises a first aperture and a second aperture, each aperture containing a metallic element arranged to form a coaxial electrical signal feed in combination with said metallic surface of said structure and connected thereto.

2. The apparatus of claim 1, wherein said apparatus is constructed of a non-conductive material and said continuous metal is plated or deposited onto the surface of said structure.

3. The apparatus of claim 2, wherein said metal is plated or deposited both on the exterior surfaces and on the interior surfaces of said structure, and all said plated or deposited metal is electrically connected.

4. The apparatus of claim 1, wherein said enclosed device is selected from a group including a low temperature co-fired ceramic (LTCC) electrical device, a low temperature co-fired ceramic (LTCC) electrical passive circuit or a low temperature co-fired ceramic (LTCC) electrical filter.

5. The apparatus of claim 4, wherein said enclosed device is said low temperature co-fired ceramic (LTCC) electrical filter wherein said continuous metal structure is operable in conjunction with said enclosed LTCC filter to reject additional electrical signal energy directed to pass through a first of said second aperture as an input port, through said enclosed LTCC filter, and subsequently directed to pass through a second of said second aperture as an output port throughout substantially all of the design stopband frequencies of said enclosed LTCC filter, and said rejected additional electrical signal energy is attributable to said electrically connected metallic shielding structure, and wherein said electrical signal energy passing through from said first of said second aperture, through said enclosed LTCC filter and through said second of said second aperture throughout substantially all of the design passband frequencies of said enclosed LTCC filter experiences substantially no additional insertion loss attributable to said continuous metallic structure.

6. The apparatus of claim 4, wherein said metallic attachment points of said device enclosed by said structure are electrically connected to electrical grounding structures within said enclosed LTCC electrical device, and where said electrical grounding structures are comprised of electrically conductive via holes or electrically conductive walled vias.

7. The apparatus of claim 6, wherein said via holes are spaced to be operable as an electrical shielding wall with a distance between successive vias to be reduced to prevent RF electrical signal leakage through said electrical shielding wall according to the frequency of said electrical signal.

8. The apparatus of claim 6, wherein said electrically conductive via holes or said electrically conductive walled vias are orthogonal to said flat coplanar surface.

9. The apparatus of claim 1, wherein said printed circuit board includes a single layer transmission line, wherein said structure includes said metallic elements further arranged for attachment to a multilayer stripline launch, and wherein said interposer attached on a first side to said printed circuit board and attached on a second side to said structure and aligned to use said coaxial electrical signal feed to transfer electrical signal energy between said enclosed device and said transmission line.

10. The apparatus of claim 9, wherein said coaxial electrical signal feed of said interposer further comprises via holes.

11. An apparatus comprising:
a metallic rectangular solid structure surrounding a device having continuous metal around its radial circumference, wherein said metallic rectangular solid structure is electrically connected to one or more metallic attachment points of said device enclosed by said metallic rectangular solid structure, and wherein said metallic rectangular solid structure has on at least one side a smooth and flat surface for mounting to a co-planar ground plane of a multilayer stripline launch on a printed circuit board;

two or more apertures coplanar to said smooth and flat surface of said metallic rectangular solid structure extending from the interior to the exterior of said metallic rectangular solid structure, each encompassing metallic electrical signal input and output terminal ports electrically connected to corresponding input and output ports of an enclosed a low temperature co-fired ceramic (LTCC) electrical circuit, electrically isolated from said enclosed metallic rectangular solid structure, and arranged for attachment to center conductors of a multilayer stripline launch;

said printed circuit board including two or more top-side planar transmission lines, each said transmission line for transfer of electrical signal energy between an electrical circuit on said printed circuit board and said enclosed device; and an interposer having a first side with electrical conductors arranged for attachment to planar transmission lines and attached to said planar transmission lines of said printed circuit board, having a second side with electrical conductors arranged for attachment to a center conductor and a ground plane of a multi-layer stripline and attached to said LTCC center conductors and said LTCC ground plane, and having three or more via holes through said interposer attaching said electrical conductors on said first side to said electrical conductors on said second side.

12. The apparatus of claim 11, wherein said via holes through said interposer are arranged to form a coaxial feed with a coaxial ground plane.

13. A method of constructing an apparatus comprising:
constructing a rectangular solid structure surrounding a device having continuous metal around its radial circumference, electrically connecting said metallic rectangular solid structure to one or more metallic attachment points of said device enclosed by said metallic rectangular solid structure, wherein said metallic rectangular solid structure has on at least one side a smooth and flat surface for mounting to a co-planar ground plane of a printed circuit board, and said metallic rectangular solid structure further has two or more apertures coplanar to said smooth and flat surface of said metallic rectangular solid structure extending from the interior to the exterior of said metallic rectangular solid structure, each encompassing a metallic electrical signal terminal port electrically isolated from said metallic rectangular solid structure and electrically connected to a corresponding port of said enclosed device on a first end and arranged for attachment to center conductors of a multilayer stripline launch transmission line on said printed circuit board on a second end;

locating an interposer between said metallic rectangular solid structure and said printed circuit board oriented to have alignment with corresponding attachment points to said metallic rectangular solid structure on a first side and to have alignment with corresponding attachment points to said printed circuit board on a second side, wherein said printed circuit board comprises two or more top-side planar transmission lines, each said transmission line for transfer of electrical signal energy between an electrical circuit on said printed circuit board and an electrical device mounted thereon;

attaching electrically said interposer on said first side to said metallic rectangular solid structure, wherein said attachment comprises at least one or more electrical attachment to said continuous metal as an electrical ground connection and, wherein at least two or more electrical attachments to said metallic electrical signal terminal ports; and attaching electrically said interposer on said second side to said printed circuit board, wherein said attachment comprises at least one or more electrical attachment by said electrical conductor electrically connected to said electrical ground connection to a ground connection of said printed circuit board top-side planar transmission line ground conductor, and wherein at least two or more electrical attachments by said electrical signal terminal ports electrically connected to two or more corresponding said transmission line center conductors.

14. The method of claim 13, wherein said enclosed device is selected from a low temperature co-fired ceramic (LTCC) electrical device, a low temperature co-fired ceramic (LTCC) electrical passive circuit or a low temperature co-fired ceramic (LTCC) electrical filter.

15. The method of claim 13, wherein said interposer electrically connects between electrical port launches from said metallic rectangular solid structure and said printed circuit board selected from: a coaxial to coaxial transition, a coaxial to co-planar waveguide transition or a coaxial to microstrip transition.

16. The method of claim 13, wherein via holes extend from said first side to said second side of said interposer are arranged to form a coaxial feed with a coaxial ground plane perpendicular to said first and said second sides.

17. The method of claim 13, wherein said attachment is by soldering or by electrically conductive epoxy.

18. The method of claim 13, further comprising applying a conformal coating around said metallic rectangular solid structure enclosing said electronic device and contacting said printed circuit board on at least two sides of said metallic rectangular solid structure.

* * * * *